(12) United States Patent
Takashima et al.

(10) Patent No.: US 6,724,025 B1
(45) Date of Patent: Apr. 20, 2004

(54) MOSFET HAVING HIGH AND LOW DIELECTRIC MATERIALS

(75) Inventors: Daisaburo Takashima, Yokohama (JP); Mizuki Ono, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/340,720

(22) Filed: Jun. 29, 1999

(30) Foreign Application Priority Data

Jun. 30, 1998 (JP) .......................................... 10-185304

(51) Int. Cl.[7] .......................... H01L 27/10; H01L 29/43; H01L 29/78
(52) U.S. Cl. ........................ 257/288; 257/295; 257/310; 257/324; 257/325
(58) Field of Search ........................ 257/288, 408–411, 257/324–325, 368, 389, 406, 900, 295, 310

(56) References Cited

U.S. PATENT DOCUMENTS 6,087,687 A * 7/2000 Katoh ......................... 257/295
6,100,558 A * 8/2000 Krivokapic et al. ......... 257/310

FOREIGN PATENT DOCUMENTS

| JP | 55-83251 | 6/1980 |
| JP | 4-165670 | 6/1992 |
| JP | 5-121758 | 5/1993 |
| JP | 8-204142 | 8/1996 |
| JP | 9-307072 | 11/1997 |

OTHER PUBLICATIONS

A. Inani, et al., "Performance Considerations in Using High-k Dielectrics for Deep Sub-Micron MOSFETs," 1998 International Conference on Solid State Devices and Materials, Hiroshima, (1998), pp. 94–95.

Hiroshi Takato, et al., "Impact of Surrounding Gate Transistor (SGT) for Ultra-High-Density LSI'S," IEEE Transactions On Electron Devices. Vol. 38, No. 3, (Mar. 1991), pp. 573–578.

* cited by examiner

Primary Examiner—Minhloan Tran
Assistant Examiner—Thomas L Dickey
(74) Attorney, Agent, or Firm—Oblon, Spivak, McClelland, Maier & Neustadt, P.C.

(57) ABSTRACT

A semiconductor device comprises a channel of a first conductive type formed on a surface layer of a semiconductor substrate, source and a drain of a second conductive type formed on both sides of the channel, a gate insulation film with a first relative permittivity formed at least on the channel directly or through a buffer insulation film, a gate electrode formed on the gate insulation film, and a side insulation film formed at least on a side of the gate insulation film and having a second relative permittivity which is smaller than the first relative permittivity, and, when assuming that an area of the gate insulation film, which is adjacent to the surface layer on a gate electrode side, is S1, and an area thereof, which is adjacent to the surface layer on the channel side, is S2, the area S1 is larger than the area S2.

12 Claims, 34 Drawing Sheets

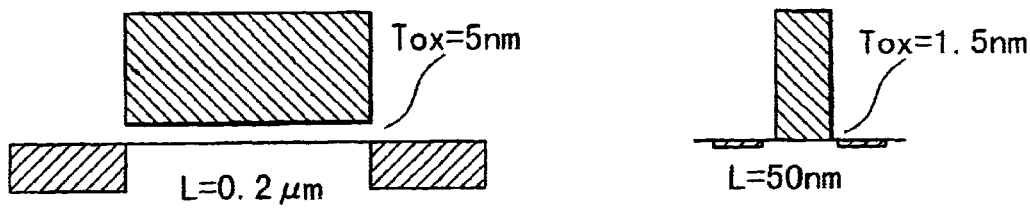
○ GATE INSULATION FILM LEAKAGE
  (LIMIT DOWN TO Tox=3.0nm)
  TUNNELING→DIRECT TUNNELING
○ SHORT CHANNEL EFFECT IS
  REMARKABLE.
FIG. 1A (PRIOR ART)
FIG. 1B
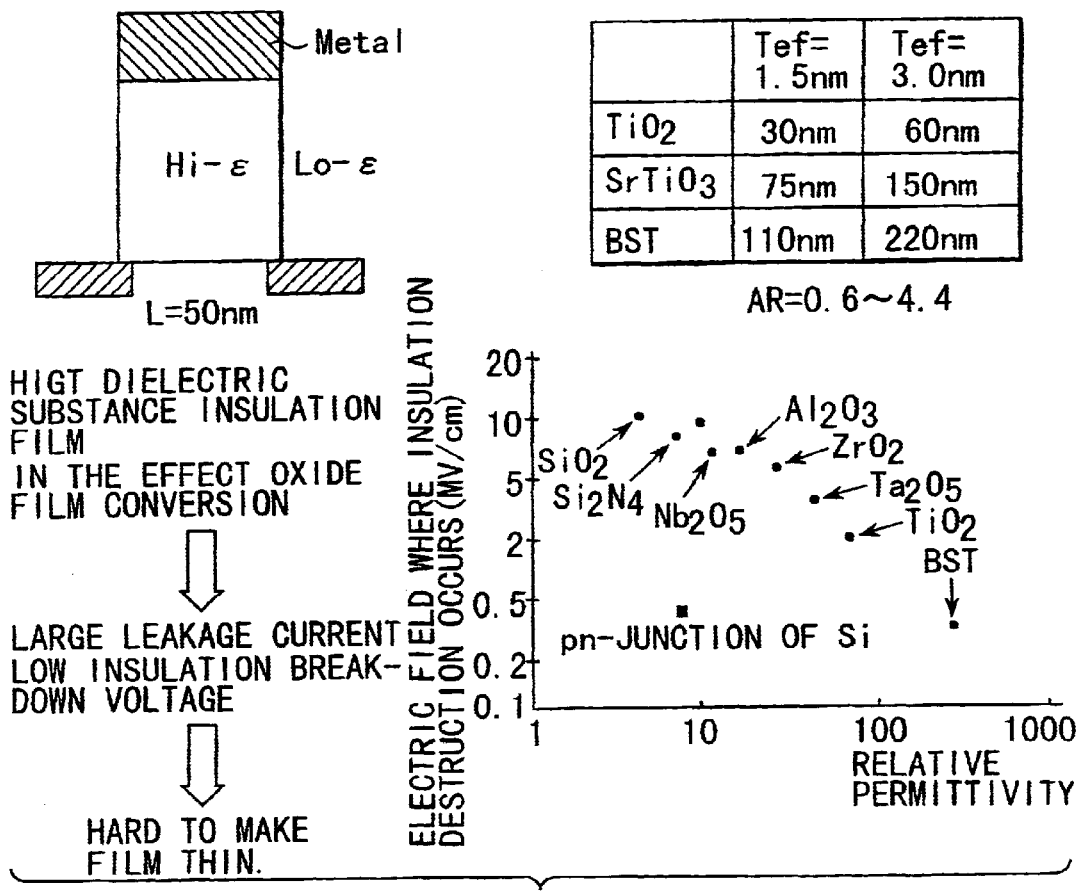
FIG. 2 (PRIOR ART)

CHANNEL CHARGE DENSITY $\sigma = \varepsilon \frac{V}{T}$

TRAPEZOID $$\sigma = \varepsilon \frac{V}{T}\left(\frac{\frac{LT}{LB}-1}{Ln\left(\frac{LT}{LB}\right)}\right)$$

SECTOR

CONVENTIONAL (LT/LB=1)
Cgb=0.47fF/μm
(1.00 TIMES)

(PARALLEL-MONOTONOUS
APPROXIMATION
=0.59fF/μm)

TRAPEZOID (LT/LB=3)
Cgb=0.79fF/μm
(1.67 TIMES)

SECTOR (LT/LB=3)
Cgb=0.86fF/μm
(1.83 TIMES)

EQUIPOTENTIAL LINE CHART
($V_g$=−3V) $V_d$=$V_s$=$V_b$=0V, 0.1V/div
(T=60nm, (Tef=3nm), LB=50nm, $\varepsilon_r$=80 ($TiO_2$))

(LT/LB=1)

TRAPEZOID (LT/LB=3)

SECTOR (LT/LB=3)

EQUIPOTENTIAL LINE CHART
(Vg=1V) Vd=Vs=Vb=0V, 0.1V/div
(T=60nm, (Tef=3nm), LB=50nm, $\varepsilon r=80 (TiO_2)$)

Vg=Ids CHARACTERISTIC (Tef=3nm $TiO_2$)
(T=60nm, LB=50nm, $\varepsilon r$=80)

Vg=Ids CHARACTERISTIC (Tef=3nm BST)
(T=220nm, LB=50nm, ε r=300)

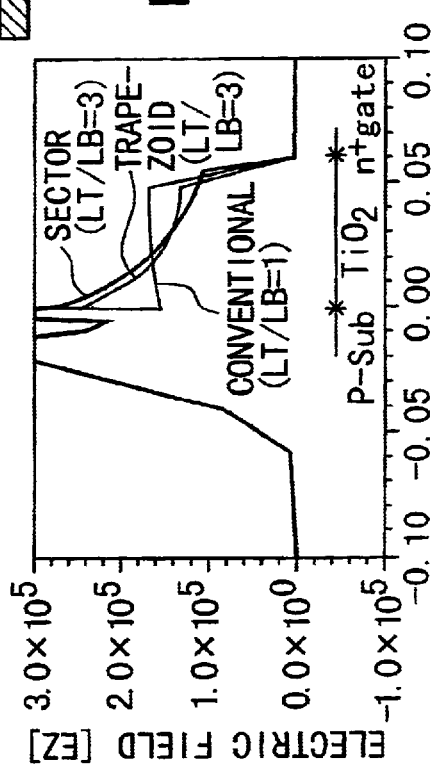
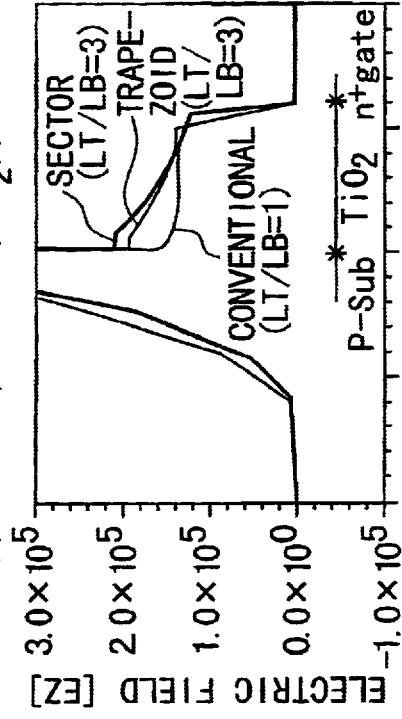
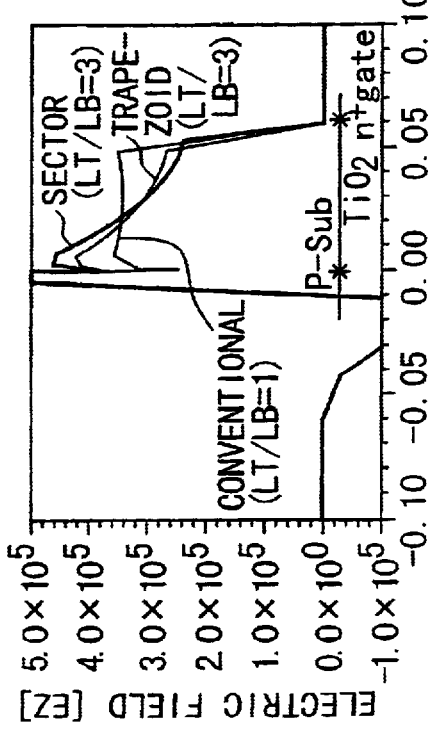
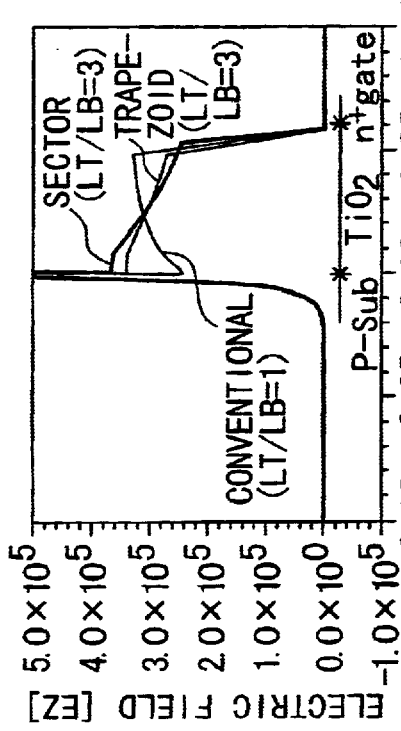

OFFSET DEPENDENCY OF Vg=Ids CHARACTERISITIC
(Tef=3.0nm(TiO$_2$), T=60nm, LB=50nm, $\varepsilon$ r=80)

CONVENTIONAL
(W=1)

CONVENTIONAL
(W=1.8)

PRESENT
INVENTION
(W=1)

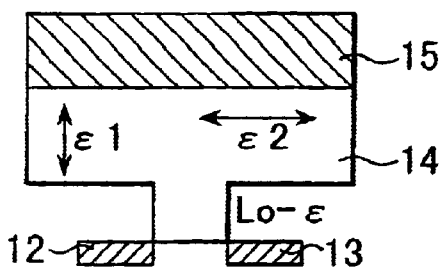 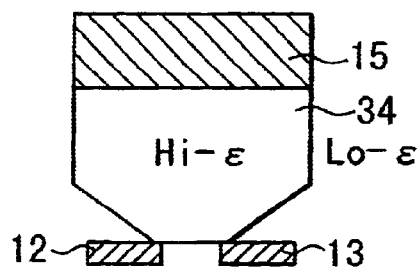
FIG. 15A          FIG. 15B
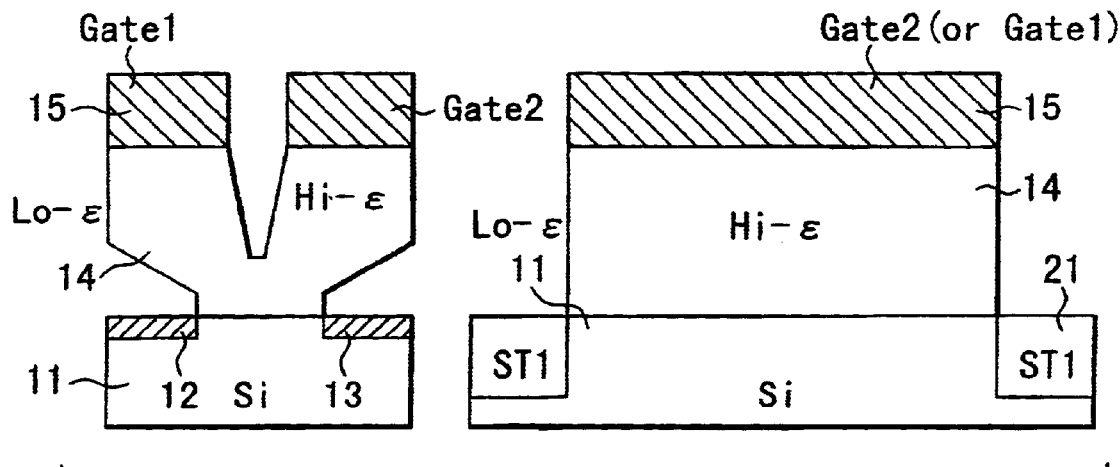
FIG. 15C
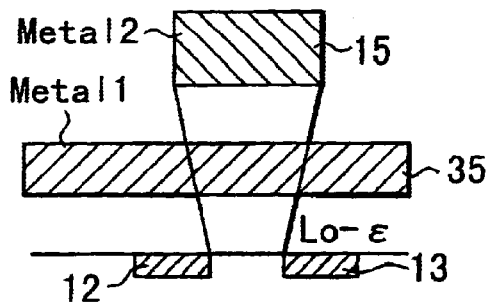 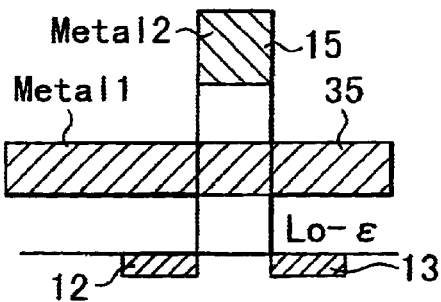
FIG. 15D          FIG. 15E
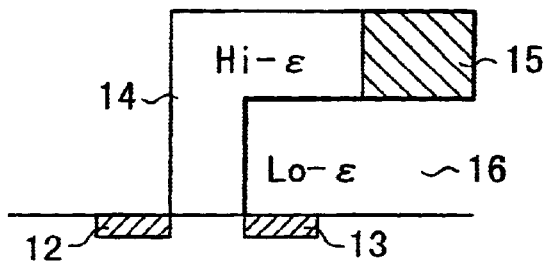
FIG. 15F

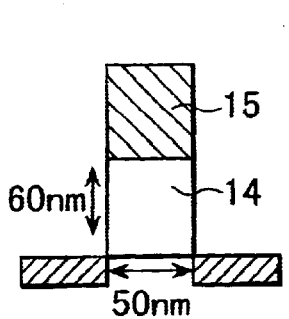
FIG. 16A
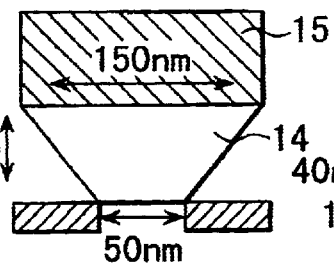
FIG. 16B
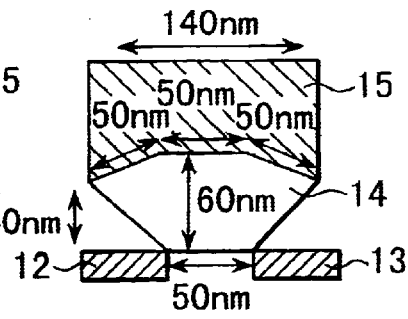
FIG. 16C
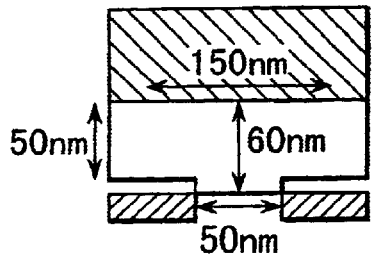
FIG. 16D
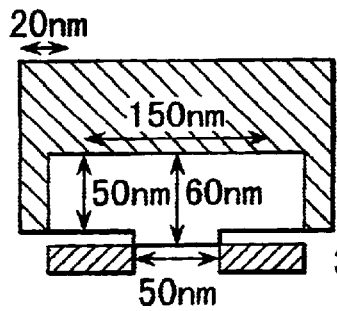
FIG. 16E
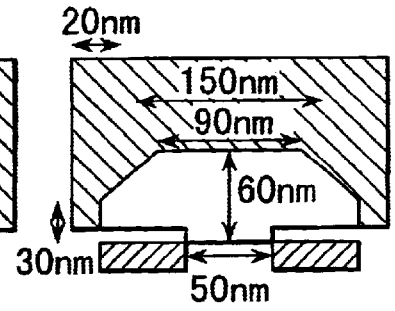
FIG. 16F
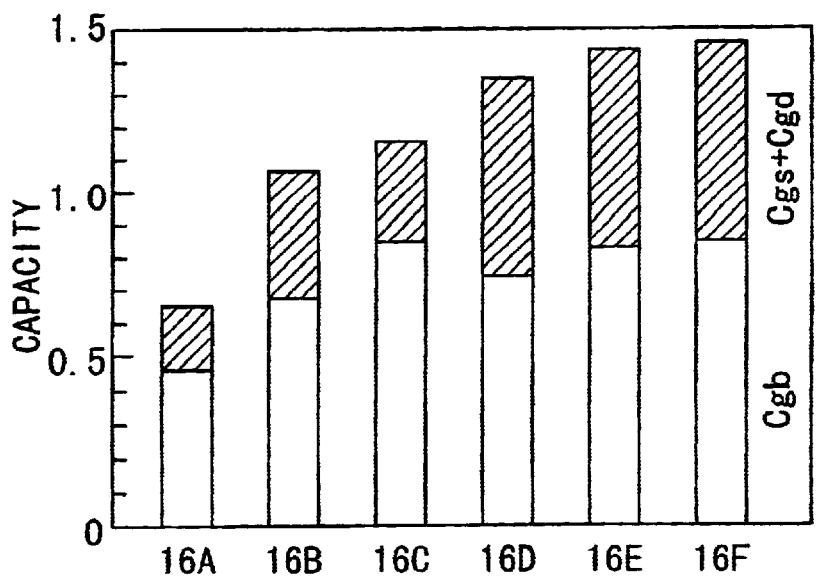
FIG. 16G  SHAPE DEPENDENCY OF EACH CAPACITY COMPONENT
Tef=3.0nm  $\varepsilon r=80(TiO_2)$

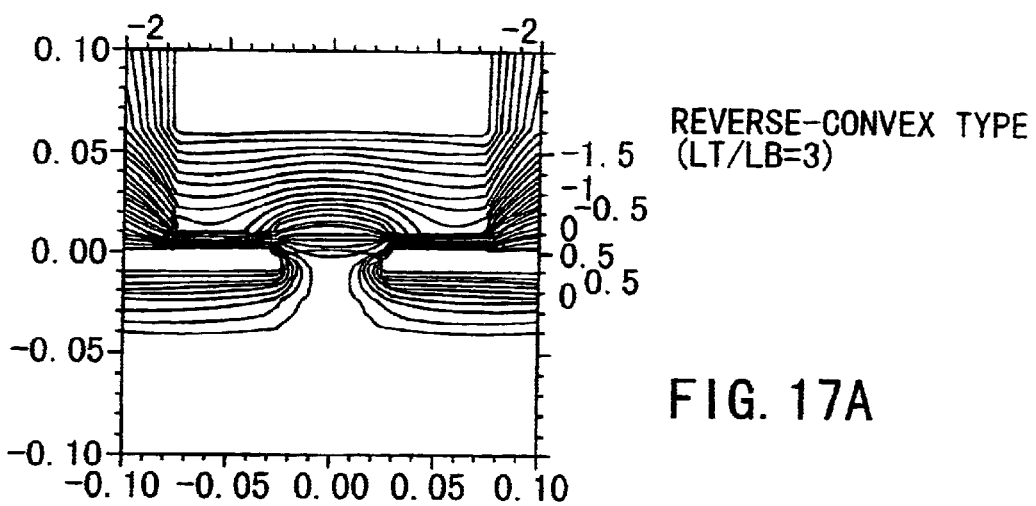
FIG. 17A REVERSE-CONVEX TYPE (LT/LB=3)
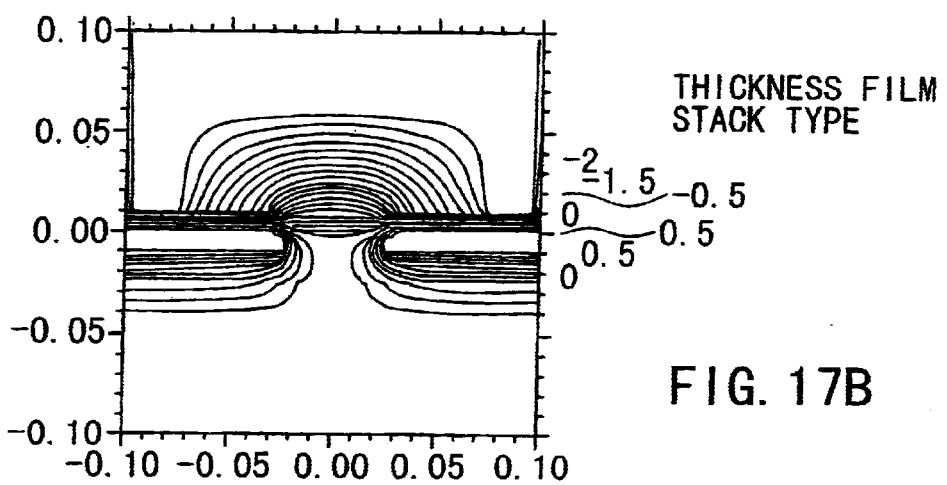
FIG. 17B THICKNESS FILM STACK TYPE
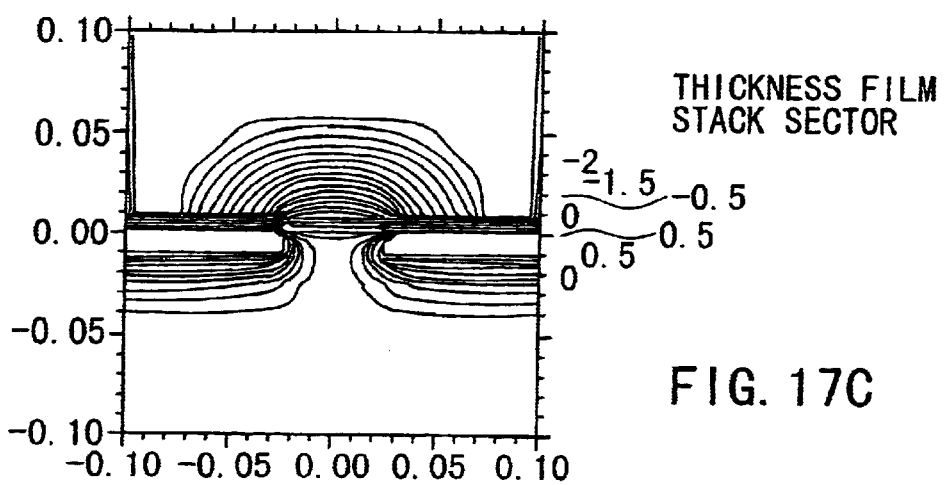
FIG. 17C THICKNESS FILM STACK SECTOR
EQUIPOTENTIAL LINE CHART
(Vg=−3V) Vd=Vs=Vb=0V, 0.1V/div
(T=60nm, (Tef=3nm), LB=50nm, $\varepsilon r=80 (TiO_2)$)

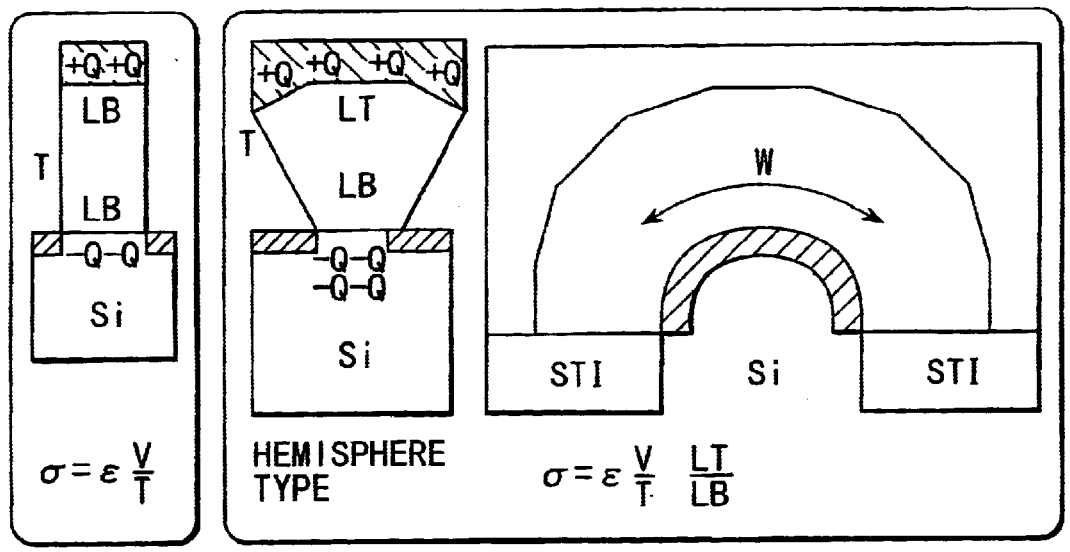
FIG. 18A (PRIOR ART)  FIG. 18B
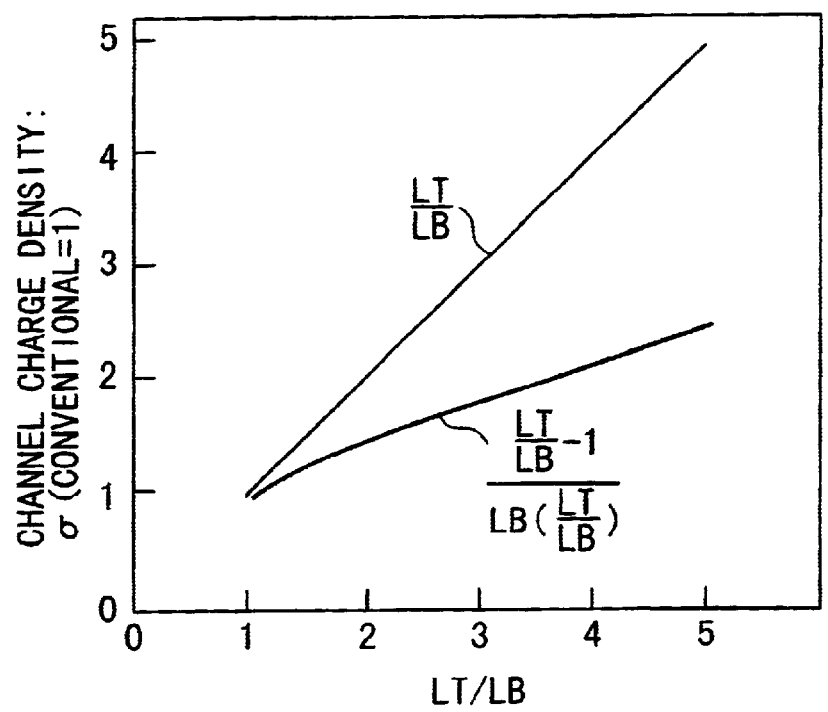
FIG. 18C

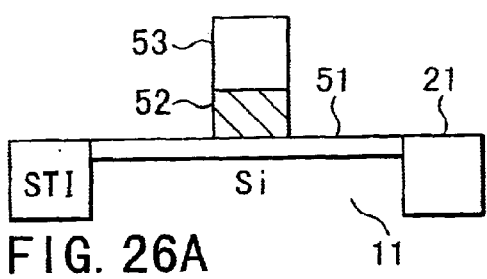
FIG. 26A
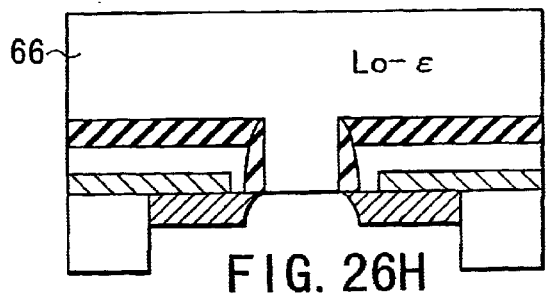
FIG. 26H
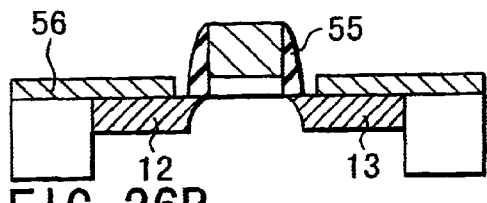
FIG. 26B
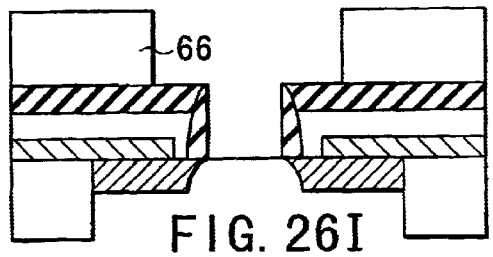
FIG. 26I
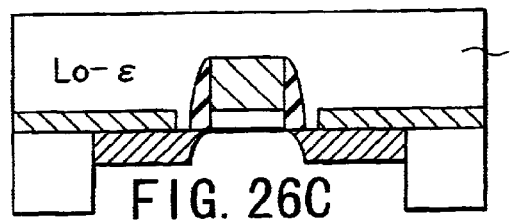
FIG. 26C
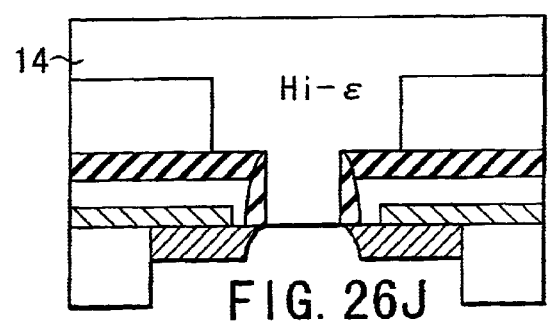
FIG. 26J
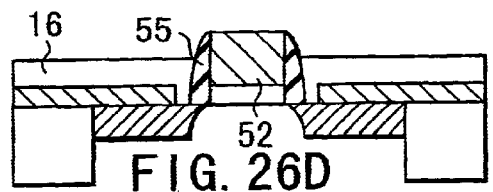
FIG. 26D
FIG. 26E
FIG. 26F
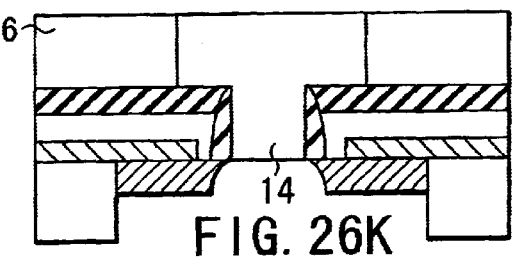
FIG. 26K
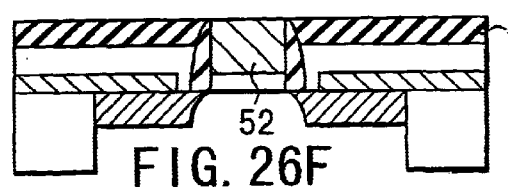
FIG. 26G
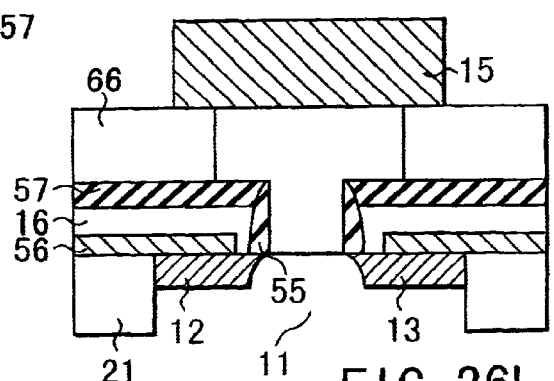
FIG. 26L

MOSFET HAVING HIGH AND LOW DIELECTRIC MATERIALS

BACKGROUND OF THE INVENTION

The present invention relates to a MOS type semiconductor device used with LSI etc., especially, to a semiconductor device using high permittivity material or ferroelectric material as a gate insulation film.

In recent years, by scaling the transistor by the fine processing technology etc. in a semiconductor technological field, several 1,000,000 transistors come to be integrated in one high chip of several $cm^2$, and are used here and there of a mainframe computer, a personal computer, home electric appliances product, a car, and a portable telephone, etc.

In general, when the transistor is reduced, for example, when the size of the transistor is made 1/k by scaling in a constant electric field, the parameter of each transistor is scaled as follows. Where, thickness of the gate oxide film: Tox/k, length of the channel: L/k, channel width: W/k, density of impurities in the Si substrate: NA×k, junction depth of the source-drain section: Xj/k, and power-supply voltage: Vdd/k.

Thus, the area of the transistor is reduced proportional to reciprocal of square like the following equation.

$$(W/k) \times (L/k) = WL/k^2.$$

Moreover, a gate load capacity C of the transistor is shown in the following equation.

$$C = \varepsilon/(Tox/k) \times (W/k)/(L/k)$$
$$= \{(\varepsilon/Tox) \times W \times L\}/k$$

Then, driving current of the transistor is reduced to 1/k like the following equation.

$$I = \mu \varepsilon/(Tox/k) \times (W/k)/(L/k) \times (Vdd/k - Vt) \times k \sim \{(\mu \varepsilon/Tox) \times (W/L) \times Vdd - Vdd\}/k.$$

Therefore, when the wiring capacity and the wiring resistance are disregarded, an operation delay t of the transistor is reduced like the following equation in proportion to the scaling coefficient k.

$$t = Q/I = \{(C/k) \times (Vdd/k)\}/(I/k) = t/k$$

Where, Q shows the charge.

It can be said that today's LSI can be sped up by scaling the transistor. FIG. 1A shows real size of the transistor which has been achieved in mass production today. This transistor has thickness of the gate oxide film of Tox=5 nm, channel length of L=0.2 μm, and junction depth of the source-drain section of Xj=100 nm.

By the way, it is expected that a big leakage current of the gate oxide film, which flows between the gate electrode and the substrate and between the gate electrode and the source-drain, becomes a trouble, when the transistor will be scaled hereafter toward a previous generation.

In a current gate oxide film, an FN-tunneling current (Fowler-Nordeim-Tunneling) is predominant. Here, the FN-tunneling current increases substantially by the second power of the electric field as the electric field applied to the gate oxide film becomes large by thinning the oxide film. In addition, the tunneling current (Direct-Tunneling) starts to flow directly from the vicinity of Tox=3 nm to 4 nm, when thinning the oxide film. It has a big problem where a greatly large gate current flows compared with the FN-tunneling, since the direct-tunneling current is not only increases in proportion to the electric field but also increases in exponential compared with thinning the gate oxide film.

A following fatal disadvantage is caused by the leakage current of the gate oxide film: 1) The standby leakage current of the entire LSI chip increases. 2) Since the charge accumulated in the gate leaks, a dynamic circuit is not operated. 3) Since the charge accumulated in the cell capacitor such as DRAM leaks, it is not operated as the memory. 4) It is impossible to compare with the turning on current of the transistor when thinning the gate oxide film, and a static circuit itself is not operated.

FIG. 1B shows the size of the transistor after ten years when scaling of the transistor today continues. This transistor has thickness of the gate oxide film of Tox=1.5 nm, channel length of L=50 nm (0.05 μm), and junction depth of the source-drain section of Xj=10 nm.

The gate leakage current increases by the actual measurement as many as eight digits, e.g., from $4 \times 10^{-17}$ A/$\mu m^2$ to $4 \times 10^{-9}$ A/$\mu m^2$ at Vdd=0.5V, when the thickness of the gate oxide film is changed from Tox=3.5 nm to 1.6 nm. With this, the charge stored by the gate of the transistor of size of, for example, W/L=0.4 μm/0.05 μm and the Tox=1.5 nm is as follows.

$$0.4 \ \mu m \times 0.05 \ \mu m \times 8.854 \times 10^{-14} \ F/cm \times 4/1.5 \ nm = 0.5 \ fF$$

On the other hand, the gate leakage current is as follows.

$$0.4 \ \mu m \times 0.05 \ \mu m \times 4 \times 10^{-9} \ A/\mu m^2 = 8 \times 10^{-11} \ A$$

Therefore, since the time when the charge can be held is only $$Q/I = 0.5 \ fF/(8 \times 10^{-11} \ A) = 6 \ \mu s.$$

It cannot be used as the memory by all means, when the difference of one digit to two digits is considered, it is impossible to apply to a dynamic circuit. In addition, the leakage current of the entire LSI chip of 1 $cm^2$ square is, $$4 \times 10^{-9} \ A/\mu m^{2 \times 10^4} \ \mu m \times 10^4 \ \mu m = 0.4 \ A.$$

It becomes an extraordinarily large value as mentioned-above.

On the other hand, in a case of constructing the transistor of L=0.05 μm, by giving up thinning the gate oxide film and setting driving current of the transistor to not so large value, the short channel effect becomes large, thereby it becomes extremely difficult to suppress a DIBL (Drain Induced Barrier Lowering) and a deterioration in S factor. When channel length L is $L=0.4\{Xj \times Tox(Ws+wd)^2\}^{1/3}$ or less, the short channel effect usually starts to become remarkable. Where, Xj is junction depth of the source-drain section, Tox is a thickness of the gate oxide film, and Ws+Wd is a sum of the width of a depletion layer of the source and the drain. It is necessary to over-scale the junction depth Xj etc. of the source-drain section to a value corresponding to Tox which cannot be reduces.

However, since Xj is still small as about 100 nm today, a lot of difficulties are attended to form a more shallow junction. That is, since an FN-tunneling current and a direct tunneling current increase in exponential to keep using the oxide film to the conventional gate insulation film, there is a disadvantage with a lot of difficulties.

A try which uses the high dielectric film as the gate insulation film as shown in FIG. 2 to solve this disadvantage film, recently. While relative permittivity (∈r) of the gate oxide film such as $SiO_2$ is about four, since the relative permittivity is big such that the relative permittivity is about 7 to 8 in $Si_3N_4$ and NO, the relative permittivity is about 20 to 30 in $Ta_2O_5$, the relative permittivity is about 80 in $TiO_2$, the relative permittivity is 100 to 200 in $SrTiO_3$, the relative permittivity is 250 to 300 in $Ba_xSr_{1-x}TiO_3$, the same driving current of the transistor is:

$$I = \mu \in O \in r/Tox \times (W/L) \times Vdd \times Vdd,$$

if the material having a large relative permittivity are used as a gate insulation film.

Therefore, the substantial gate insulation film thickness can be thickened to obtain the same driving current, that is, to obtain the gate capacity per the same unit area by conversion of the thickness of the oxide film. For example, in $TiO_2$, it is possible to achieve conversion Tef=1.5 nm of the thickness of the oxide film by a thick film such as film thickness:

$$T = (80/4) \times 1.5 \text{ nm} = 30 \text{ nm}.$$

However, the following problems exist when the gate insulation film is achieved by the high dielectric film. Since the band gap of the insulation film generally becomes a small value such that material has the larger relative permittivity, as a result, the barrier heights between the gate electrode and the gate insulation film and between the Si substrate and the gate insulation film become small. The small barrier height means that it is easy for electrons to flow in the insulation film by exceeding the barrier height, that is, a lot of leakage currents of gate insulation film flow.

The relationship of the relative permittivity in each insulation film material and the electric field where the insulation destruction is caused is shown in the lower right of FIG. 2. FIG. 2 shows that the electric field of the insulation destruction is almost in inverse proportion to the relative permittivity. That is, even when the electric field applied to the gate insulation film is buffered by using the material with a high relative permittivity and the gate oxide film of the same thickness in oxide film conversion, that is, the gate insulation film with thick only amount corresponding to a largeness of permittivity, this can be said it is equal to the flow of the gate insulation film leakage current equal with the oxide film after all. With this, it is impossible to expect many advantages even if there is an advantage in which the gate leakage current is decreased by using a high permittivity material as a gate insulation film.

Thus, even when the gate insulation film thickness with the oxide film conversion is thinned by using the high dielectric material for the gate insulation film, the electric field of the breakdown voltage lowers since the band gap of the high dielectric material is small, and as the result the difficulty is attended more than the oxide film to thin the gate insulation film thickness of the conversion of the thickness of the oxide film.

When bringing the above-mentioned disadvantage together, with the oxide film used for the conventional gate insulation film, there is a disadvantage that a FN-tunneling current and a direct tunneling current increase in exponential and the difficulty is attended when the transistor is scaled and the oxide film is made a thin film, and the electric field of the breakdown voltage lowers since the band gap of the high dielectric material is small when the gate insulation film thickness of the conversion of the thickness of the oxide film is reduced by using the high dielectric material for the gate insulation film, consequently, the difficulty is attended to reduce the gate insulation film thickness of the conversion of the thickness of the oxide film more than the oxide film.

Oppositely, there is a disadvantage that deterioration in drivability improvement of the transistor, the short channel effect increase, and deterioration in the subthreshold characteristic become remarkable when other parts of the transistor are scaled with keeping thicking the gate insulation film thickness to suppress the gate leakage current.

BRIEF SUMMARY OF THE INVENTION

An object of the present invention is to provide a semiconductor device which can effectively perform scaling of the transistor without thinning the gate insulation film thickness and can improve the drivability of the transistor, suppress the short channel effect, and improve the subthreshold characteristic, etc. with suppressing the gate leakage current in the transistor using a high permittivity material or a ferroelectric material of 20 or more of the relative permittivity as the gate insulation film.

Another objects of the present invention is to provide a semiconductor device which can achieve further more high performance by combining with the conventional transistor.

The present invention adopts the following structures to achieve the above-mentioned object.

The semiconductor device of the present invention comprises: a channel of a first conductive type formed on a surface layer of a semiconductor substrate; a source and a drain of a second conductive type formed on both sides of the channel; a gate insulation film with a first relative permittivity formed at least on the channel directly or through a buffer insulation film; a gate electrode formed on the gate insulation film; and a side insulation film formed at least on a side of the gate insulation film and having a second relative permittivity which is smaller than the first relative permittivity, wherein when assuming that an area of the gate insulation film, which is adjacent to the surface layer on a gate electrode side, is S1, and an area thereof, which is adjacent to the surface layer on the channel side, is S2, the area S1 is larger than the area S2. The first permittivity is 20 or more.

Here, preferable manners of the present invention are as follows.

(1) The area S2 is 1.5 times or more as large as the area S1.

(2) A width of the gate insulation film on the channel side is smaller than a width of the gate insulation film on the gate electrode side in a length along a channel width direction of the gate insulation film.

(3) The section shape of the gate insulation film observed from the direction of the source-drain has a shape such that the cross-section becomes small from a gate electrode side toward the channel side, for example, a convex shape, a trapezoid shape or a sector shape. That is, a sectional shape along a direction of the source-drain of the gate insulation film is one of tapered shape, a trapezoid, a sector, and a stair, or a sectional shape along a direction of the source-drain of the gate insulation film from the gate electrode to the predetermined distance is a rectangle, and is one of a tapered shape, a trapezoid, a sector, and a stair on channel side therefrom.

(4) The first gate insulation film is a high dielectric film or a ferroelectric film including a composition or an element of one of $Ta_2O_5$, $Sr_2Ta_2O_7$, $TiO_2$, $SrTiO_3$, $BaTiO_3$, $CaTiO_3$, $Ba_xSr_{1-x}TiO_3$, $PbTiO_3$, $PbZr_xTi_{1-x}O_3$, $SrBi_2Ta_2O_9$, $SrBi_2(Ta_xNb_{1-x})_2O_9$, or $Bi_2(Ta_xNb_{1-x})O_6$.

(5) The side insulation film is a low dielectric film which includes the compositions or elements such as $SiO_2$, $Si_3N_4$, NO, F added $SiO_2$, $CH_3$-group mixed $SiO_2$, TEOS, polyimide or porous $SiO_2$.

(6) The buffer insulation film includes one of $SiO_2$, $Si_3N_4$, NO, $TiO_2$, $SrTiO_3$, MgO or $CeO_2$.

(7) The semiconductor substrate is an SOI substrate in which the semiconductor layer is formed on the monocrystalline semiconductor substrate through the insulation layer.

Though in the gate insulation film which uses a conventional $SiO_2$, high dielectric film, and a ferroelectric film, the method is only in thinning the gate insulation film to improve drivability of the transistor, there is a disadvantage of the gate leakage current.

Area S1, which contacts with (faces) the channel side of the gate insulation film, is small compared with area S2 which contacts with (faces) the gate electrode side thereof according to the semiconductor device of the present invention. As a result, S2 becomes larger than S1 compared with the conventional transistor of S2=S1. Therefore, when the voltage is applied to the gate electrode, since the permittivity of the insulation film which surrounds both sides of the gate insulation film is smaller than that of the gate insulation film, the electric flux of the gate insulation film generated by the charge on the gate electrode side does not direct to the insulation film which surrounds both sides of the gate insulation film too much and the area of the gate insulation film (i.e., length from the direction between source-drain terminals of the transistor) becomes small (short) on the channel side, thereby the above-mentioned electric flux concentrates on the channel side, and as a result the electric flux density becomes large on the channel side compared with the gate insulation film side.

In other word, in the present invention comparing with the conventional ones, when an upper channel length (Defined in the part where the gate electrode and the gate insulation film are contacted) is long, the capacity per the unit channel width of the same lower channel length (Defined in the part where the gate insulation film and the semiconductor substrate which includes the channel, the source, and the drain are contacted) of the gate of the transistor becomes large with the gate insulation film of the same gate insulation film thickness in the same permittivity. As the result, according to the present invention, when the thickness of the gate insulation film is constant, the induced channel charge density becomes large compared with conventional ones. With this advantage, an improvement of drivability of the transistor can be achieved without thinning the gate insulation film thickness with suppressing the gate leakage current.

As described above, according to the present invention, the same advantage in case of thinning the gate insulation film is effected, and the suppression of the short channel effect and the improvement of the subthreshold characteristic can be achieved. Moreover, the width of the gate of the gate electrode along the direction of the source-drain is enlarged, thereby the decrease of the gate wiring resistance becomes possible. Moreover, the electric flux density lowers toward the gate electrode side of the gate insulation film along the direction of the channel-gate electrode. This can be suppressed to decrease the substantial gate insulation film capacity, by the capacity generated with depletion of the gate electrode side generated in the case of using the semiconductors such as $n^+$-polysilicon and $p^+$-polysilicon as a gate electrode material in all the gate electrodes or the parts which contact with the gate insulation film surface side.

It is briefly described that when the gate insulation film is subdivided along the direction of the channel-gate electrode, the capacity of each subdivided gate insulation film becomes a large value directing to the gate insulation film side. That is, capacity with this depletion layer becomes large in the present invention compared with the conventional transistor because of the area increase, and the width of a depletion layer may be reduced.

In the present invention, a shape in the section of the gate insulation film divided in respect along the direction of the source-drain electrode and gate the direction of the electrode-channel can be formed with shapes of the trapezoid whose upper channel width is larger than a lower channel width, the sector in the opposite direction in which the upper channel has roundness, and convex shape in the opposite direction in which the upper channel width is larger than a lower channel width, and is possible to achieve them more easily when film thickness of the gate insulation film is larger than the upper channel width, or when it is comparably large even if it is small. To achieve them, the gate insulation film of high dielectric material and ferroelectric material that relative permittivity is 20 or larger, that is, a high dielectric film or a ferroelectric film which includes the composition or elements such as $Ta_2O_5$, $Sr_2Ta_2O_7$, $TiO_2$, $SrTiO_3$, $BaTiO_3$, $CaTiO_3$, $Ba_xSr_{1-x}TiO_3$, $PbTiO_3$, $PbZr_xTi_{1-x}O_3$, $SrBi_2Ta_2O_9$, $SrBi_2(Ta_xNb_{1-x})_2O_9$, or $Bi_2(Ta_xNb_{1-x})O_6$, is preferable.

Moreover, it is preferable to cover both sides of the gate insulation film with the insulation film which includes the composition or elements such as $SiO_2$, $Si_3N_4$, NO, F added $SiO_2$, CH3-group mixed $SiO_2$, TEOS, polyimide or porous $SiO_2$ with a comparatively low relative permittivity in order that the electric flux of the gate insulation film directs to the channel, and does not leak to the insulation film side which covers the gate insulation film. In addition, the gate insulation film and the channel of Si may be directly connected, and may place the buffer films such as $SiO_2$, $Si_3N_4$, NO, $TiO_2$, $SrTiO_3$, MgO or $CeO_2$.

Moreover, in the conventional art, when applying the same gate voltage, if gate insulation film thickness=T/k (k=S factor>1) for gate insulation film thickness=T, though the applied electric field of the entire gate insulation film increases to kE and k times, the channel surface charge density of the transistor becomes k times, the gate leakage current abruptly increases because of increasing the electric field.

On the other hand, according to the present invention, since the electric flux density increases on the channel side, and the channel surface charge density of the transistor can be k times by designing such as (upper channel length/(lower channel length)=$\beta$(>1) with the gate insulation film=T, drivability of the transistor can be improved with a constant film thickness. Though the electric field at this time becomes kE on the channel side as well as the case to make the film thickness T/k, the electric field lowers by directing to the gate electric field side, and becomes Ek/$\beta$(k/$\beta$<1) oppositely on the gate electrode side, and the electric field becomes small compared with the case of conventional gate insulation film=T.

This result can be understood as follows. That is, certainly, in the present invention, though the electrons are accelerated in electric field kE, exceed the barrier height and flow from the channel side to the gate insulation film side, thereafter the electrons hop the trap in the gate insulation film and reach the gate electrode side. Since the electric field in this part takes a small value, the flowing current is decreased in this hopping conduction according to the present invention.

Another semiconductor devices of the present invention comprises: a channel of a first conductive type formed on a surface layer of a semiconductor substrate; a source and a drain of a second conductive type formed on both sides of the channel; a gate insulation film with a first relative permittivity formed at least on the channel directly or through a buffer insulation film; a gate electrode formed on the gate insulation film; and a side insulation film formed at least on a side of the gate insulation film and having a second relative permittivity which is smaller than the first relative permittivity, wherein an electric flux density in the gate insulation film on the channel side is closer than that on the gate electrode side.

Still another semiconductor devices of the present invention comprises: a plurality of first MOS type transistors each comprising a first channel of a first conductive type formed on a surface layer of a semiconductor substrate, a first source and a first drain of a second conductive type formed to both sides of the first channel, a first gate insulation film with a first relative permittivity formed at least on the first channel directly or through a buffer insulation film, a first gate electrode formed on the first gate insulation film, and a first side insulation film formed at least on side of the first gate insulation film and having a second relative permittivity which is smaller than the first relative permittivity; and a plurality of second MOS type transistors each comprising a second channel of a first conductive type formed on a surface layer of the substrate, a second source and a second drain of a second conductive type formed on both sides of the second channel, a second gate insulation film with the first relative permittivity formed at least on the second channel directly or through a buffer insulation film, a second gate electrode formed on the second gate insulation film, and a second side insulation film formed at least on side of the second gate insulation film and having a second relative permittivity which is smaller than the first relative permittivity, wherein when a cross-section on the first channel side of the first gate insulation film is assumed to be S1, a cross-section on the first gate electrode side is assumed to be S2, a cross-section on the second channel side of the second gate insulation film is assumed to be S3, and a cross-section on the second gate electrode side of the second gate insulation film is assumed to be S4, a condition of: S2/S1>S4/S3 is satisfied. The first permittivity is 20 or more.

Where, a voltage applied to the first gate electrode is lower than a voltage applied to the second gate electrode. Moreover, the structure same as the preferable manner previously described can be applied to another semiconductor device according to the present invention.

In another semiconductor device of the present invention, it is shown that the present invention can be applied and has an advantage even in another case that lower limit of the gate insulation film is not determined by the gate leakage current. For example, in the case with DRAM and the logic-integrated-chip, since Vpp potential which is higher than power-supply voltage Vdd is applied to the memory in DRAM, thick gate insulation film, which can endure the Vpp and keep the reliability of the transistor (deterioration and gate leakage current of the transistor), is necessary as the gate insulation film. However, the gate insulation film is too thick when using this transistor with the DRAM peripheral circuit and the logic section which uses the Vdd power supply as it is, to achieve high-performance DRAM-logic integrated LSI because the performance thereof is inferior compared with the chip which drivability of the transistor manufactured in the process only for logic.

According to the present invention, by using a transistor of (upper portion channel length)/(lower channel length)=β (>1) with a constant gate insulation film thickness as a transistor of the DRAM peripheral circuit and the logic section to which Vdd is applied, drivability of the transistor can be improved. In this case, at least the channel side electric field in which the electric field of the transistor of the Vdd application becomes maximum being the same as the channel side electric field of the transistor of the Vpp application can be raised. This example is an example which reliability is not limited by a gate leakage current of the transistor of the Vdd application.

As mentioned-above in detail, according to the present invention, improvement of drivability of the transistor, suppression of the short channel effect, improvement of the subthreshold characteristic, the decrease of the gate wiring resistance, and the suppression of an increase in the effect gate insulation film thickness by depletion of the gate electrode side, etc. can be achieved, with suppressing the gate leakage current, without thinning the gate insulation film thickness. Moreover, integrated LSI etc. with high-performance can be achieved by combining conventional transistors with the transistor of the present invention.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1A and FIG. 1B are figures which show the transistor using the oxide film as a conventional gate insulation film;

FIG. 2 is a figure which shows the transistor using the high dielectric material as a conventional gate insulation film;

FIG. 9A to FIG. 9E are figures which show electric field strength at the gate insulation film part;

FIG. 15A to FIG. 15F are sectional views which show the element structure of the MOS transistor according to the seventh embodiment;

FIG. 16A to FIG. 16G are figures which show the capacity component comparison in the transistor structure explained in FIG. 13 and FIG. 14;

FIG. 17A to FIG. 17C are equipotential line charts to explain the advantage of the present invention;

FIG. 18A to FIG. 18C are figures which show the relationship of the element structure of the MOS transistor and the channel charge density according to the eighth embodiment;

FIG. 26A to FIG. 26L are sectional views which show the manufacturing steps of the MOS transistor according to the sixteenth embodiment;

DETAILED DESCRIPTION OF THE INVENTION

Hereafter, embodiments of present invention referring to drawing will be explained.

(First Embodiment)

Figures 3A, 3B:
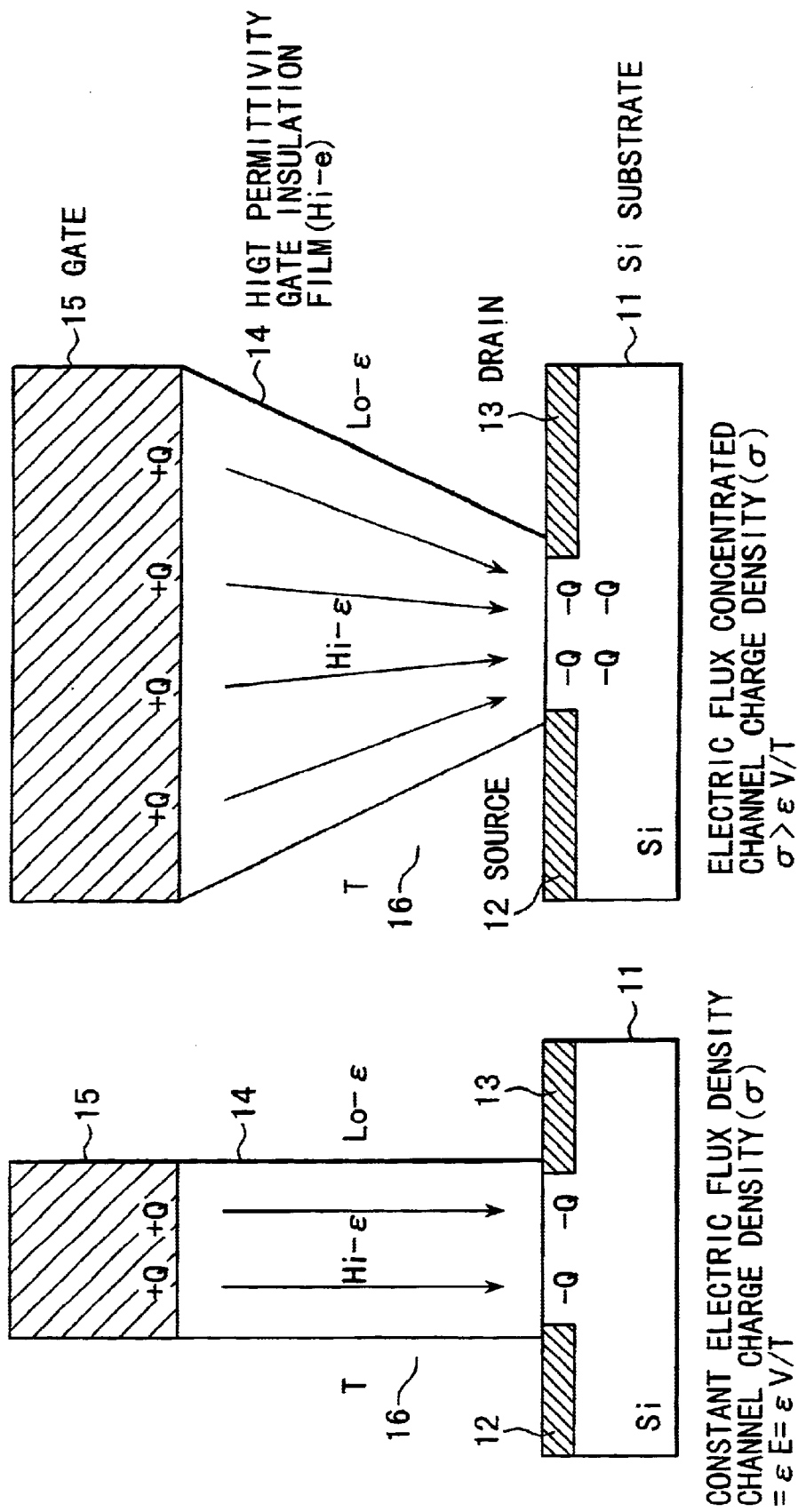
FIG. 3A and FIG. 3B are sectional views which schematically show the structure of the MOS transistor according to the first embodiment.

FIG. 3A and FIG. 3B are sectional views which schematically show the element structure of the MOS transistor according to the first embodiment of the present invention. FIG. 3A shows the conventional transistor structure, and FIG. 3B shows the transistor structure of this embodiment.

In both of FIG. 3A and FIG. 3B, gate insulation film 14 of high dielectric (Hi-∈) material which consists of a high dielectric film and a ferroelectric film on Si substrate (well) 11 is formed, and gate electrode 15 is formed thereon. The diffusion layer, which is source 12 and drain 13 is formed in Si substrate 11 on both sides of gate insulation film 14. Low permittivity (Lo-∈) insulation film 16 (not shown) such as $SiO_2$ is formed on both sides of gate insulation film 14. The charge is induced by applying the gate voltage on the Si substrate surface (channel) of interface of Si substrate 11 and gate insulation film 14 under the gate insulation film, and the current flows between the source-drain to operate as the transistor.

As the conventional structure shown in FIG. 3A, in the gate insulation film, area of the part contacting with the Si substrate side where the channel, the source, and the drain are formed (corresponding to the channel length) is equal to area of the part contacting with gate electrode 15. That is, length of the upper portion of gate insulation film 14 is equal to that of lower portion. Therefore, the electric flux density when the voltage is applied to gate electrode 15 is constant in gate insulation film 14. This means the charge density induced on the gate electrode side and the charge density induced on the channel side are equal, when applying the gate voltage. Therefore, it is necessary to increase the induced charge density on the gate channel, that is, increasing electric flux density in gate insulation film, to improve drivability of the transistor with constant gate voltage (Vg).

However, gate voltage is expressed by Vg=∈ET (Here, ∈=permittivity, E=electric field, and T is the gate insulation film thickness) in the structure shown in FIG. 3A because the charge density is constant in gate insulation film 14. Therefore, there is only a method of thinning gate insulation film 14 to improve drivability of the transistor. However, since the entire electric field increases with this, the gate leakage current becomes a disadvantage.

On the other hand, in the embodiment structure shown in FIG. 3B, the length of the part contacting with the gate electrode side of gate insulation film 14 is made longer structure than a length contacting with the channel side, that is, a shape of gate insulation film 14 is made to trapezoid in which upper side is larger than lower side. Area S2 contacting with (facing) the gate electrode side of gate insulation film 14 is a large value compared with area S1 contacting with (facing) the channel side when considering three-dimensionally. As a result, when the voltage is applied to gate electrode 15, the electric flux of gate insulation film 14 generated by the charge on the gate electrode side does not direct to insulation film 16 which surrounds both sides of gate insulation film 14 too much since the permittivity of insulation film 16 which surrounds both sides of gate insulation film 14 is smaller than that of the gate insulation film 14, and, the above-mentioned electric flux concentrates with directing to the channel side because the area which is cut along the direction of the Si interface of gate insulation film 14 with directing to the channel side from the gate insulation film side becomes small, and the electric flux density on the channel side becomes larger than the gate insulation film side.

In other word, in the present invention comparing with the conventional ones, when an upper channel length (Defined in the part where the gate electrode 15 and the gate insulation film 14 are contacted) is long, the capacity per the unit channel width of the same lower channel length (Defined in the part where the gate insulation film 14 and the semiconductor substrate which includes the channel, the source, and the drain are contacted) of the gate of the transistor becomes large with the gate insulation film of the same gate insulation film thickness in the same permittivity. As the result, according to the embodiment, when the thickness of the gate insulation film is constant, the induced channel charge density becomes large compared with conventional ones. With this advantage, an improvement of drivability of the transistor can be achieved without thinning the gate insulation film thickness with suppressing the gate leakage current.

As described above, according to the embodiment, the same advantage in case of thinning the gate insulation film 14 is effected, and the suppression of the short channel effect and the improvement of the subthreshold characteristic can be achieved. Moreover, the width of the gate of the gate electrode 15 along the direction of the source-drain is enlarged, thereby the decrease of the gate wiring resistance becomes possible. Moreover, the electric flux density lowers toward the gate electrode side of the gate insulation film 14 along the direction of the channel-gate electrode. This can be suppressed to decrease the substantial gate insulation film capacity, by the capacity generated with depletion of the gate electrode side generated in the case of using the semiconductors such as $n^+$-polysilicon and $p^+$-polysilicon as a gate electrode material in all the gate electrodes and the parts which contact with the gate insulation film surface side.

It is briefly described that when the gate insulation film 14 is subdivided along the direction of the channel-gate electrode, the capacity of each subdivided gate insulation film 14 becomes a large value directing to the gate insulation film side. That is, capacity with this depletion layer becomes large in the present invention compared with the conventional transistor because of the area increase, and the width of a depletion layer may be reduced.

It is difficult to achieve this embodiment with $SiO_2$ which has achieved current LSI as a gate insulation film material, but is impossible. This is the reason why it is impossible to form a trapezoid gate insulation film since an aspect ratio is too small in a current transistor having 250 nm of a lower channel length for gate oxide film=5 nm. The embodiment becomes more effective, when the high dielectric gate insulation film material, whose relative permittivity is about 20 or more, other than $SiO_2$ is used in the future. The reason why an equivalent gate insulation film thickness to $SiO_2$ of conversion of the thickness of the oxide film is to be able to make to sufficiently thick or thicker which can be compared with a lower channel length since the permittivity is large, and the ratio of the leakage electric flux from the gate insulation film to an insulation film of a low permittivity on both sides of the gate insulation film can be suppressed.

For example, when the gate insulation film having lower channel length=50 nm and conversion of the thickness of the oxide film of 3 nm is achieved with $TiO_2$ of relative permittivity 80, the aspect ratio of gate insulation film thickness ($T=3$ nm$=80\div4=60$ nm) and the gate insulation film becomes one or more, and the transistor which the upper channel length is several times larger than a lower channel length can be easily achieved.

When the relative permittivity is 20, the aspect ratio becomes 0.3 such as $T=3$ nm$\times 20\div 4=15$ nm, and the achievement is extremely difficult. That is, a high dielectric material and a ferroelectric material having the relative permittivity of 20 or more is significantly effective the transistor and easy to produce the transistor in f the embodiment.

There is a high dielectric film or a ferroelectric film which include the compositions or elements such as $Ta_2O_5$, $Sr_2Ta_2O_7$, $TiO_2$, $SrTiO_3$ (=STO), $BaTiO_3$, $CaTiO_3$, $Ba_xSr_{1-x}TiO_3$ (=BST), $PbTiO_3$, $PbZr_xTi_{1-x}O_3$ (=PZT), $SrBi_2Ta_2O_9$ (=SBT), $SrBi_2(Ta_xNb_{1-x})_2O_9$, or $Bi_2(Ta_xNb_{1-x})O_6$, as a high dielectric material and a ferroelectric material whose the relative permittivity is 20 or larger, and it can be understood that the gate insulation film constructed by them is preferable.

Moreover, it is preferable to use a relative permittivity material whose relative permittivity is as low as possible and is lower than 20, and it is preferable to cover both sides of the gate insulation film with the insulation film which includes the composition or elements such as $SiO_2$, $Si_3N_4$, NO, F added $SiO_2$, CH3-group mixed $SiO_2$, TEOS, polyimide or porous $SiO_2$ with a comparatively low relative permittivity in order that the electric flux of the gate insulation film directs to the channel, and does not leak to the insulation film side which covers the gate insulation film. In addition, it is the most preferable to form a high dielectric material and a ferroelectric material directly on the Si substrate, and may place the buffer films such as $SiO_2$, $Si_3N_4$, NO, $TiO_2$, $SrTiO_3$, MgO or $CeO_2$ between the above-mentioned gate insulation film and the Si substrate to prevent from no matching disadvantage of the lattice constant and diffusing impurities to Si.

Moreover, in the conventional art, in a case of gate insulation film thickness=T/k (k: scaling factor>1) for gate insulation film thickness=T when applying the same gate voltage, the gate leakage current abruptly increases because of increasing an electric field though the application electric field of the entire gate insulation film increases to kE and k times and the channel surface charge density of the transistor becomes k times. On the other hand, by designing to (upper channel length)/(lower channel length)=$\beta(>1)$ with gate insulation film thickness=T according to this embodiment, the electric flux density increases on the channel side, thereby the channel surface charge density of the transistor can be made to k times, and drivability of the transistor can be improved with a constant film thickness.

Though the electric field at this time becomes becoming kE on the channel side as well as the case to make the film thickness T/k, the electric field lowers by directing to the gate electric field side, and becomes Ek/$\beta$ (k/$\beta$<1) oppositely on the gate electrode side, and the electric field becomes small compared with the case of conventional gate insulation film=T. This result can be understood as follows. That is, certainly, in the present invention, though the electrons are accelerated in electric field kE, exceed the barrier height and flow from the channel side to the gate insulation film side, thereafter the electrons hop the trap in the gate insulation film and reach the gate electrode side. Since the electric field in this part takes a small value, the flowing current is decreased in this hopping conduction according to the present invention. Moreover, electrons are not sufficiently accelerated since the thickness in the part which is a high electric field is thin, therefore the gate leakage current can be decreased.

(Second Embodiment)

Figure 4A:
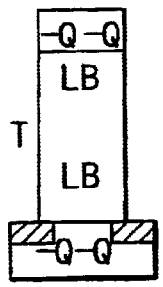
FIG. 4A to FIG. 4D are figures which show the relationship of the structure of the MOS transistor and the channel charge density according to the second embodiment.
Figure 4B:
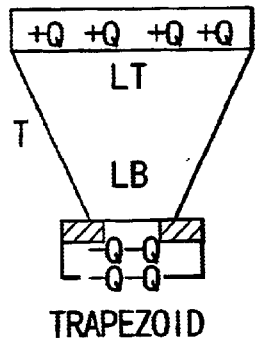
Figure 4C:
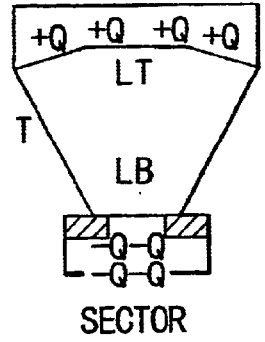

FIG. 4A to FIG. 4D show a sectional view which schematically shows the element structure of the MOS transistor according to the second embodiment of the present invention with a conventional structure, and a characteristic chart which shows the relationship of various transistor structures and the channel charge densities. FIG. 4A is a conventional transistor structure, FIG. 4B is a trapezoid transistor structure whose the upper side of the gate insulation film is longer than the lower side thereof like the first embodiment. FIG. 4C shows this embodiment structure, and a transistor structure that the surface is the sector. In FIG. 4A to FIG. 4D, the gate insulation film thickness is kept constant with T in each transistor are shown.

In the first embodiment shown in FIG. 4B, though the electric flux in the gate insulation film certainly concentrates from the gate electrode side toward the channel side when the gate insulation film is in the trapezoid, since the distance between the gate electrode and the channel on the edge becomes longer than the center thereof and a substantial gate insulation film thickness larger than T, the channel charge density cannot be maximized. On the other hand, as the embodiment shown in FIG. 4C, the upper side is the sector and the distance between gate electrode and channel is T at both of at the center and the edge, thereby the electric flux effectively concentrates, and the electric flux density in the vicinity of the channel of the gate insulation film can be maximized.

In this case, it is assumed that the upper portion channel length is LT, a lower channel length is LB, the permittivity of the gate insulation film is $\in$, the voltage of the gate is V, and the permittivity of the insulation film on both sides of the gate insulation film is very small compared with the permittivity of the gate insulation film, almost all electric fluxes are concentrated on the channel side, and the charge density σ on the channel side when calculating by upper arc length LT and lower arc length LB of the sector (structure to accurately cut the doughnut from the center at the predetermined angle) is shown by the equation shown in FIG. 4A to FIG. 4C.

Figure 4D:
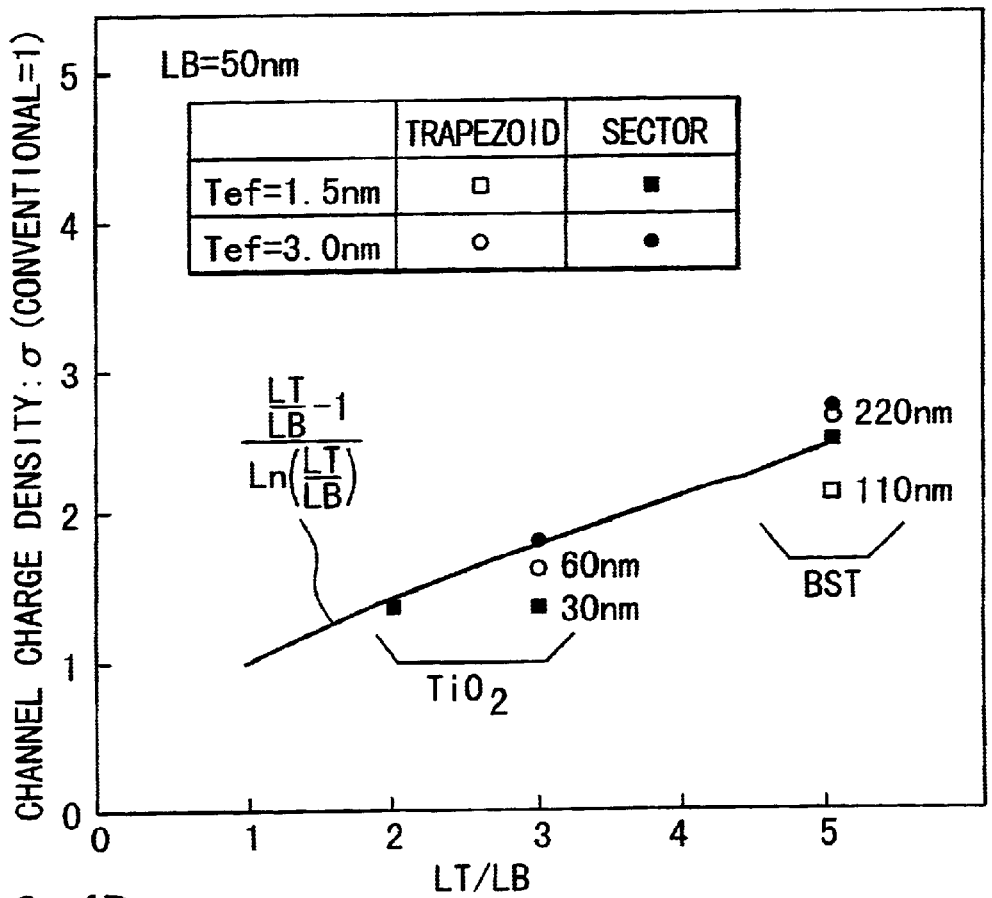

The relationship of the channel charge density when LT/LB ratio and a conventional transistor are assumed to be one is shown in FIG. 4D. The solid line shows the theoretical formula of the above-mentioned σ, and a white circle, a black circle, a white square, and black square indicate the case where the transistor structure is input by the device simulator and σ is calculated. It is understood that theoretical formula and the simulation result are almost corresponding from this FIG. 4D. Here, LB=50 nm is assumed, when conversion of thickness of oxide film is 3 nm and 1.5 nm, it is shown that conventional transistor is compared with a trapezoid transistor and sectorial transistor in $TiO_2$ of relative permittivity 80 and the BST film of relative permittivity 300. Thereafter, for convenience' sake, a trapezoid whose the upper side is longer than the lower side is abbreviated as a trapezoid, and a structure to cut the doughnut from the center at the predetermined angle is abbreviated as a sector.

As apparently from the figure, it is understood that the sector almost agrees to the theoretical value, and the larger the LT/LB ratio, the channel charge density becomes large, improves drivability of the transistor, and is expected the improvement of the short channel effect suppression and S factor etc. The channel charge density of the transistor becomes twice or more by LT/LB>3 or more, and in a thickness constant of gate insulation film, the improvement of a great drivability can be achieved suppressing the gate leakage current. In a trapezoid transistor, the value of {(insulation film thickness of gate insulation film of the transistor)÷LB} is large in the material such as BST having the large permittivity, and first the transistor with a large LT/LB ratio is achieved easily. Second, in constant LT/LB ratio, since a gate electrode-channel distance is not long too much at an edge of the gate electrode comparing with the center, it can be read that there are not so many differences of the effect with the sector, and an advantage is large because of approaching a sectorial theoretical value from this figure.

Figure 5A:
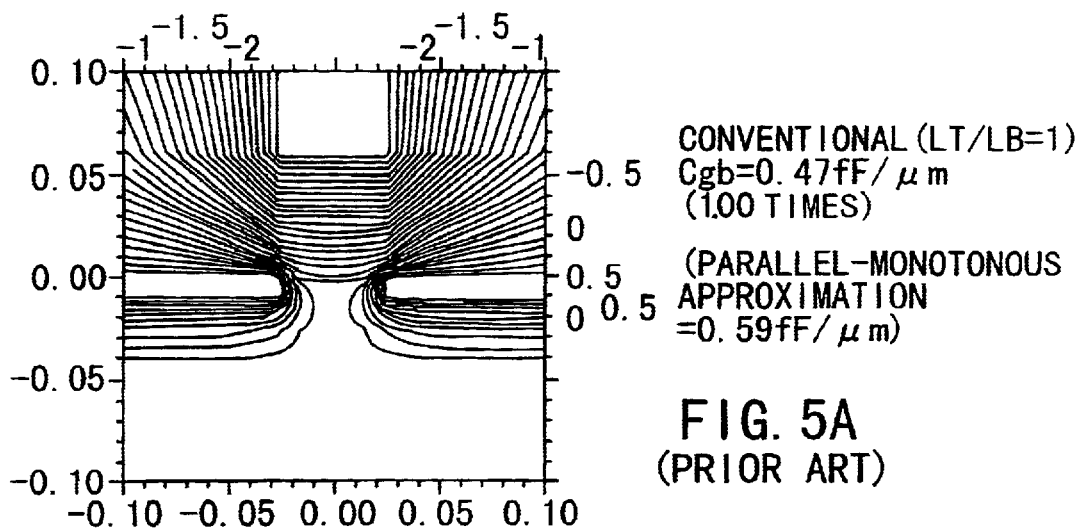
FIG. 5A to FIG. 5C are equipotential line charts of the nMOS transistor when applying the Vg=−3 voltage.
Figure 5B:
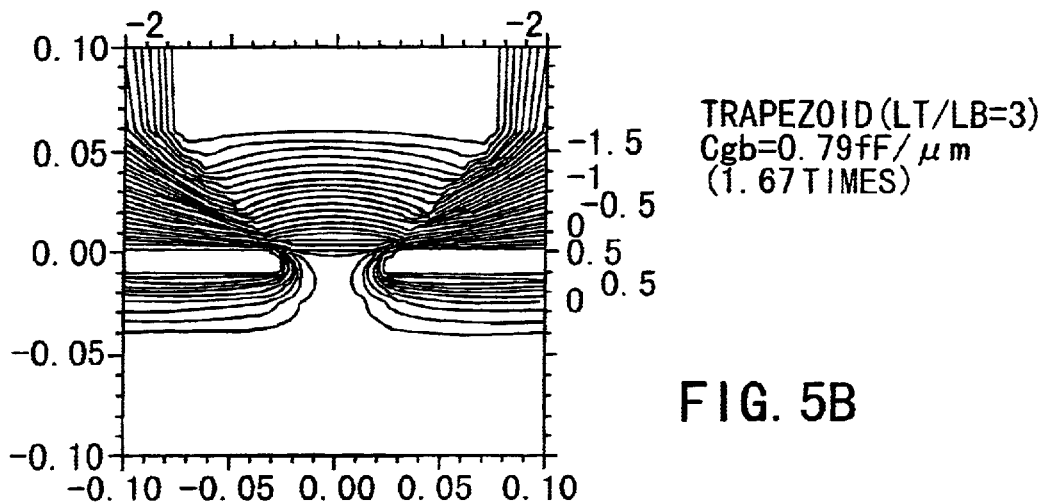
Figure 5C:
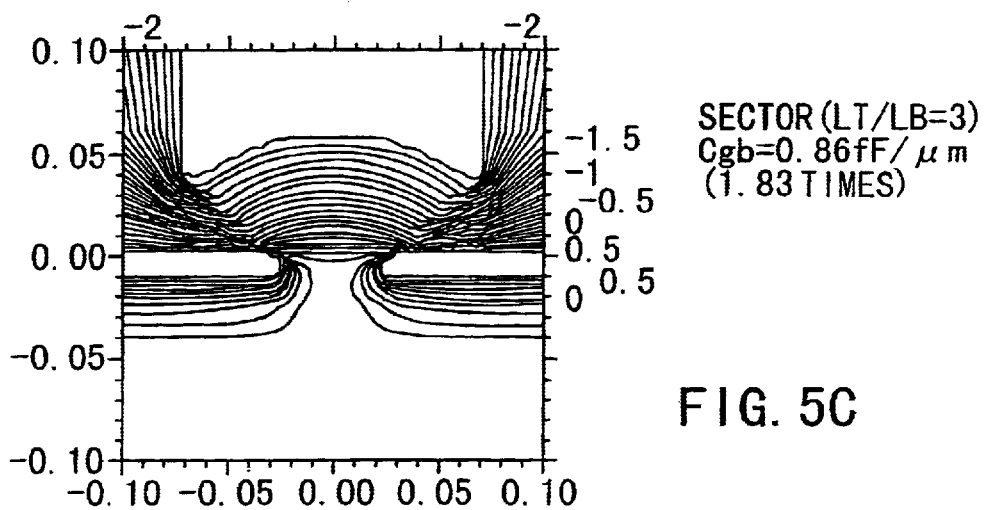

FIG. 5A to FIG. 5C show the equipotential line chart simulated by the device simulator of the nMOS transistor when applying Vg=−3V voltage which shows the effect of the present invention. FIG. 5A is a conventional transistor, and FIG. 5B and FIG. 5C show a trapezoid transistor and a sectorial transistor of the present invention. In a conventional transistor, the equipotential line chart directs toward lower portion and extends with even, and the electric flux is distributed right and left, the equal potential line interval (=electric field) extends, and the electric flux density has dropped oppositely in the vicinity of the channel side.

On the other hand, in a trapezoid transistor of the first embodiment, it is understood that the direction normal to an equipotential line, that is, a direction of the electric flux is directed to the direction of the center of the channel with directing from under the gate electrode to the channel side, and the electric flux is concentrated. In addition, in a sectorial transistor of the second embodiment, it is understood that the direction of the electric flux directs from under the gate electrode to the center of the channel side, the electric flux is concentrated efficiently, and the electric flux density is higher on the channel side.

Though the electric field in the insulation film of both sides of the gate insulation film of relative permittivity=4 is larger compared with the gate insulation film of relative permittivity=80, it can be seen it is large in the gate insulation film in electric flux density ($\in \times E$). Moreover, the interval between equipotential line of the gate insulation film being wider than compared with the insulation film on the side means that the potential of the gate is transmitted to the vicinity of the channel side without attenuation in the gate insulation film of the potential of the gate, and the controllability at the gate is high, that is, the gate drivability improved. Under the condition of Vg=−3V, the channel of the nMOS transistor is in the state of accumulation., and capacity (Cgb) between the gate electrode and the channel (=substrate) can be calculated. This value is indicated at the right of FIG. 5A to FIG. 5C. It is able to be confirmed that the gate substrate capacity is increased only by 1.67 times in the trapezoid and 1.83 times in the sector compared with conventional ones.

Figure 6A:
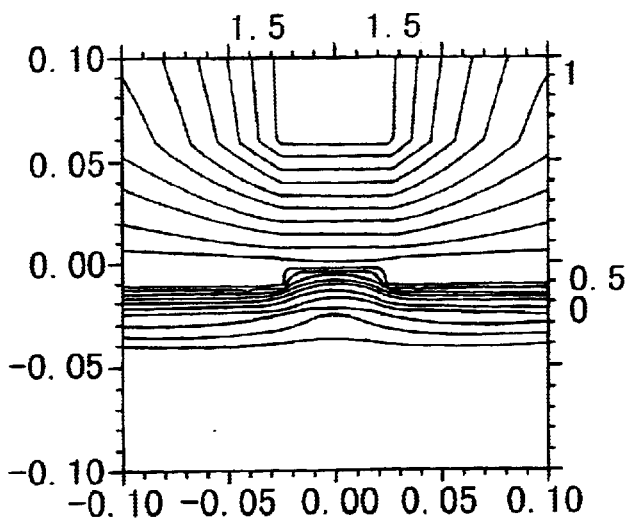
FIG. 6A to FIG. 6C is are equipotential line charts of the nMOS transistor when applying the Vg=1 voltage.
Figure 6B:
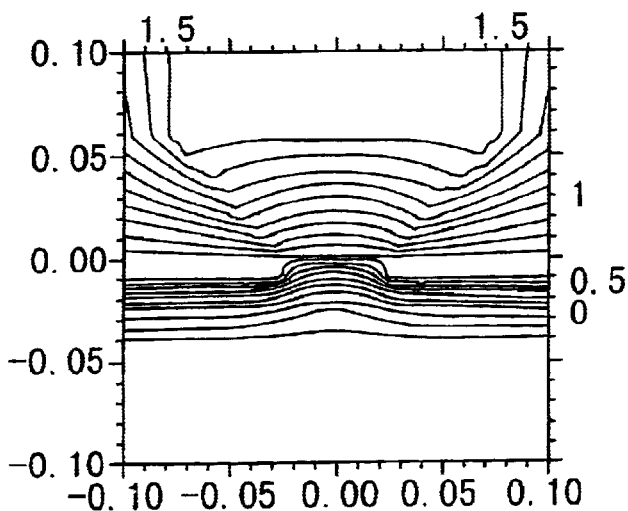
Figure 6C:
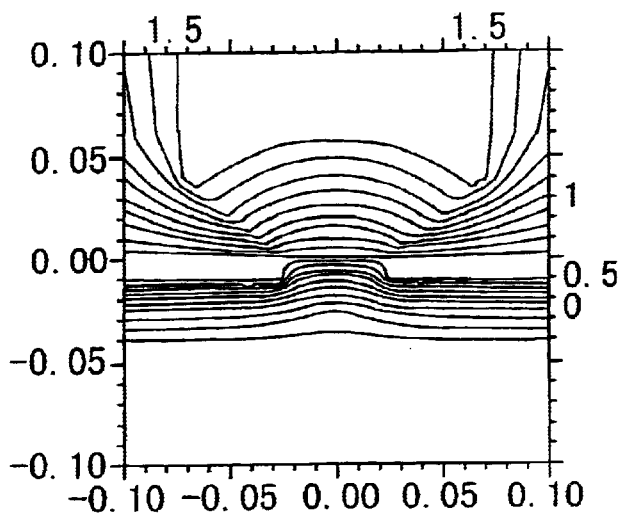

FIG. 6A to FIG. 6C show the equipotential line chart which is simulated with the device simulator of the nMOS transistor when applying the voltage of Vg=1V which shows the effect of the present invention. FIG. 6A is a conventional transistor, and FIG. 6B and FIG. 6C show a trapezoid transistor and a sectorial transistor of the present invention. This condition indicates the state in which the transistor is turned on and the inversion layer is formed. In this example, it is understood that the direction of the electric flux directs to the center of the channel side, and the electric flux concentration is occurred in a trapezoid transistor of the first embodiment and a sectorial transistor of the second embodiment.

Figure 7A:
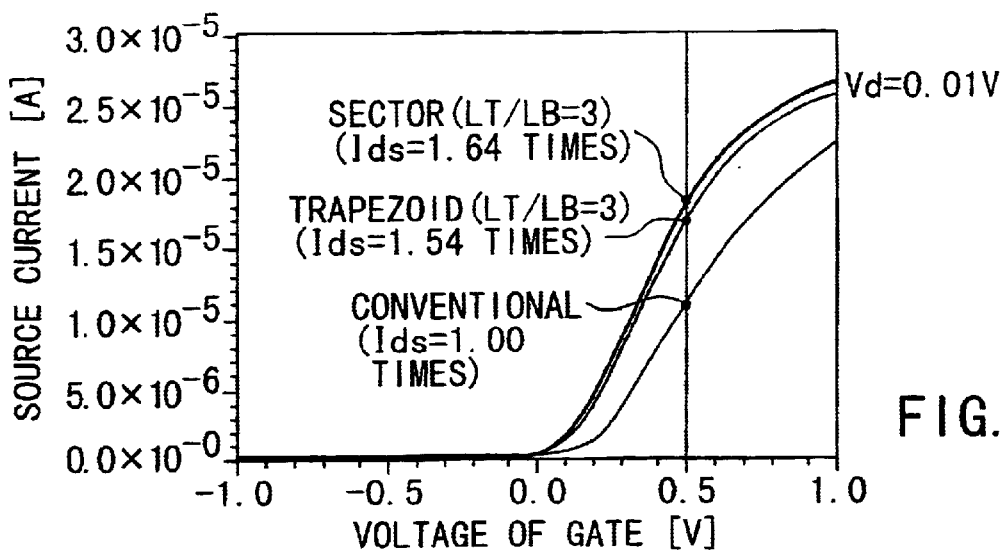
FIG. 7A to FIG. 7C are figures which show the comparison of actual driving currents of the transistor.
Figure 7B:
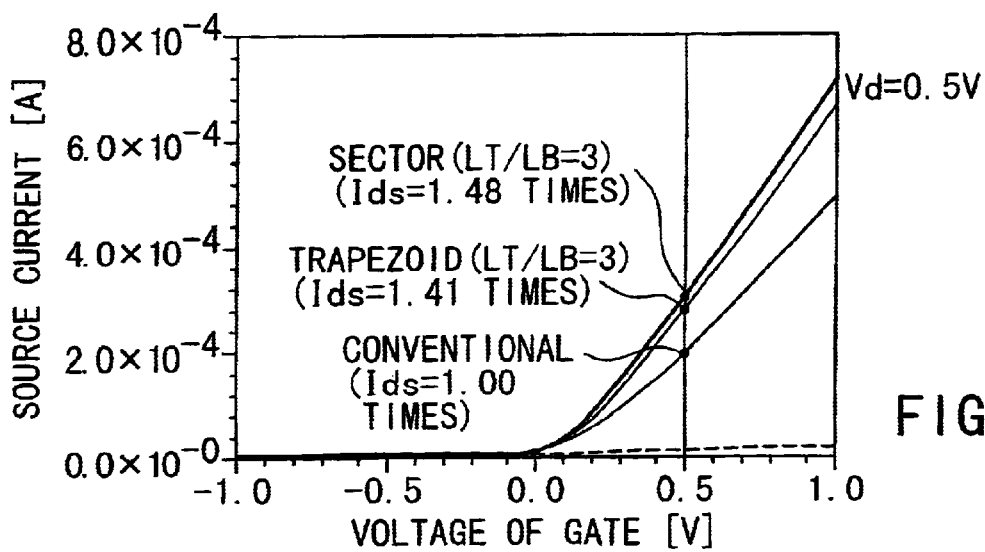
Figure 7C:
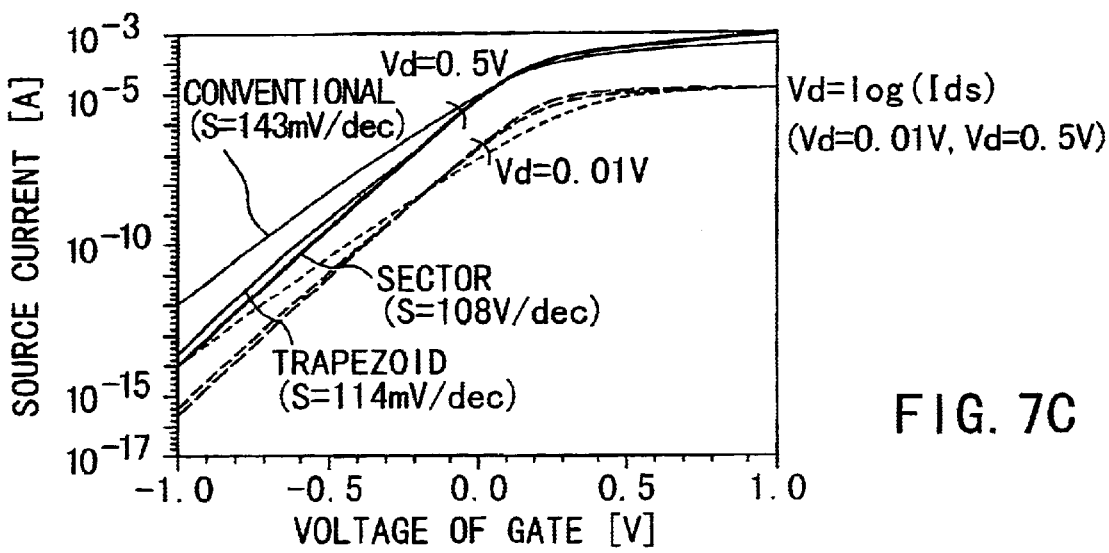

FIG. 7A to FIG. 7C show figures which show the comparison of driving currents of an actual transistor to show the effect of the present invention. FIG. 7A to FIG. 7C show examples of a conventional transistor, a trapezoid transistor of LT/LB=3 of the present invention and a sectorial transistor of LT/LB=3. FIG. 7A to FIG. 7C are examples of the gate insulation film which uses $TiO_2$ of relative permittivity=80 of conversion of the thickness of the oxide film=3 nm. It is the same as the case from FIG. 5A to FIG. 6C.

FIG. 7A shows Vgs–Ids characteristic when operating the triode in Vd=0.01V, and FIG. 7B shows Vgs–Ids characteristic when operating the pentode in Vd=0.5V, and FIG. 7C shows that the cutoff characteristic at the Vd=0.01V and 0.5V. As understood from FIG. 7A and FIG. 7B, obviously in the present invention, it is understood that driving current of the transistor increases to 1.41 times to 1.64 times, and especially the sector has large driving current of the transistor, though a gate insulation film thickness is constant and channel length is constant.

Moreover, as understood from FIG. 7C, adding to the above-mentioned effect, the controllability of the potential of the channel of the gate voltage increases because of the increase of the capacity of the gate, S factor decreases greatly from conventional 143 mV/dec to 114 mV/dec (trapezoid) and 108 mV/dec (sector) of the present invention, and the cutoff characteristic is improved. In addition, since an amount of the lowering of the threshold voltage when Vd is raised 0.01V to 0.5V is greatly decreased, it is understood that the short channel effect such as large decreases of DIBL is suppressed.

The suppression of this short channel effect means amount of suppressed channel length can be reduced.

When the channel length is usually, $$L<0.4\{Xj \times Tox(Ws+Wd)^2\}^{1/3}$$

the short channel effect starts to become remarkable. Therefore, the channel length L, in which Tox virtually decreases, can be reduced. From the result of FIG. 5A to FIG. 5C, in LT/LB=3, since it is equivalent to the case for Tox to be decreased to 1/1.83, from the above equation of a short channel, $$L\min(\text{at } LT/LB=3)=0.4\{Xj \times (Tox/1.83),(Ws+Wd)^2\}^{1/3}=L\min \times 0.8$$

In addition, the channel length can be decreased only by 20 percent. This means 1.48/0.8=1.85 times improvement of transistor drivability can be achieved in the sector of FIG. 7B.

(Third Embodiment)

Figure 8A:
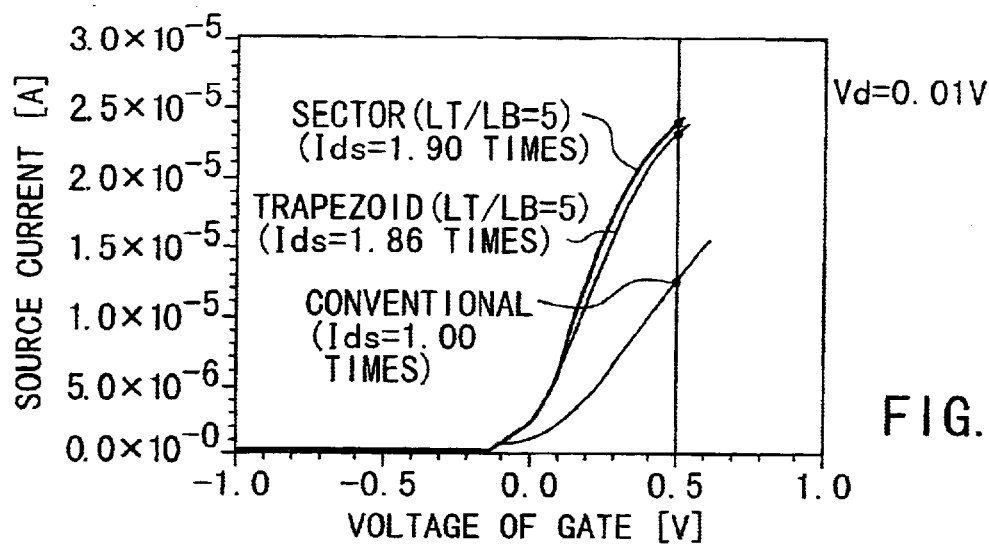
FIG. 8A to FIG. 8C is used to explain the MOS transistor according to the third embodiment, and are figures which show the comparison of actual driving currents of the transistor when using the BST film.
Figure 8B:
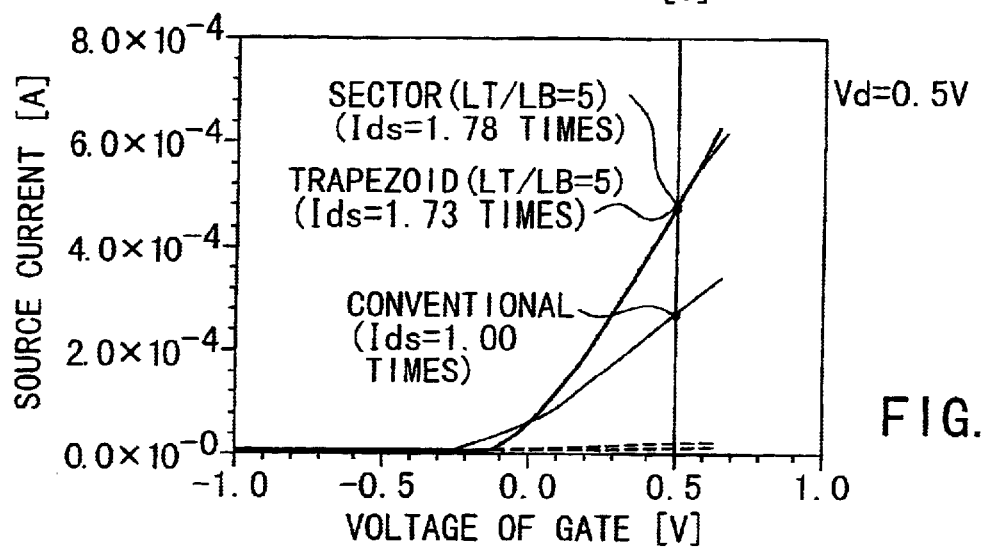
Figure 8C:
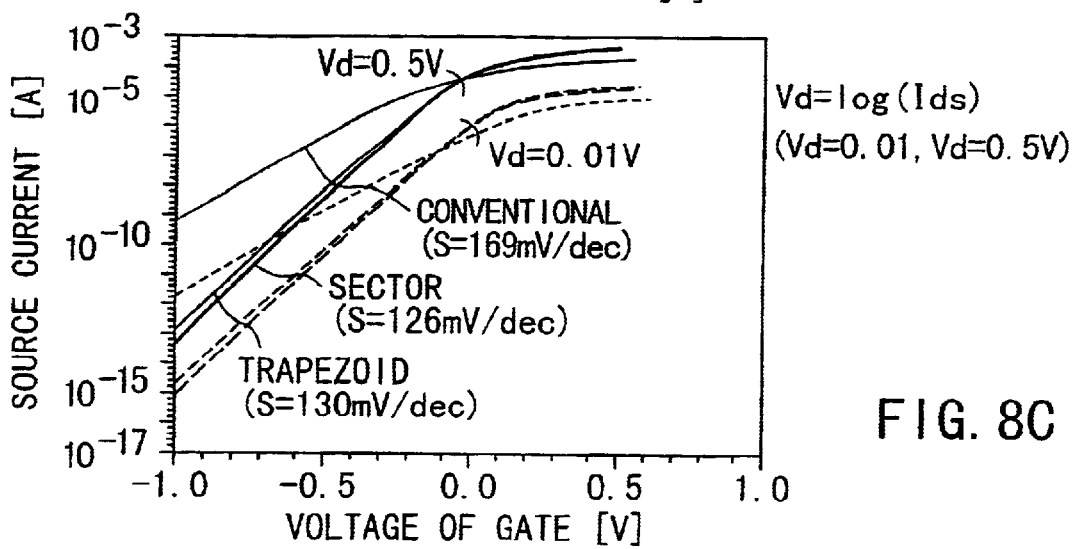

FIG. 8A to FIG. 8C are figures to explain the third embodiment of the present invention, and are figures which show the comparison of driving currents of an actual transistor when the BST film is used. For example, when the BST film of relative permittivity=300 is used, the gate insulation film of conversion of the thickness of the oxide film 3 nm becomes effective film thickness 220 nm, and aspect ratio becomes 220/50=4.4 in the L=50 nm generation. In this longer structure than wide, the upper channel length can be enlarged compared with a lower channel length of the above-mentioned definition.

FIG. 8A to FIG. 8C show examples of a conventional transistor, a trapezoid transistor of LT/LB=5 of the present invention and a sectorial transistor of LT/LB=5. FIG. 8A shows Vgs–Ids characteristic when operating the triode in Vd=0.01V, and FIG. 8B shows Vgs–Ids characteristic when operating the pentode in Vd=0.5V, and FIG. 8C shows that the cutoff characteristic at the Vd=0.01V and 0.5V. As understood from FIG. 8A and FIG. 8B, obviously in the present invention, it is understood that driving current of the transistor increases more than the example of FIG. 7A to 7C such as 1.73 times to 1.90 times, and especially the sector has large driving current of the transistor though a gate insulation film thickness is constant, and channel length is constant.

Moreover, as understood from FIG. 8C, adding to the above-mentioned effect, the controllability of the potential of the channel of the gate voltage increases because of the increase of the capacity of the gate, S factor decreases greatly from conventional 169 mV/dec to 130 mV/dec (trapezoid) and 126 mV/dec (sector) of the present invention, and the cutoff characteristic is improved. In addition, since an amount of the lowering of the threshold voltage when Vd is raised 0.01V to 0.5V is greatly decreased, it is understood that the short channel effect such as large decreases of DIBL is suppressed. The suppression of this short channel effect means amount of suppressed channel length can be reduced.

FIG. 9A to FIG. 9E are figures which shows electric field strength in the gate insulation film part to explain the advantage of the embodiment. In FIG. 9A to FIG. 9E, the electric field between gate electrode and channel at a center of the channel, and the electric field between gate electrode and channel at the channel edge to each of a conventional transistor, a trapezoid, and a sectorial transistor at Vg=−1V and 3V are shown. (a-1) is Vg=−3V and distance from the center of the gate x=0 nm, and (a-2) is Vg=−3V and x=20 nm, and (b-1) is Vg=1V and x=0 nm, and (b-2) is Vg=1V and x=20 nm.

Though, in a conventional transistor, the electric field lowers from the gate electrode by distributing the electric flux toward the channel side and drivability lowers, according to this embodiment, the electric field becomes strong more than conventional ones by directing it to the channel side, and the electric field becomes weak oppositely on the gate electrode side. Therefore, according to this embodiment, There is no deterioration in the electric field at the channel edge, and the electric field is concentrated oppositely.

Figure 10A:
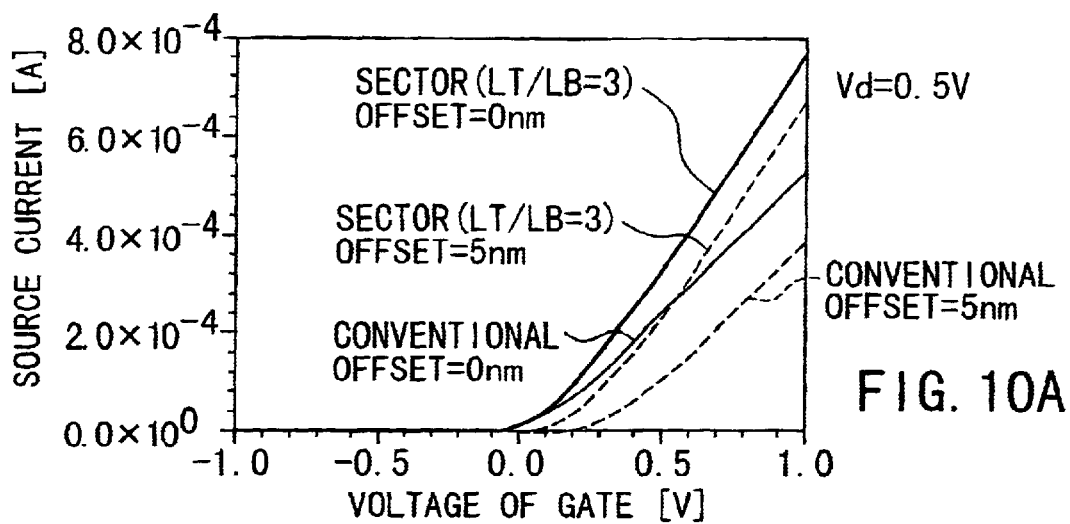
FIG. 10A to FIG. 10C are figures which show the Vg–Ids characteristic when the offset is added between the gate insulation film and the source-drain.
Figure 10B:
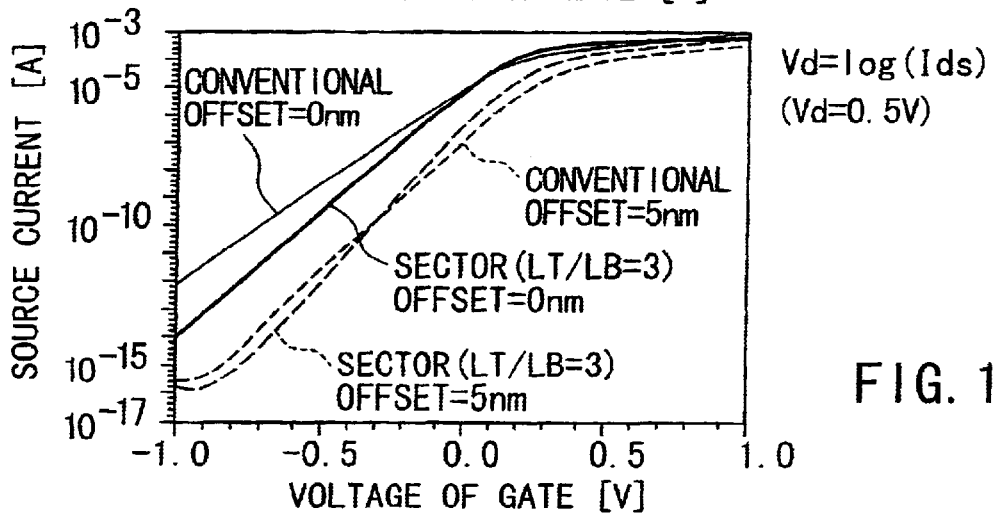
Figure 10C:
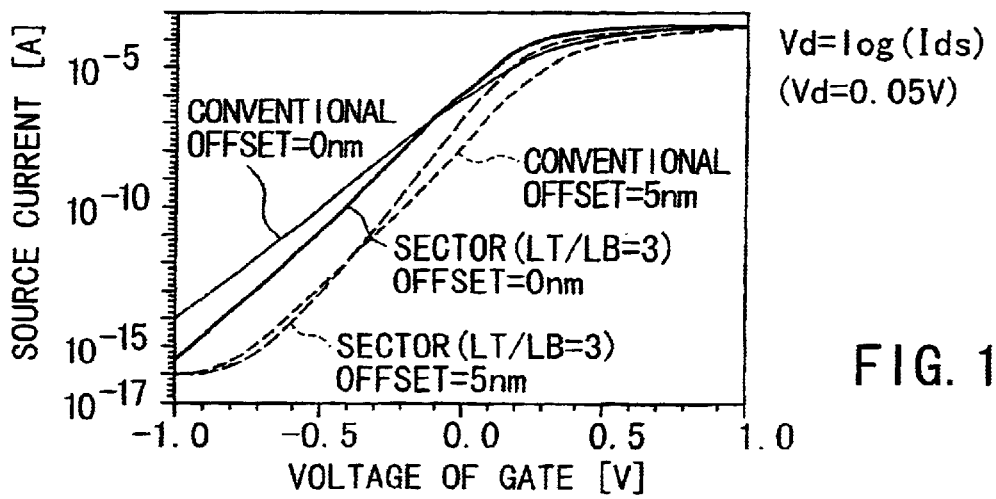

FIG. 10A to FIG. 10C are figures which show the Vg–Ids characteristic when the offset is added between the gate insulation film and the source-drain to explain the advantage of the embodiment. In this embodiment compared with conventional ones, it is understood that the threshold change by the offset change is small. It seems that it is a cause that a near electric field where gate insulation film and source-drain of FIG. 9A to FIG. 9E are adjacent is strong. According to this embodiment like this, it is meant for the manufacturing difference of the offset difference etc. to obtain a steady transistor characteristic.

(Fourth Embodiment)

Figure 11A:
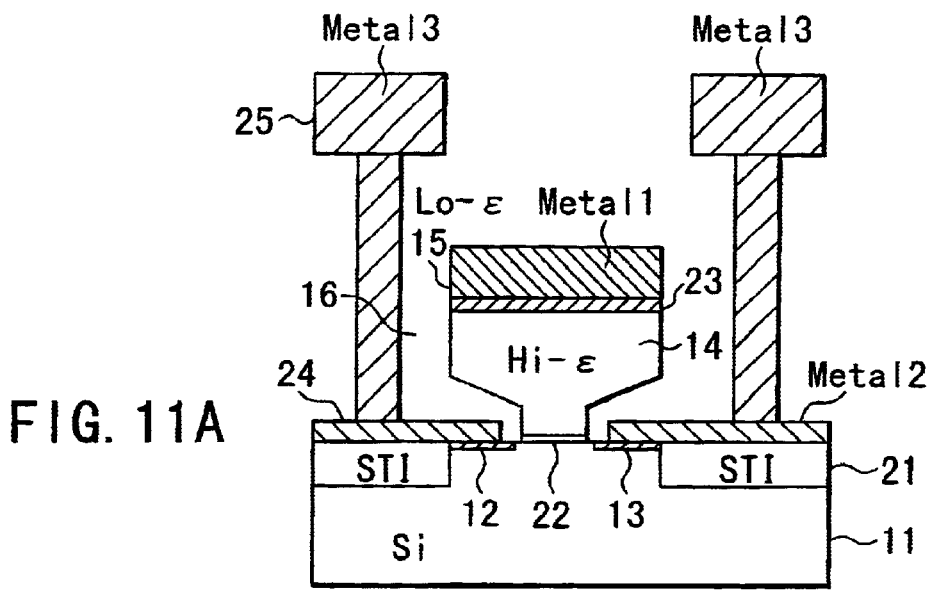
FIG. 11A to FIG. 11C are a plan view and a sectional view which show the element structure of the MOS transistor according to the fourth embodiment.
Figure 11B:
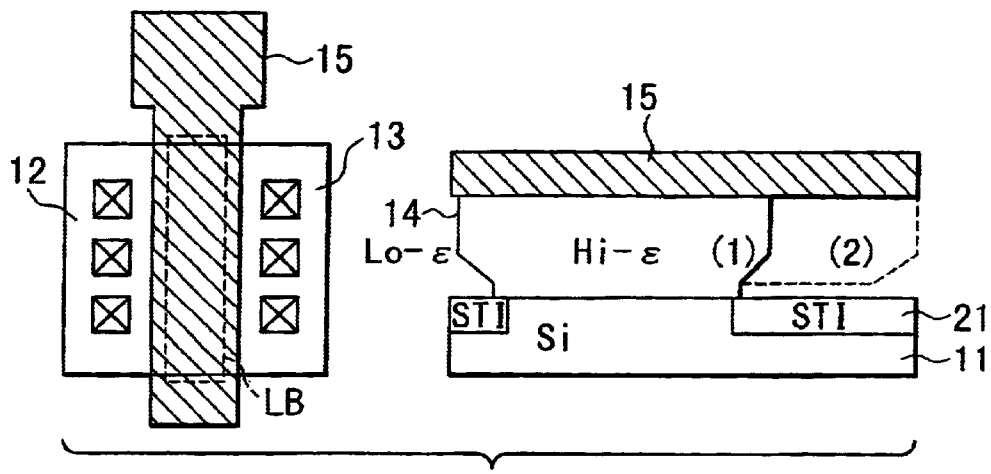
Figure 11C:
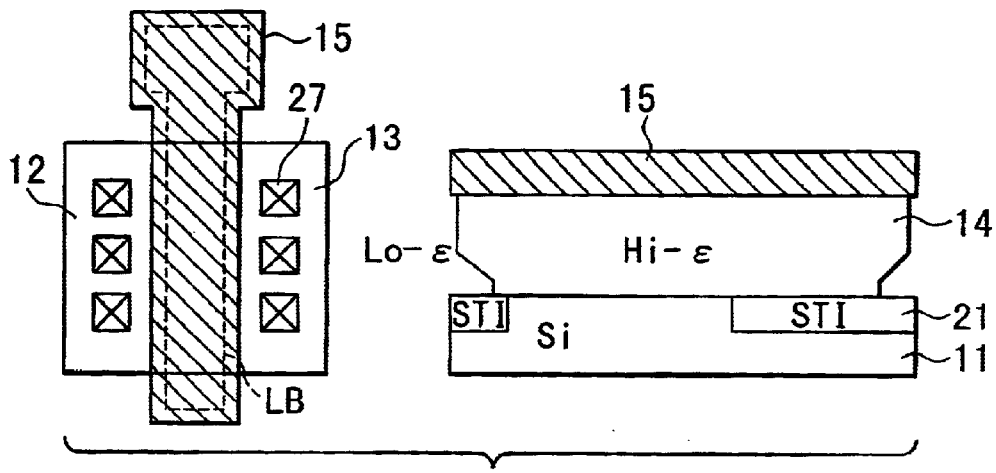

FIG. 11A to FIG. 11C are a plan view and a sectional view which show the element structure of the MOS transistor according to the fourth embodiment.

FIG. 11A shows the sectional view cutting along the source-drain of the transistor. STI (Shallow Trench Isolation) 21 of the element isolation is formed on both sides of source 12, channel, drain 13, and the source-drain on Si substrate 11, metal layer 24 (Metal2) is formed to decrease the source-drain resistance, and buffer film 22 such as thin $SiO_2$ on the channel and gate insulation film 14 of the relative permittivity of 20 or more thereon is formed are formed in a reverse-convex type. Specifically, to decrease the capacity between gate and source-drain with increasing the capacity of the gate even a little by the reverse-convex, the place where gate insulation film 14 becomes narrow is diagonally thinned.

Both sides of gate insulation film 14 (not shown in the figure) are covered with sidewall insulation film 16 such as SiN having the permittivity of 20 or less, and the insulation film such as $SiO_2$ at the outside thereof. Gate electrode 15 (Metal1) is formed on gate insulation film 14 with the self-alignment to gate insulation film 14 through barrier metal 23. Metal2 of the source-drain is connected with other circuits through metal layer 2 (Metal3).

FIG. 11B shows the plan view and the sectional view along the direction of the channel width of this embodiment. High permittivity gate insulation film 14 (Hi-∈) is formed in such a manner that a narrow part under the reverse-convex is formed only on the channel part of the transistor, and a wide part is formed by the part where the offset is increased to the channel length and the channel width as shown in (1) in FIG. 11B. Moreover, as shown in (2) of FIG. 11B, the wide part may be formed the same as the gate electrode 15 or self-aligned. In FIG. 11C, both the upper part and the lower part of gate insulation film 14 are formed according to the gate wiring. That is, gate insulation film 14 of the high dielectric material is extended also in the extended part of contact of gate electrode 15. It is understood that parasitic capacity of gate electrode 15 does not increase too much if lower part of the extended part is formed with STI in this case. Reference numeral 27 in FIG. 11C is contact of the source-drain.

Figure 12A:
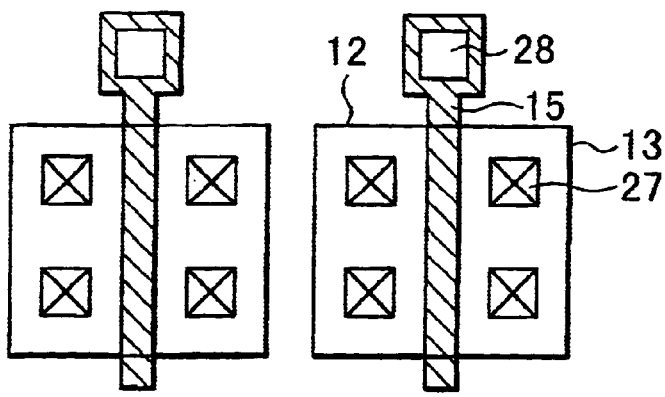
FIG. 12A to FIG. 12C are figures which show arrangement of the layout of the transistor.
Figure 12B:
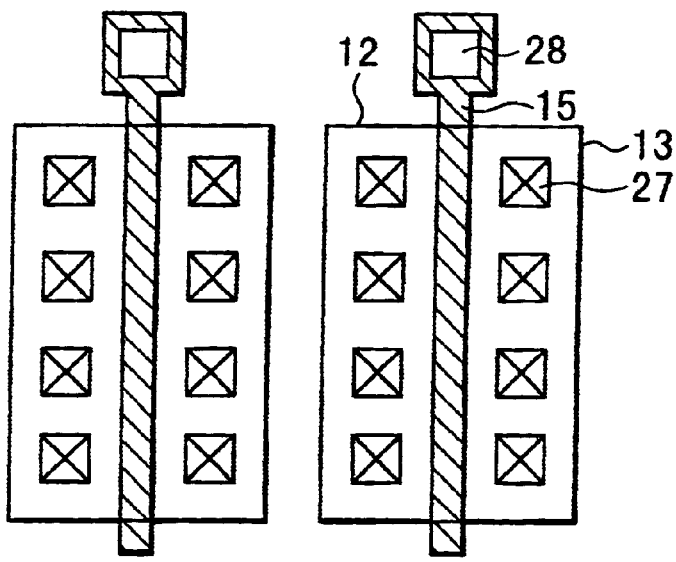
Figure 12C:
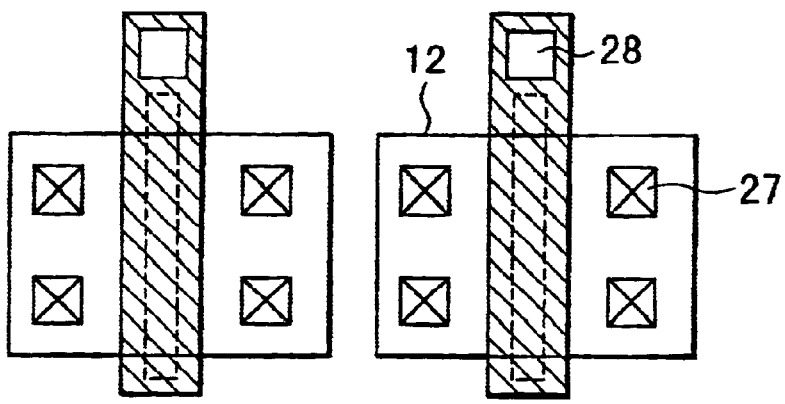

FIG. 12A to FIG. 12C are layout of the conventional art and the embodiment transistor to explain the advantage of the embodiment.

In this embodiment, when the transistor of LB=50 nm, oxide film conversion insulation film thickness 3 nm, and LT/LB=3 is achieved by using high permittivity materials of relative permittivity=80 as a gate insulation film, as shown in FIG. 7A to FIG. 7C, the drivability of the pentode of the transistor increases by a factor of 1.64, and in addition, the drivability increases by a factor of 1.85 when corresponding length to short channel effect suppression L is thinned. FIG. 12A shows a conventional transistor of channel width W=1, FIG. 12B shows a conventional transistor of channel width W=1.8, and FIG. 12C shows the transistor when LT is enlarged such as sectorial, trapezoid, and reverse-convex-shaped, etc,.

In the transistor of this embodiment, not only channel part, but also source 12, drain 13, element isolation, and gate contacting region 28 can be widened, when LT of three conventional times to raise the gate drivability as shown in FIG. 12C, the layout area does not increase too much. On the other hand, when the channel width is assumed to be 1.8 as shown in FIG. 12B to obtain a similar effect to FIG. 12C, the area of the entire transistor becomes large. Moreover, when the channel width is large, as for this comparison, it is understood that the ratio of gate contacting region 28 decreases and there is a further advantage.

(Fifth Embodiment)

Figure 13:
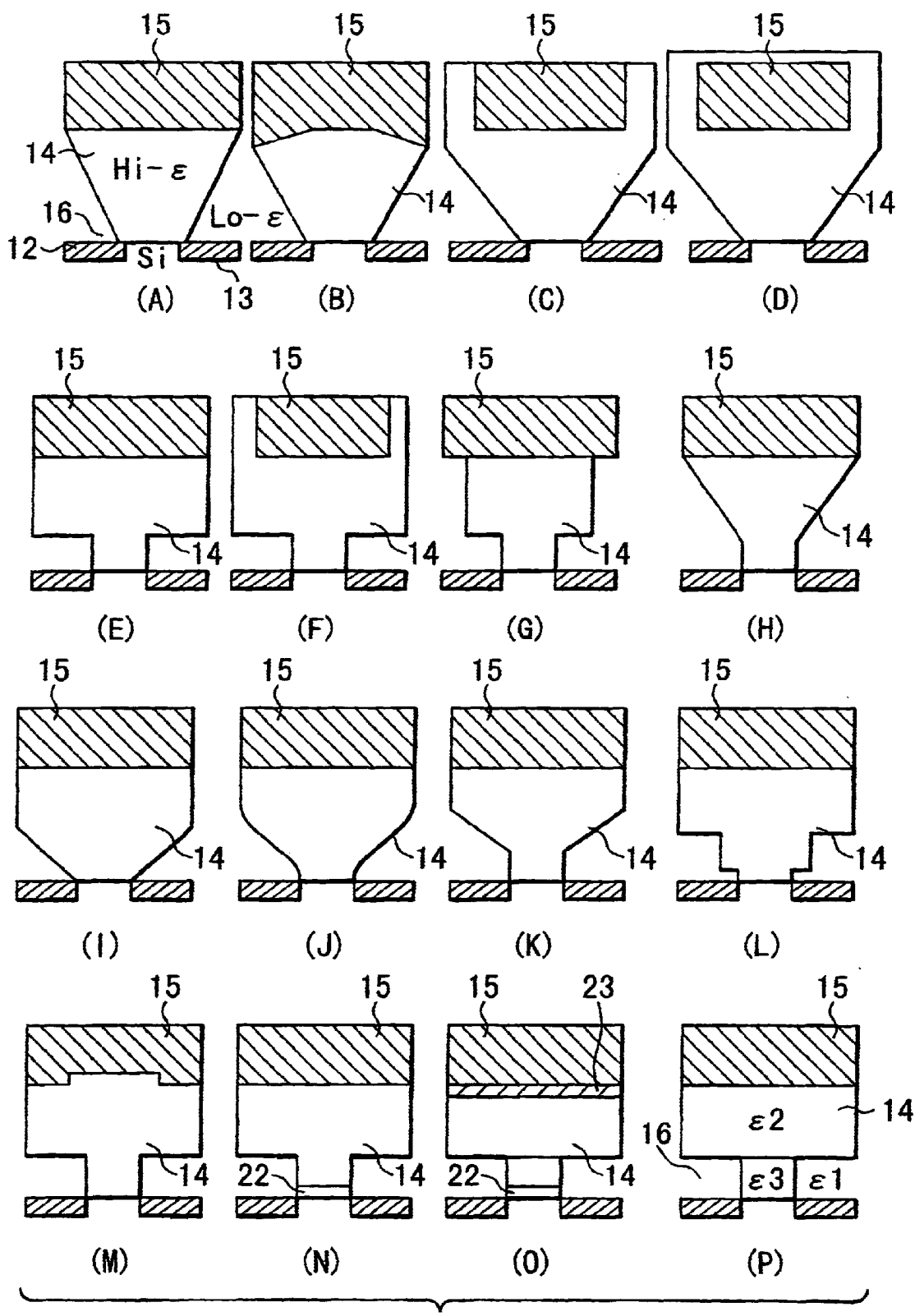
FIG. 13 is sectional view which shows the element structure of the MOS transistor according to the fifth embodiment.

FIG. 13 shows sectional view which show the element structure of the MOS transistor according to the fifth embodiment.

(A) of FIG. 13 indicates the case where gate insulation film 14 is formed with the trapezoid whose upper side is longer than the base side and is equivalent to the first embodiment (FIG. 3B), and the effect thereof is also similar to the first embodiment. (B) of FIG. 13 is a sectorial transistor of the above-mentioned definition, it is equivalent to the second embodiment (FIG. 4C), and the effect is also similar to the second embodiment. (C) of FIG. 13 indicates the case to cover a right and left side of gate electrode 15 with high dielectric gate insulation film 14, and has the effect that the electric flux by the charge generated on the surface of the side of gate electrode 15 is prevented from leaking around the source-drain etc. and can be directed to the gate channel side, and the electric flux density on the channel side is raised, and the effect that the parasitic capacity between gate source-drain is decreased. (D) of FIG. 13 further extends the idea of (C) of FIG. 13, shows that the upper portion of gate electrode 15 is covered with high dielectric gate insulation film 14, and also has the effect that the electric flux generated from the upper portion of gate electrode 15 can be directed to the channel side though it leaks considerably.

(E) of FIG. 13 shows the example of reverse-convex-shaped high dielectric gate insulation film 14, that is, the example which uses the upper portion gate insulation film with wide area and the lower gate insulation film with narrow area. The lower the ratio of the lower gate insulation film thickness with narrow area to the upper portion gate insulation film thickness with wide area is, the effect of increasing the capacity of the gate. (F) of FIG. 13 has the effect in which (C) of FIG. 13 and (E) of FIG. 13 are combined. (G) of FIG. 13 indicates the case where the area of gate electrode 15 is large (long in this cross-section) compared with the upper portion area of high dielectric gate insulation film 14. Thus, the upper channel length of high dielectric gate insulation film 14 and the length of gate electrode 15 can change freely, and may be the same length by the self-alignment. (H) of FIG. 13 indicates the case where high dielectric gate insulation film 14 is formed with the watering pot type.

(I) of FIG. 13 indicates a case which the upper portion of high dielectric gate insulation film 14 is a cube, and the lower portion thereof is the trapezoid narrowing width by the predetermined inclination. (J) of FIG. 13 is transformation of (I) of FIG. 13 and indicates a case where the upper portion of high dielectric gate insulation film 14 is a cube and the lower side is a shape giving roundness gradually and narrowing width. (K) of FIG. 13 shows a similar structure to FIG. 11A. (L) of FIG. 13 is a method of decreasing the area (shortening length) in the quantum toward the channel side by separating high dielectric gate insulation film 14 to the some steps. The number of stages are not shown and may be any number of steps.

(M) of FIG. 13 indicates the case where a lower position of gate electrode 15 (That is, upper portion positional of high dielectric gate insulation film 14) is brought close to the Si side while directing from the center of the channel to the edge in the quantum. Since a sectorial transistor has more advantageous than a trapezoid transistor, as a result, the distance from gate electrode 15 of the channel edge to the channel are prevented being become distant, and the efficiency of an increase in the capacity of the gate is raised. Though it is comparatively difficult for the sector like (B) of FIG. 13 to form the roundness of the upper portion of high dielectric gate insulation film 14, it can be easily achieved by the scheme like (M) of FIG. 13. (N) of FIG. 13 indicates the case where buffer film 22 is formed between the Si interface and high dielectric gate insulation film, and there is an effect in which lattice constant mismatching and the high dielectric material of diffusion to Si are prevented.

(O) of FIG. 13 indicates the case to form barrier metal 23 between high dielectric gate insulation film 14 and gate electrode 15. (P) of FIG. 13 indicates the case to enlarge relative permittivity ∈2 of the upper portion material of high dielectric gate insulation film 14 more than permittivity ∈1 of insulation film 16 on the gate insulation film side, and to enlarge relative permittivity ∈3 of a lower portion material of high dielectric gate insulation film 14 in addition relative permittivity ∈2 of the upper portion material of high dielectric gate insulation film 14. The capacity lowering in the lower portion where the area becomes small can be supplemented with raising the permittivity.

As described above, though the plurality of examples are shown in FIG. 13, these are not only alone all, and it is easy to use combining them, and though there is a change in capacity of the gate and parasitic capacity, all advantages from FIG. 3A to FIG. 12C can be applied.

(Sixth Embodiment)

Figure 14:
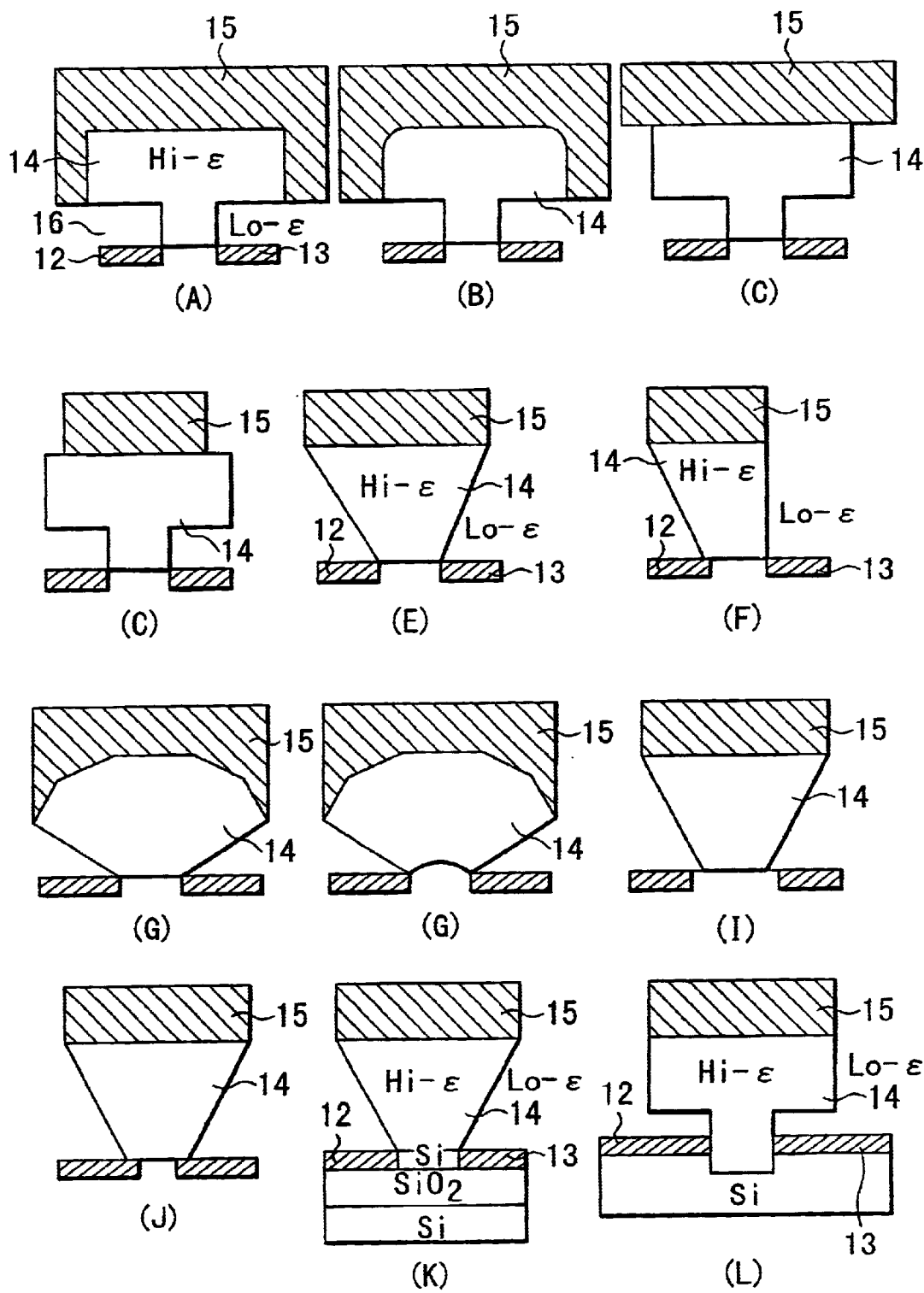
FIG. 14 is sectional view which shows the element structure of the MOS transistor according to the sixth embodiment.

FIG. 14 shows sectional views which show the element structure of the MOS transistor according to the sixth embodiment of the present invention.

(A) of FIG. 14 indicates the case where even the sidewall in the part where the area of a reverse-convex-shaped upper portion of high dielectric gate insulation film 14 is wide is covered with gate electrode 15 in addition to (E) of FIG. 13. Here, if the distance from lowest side of the gate electrode to the channel section is larger than the high dielectric gate insulation film thickness of the center of the channel, the disadvantage of a leakage increase can be prevented. (B) of FIG. 14 indicates the case where (A) of FIG. 14 is improved, and has an advantage in which roundness is given to the upper portion of high dielectric gate insulation film 14, the distance between gate electrode 15 and the channel is kept minimum and constant, and the capacity of the gate is maximized. (C) of FIG. 14 is similar to (G) of FIG. 13, but the offset between right and left gate electrode 15 and high dielectric gate insulation film 14 is different. (D) of FIG. 14 is opposite to (G) of FIG. 13, and example of shortening the length of gate electrode 15 more than the upper portion length of high dielectric gate insulation film 14. Even in this case, there is an effect of capacity increase compared with conventional ones.

(E) of FIG. 14 indicates the case to enlarge the amount of the overflow of high dielectric gate insulation film 14 on the source 12 sides more than the amount of the overflow of high dielectric gate insulation film 14 on the drain 13 sides. (F) of FIG. 14 indicates the case where the source 12 sides perform the overflow of high dielectric gate insulation film 14 like the present invention, and high dielectric gate insulation film 14 on the drain 13 sides is made like the conventional art.

Usually, when the gate voltage is raised from Vss to Vdd and the transistor is turned on at the logical circuit configuration, since the drain side may fall from Vdd to Vss while the source side remains Vss, even if the capacity between gate electrode-drain is the same as the capacity between gate electrode-source, since the voltage change applied to the capacity between gate electrode-drain becomes twice the voltage change applied to the capacity between gate electrode-source, such as from −Vdd to Vdd, there is a disadvantage in the real operation. In the embodiment of (E) and (F) of FIG. 14, this disadvantage is considered the capacity of the gate is increased as much as possible, and the overflow of high dielectric gate insulation film 14 into the drain side where capacity on the appearance in the real operation is large is decreased or is removed, thereby a more efficient transistor is achieved.

(G) of FIG. 14 indicates the case where the inclination of the part which contacts with gate electrode 15 of the upper portion of high dielectric gate insulation film 14 in the sector of the above-mentioned definition is enlarged gradually in some steps toward the edge, and the effect can be made the maximum by this configuration. (H) of FIG. 14 indicates that the part which contacts with the channel of high dielectric gate insulation film 14 is an arc, too, and has a structure cut at the predetermined angle with the line passing center of high dielectric gate insulation film 14 of a complete doughnut type. In this structure, there is an effect in which the electric field applied to the channel section can be made uniform.

(I) of FIG. 14 is an example of shortening lower channel length (LB) of high dielectric gate insulation film 14 than the channel. (J) of FIG. 14 is an example of lengthening lower channel length (LB) of high dielectric gate insulation film 14 than the channel, conversely. (K) of FIG. 14 shows the case where the transistor of this embodiment is formed with SOI. (L) of FIG. 14 indicates the case where the transistor of this embodiment is formed with concave type in which the channel is formed in the trench.

As described above, though the plurality of embodiments are shown in FIG. 14, these are not only alone all, but also it is easy to use by combining with including FIG. 13, and though there is a change in capacity of the gate and parasitic capacity, all advantages from FIG. 3A to FIG. 12C can be applied. Moreover, as shown in FIG. 14, it is easy to combine conventional proposed various transistors with the structure of this embodiment.

(Seventh Embodiment)

FIG. 15A to FIG. 15F are sectional views which show the element structure of the MOS transistor according to the seventh embodiment of the present invention.

FIG. 15A indicates the case to use the material with anisotropy, in which the permittivity is different in the direction of the source-drain and in the direction gate electrode-channel as high dielectric gate insulation film 14. When permittivity ∈2 in the direction of the source-drain is made a structure which is larger than permittivity ∈1 of gate electrode-channel, in the transistor of this reverse-convex-shaped embodiment, even if the upper portion with wide area of high dielectric gate insulation film 14 is extended to the source-drain side, since the permittivity on the source-drain side is large, the distance in the conversion of the thickness of the oxide film between the gate electrode edge and the channel can be shortened compared with an isotropic material. Therefore, even if the length of the upper portion of high dielectric gate insulation film 14 is lengthened enough, since the distance of the conversion of the thickness of the oxide film does not increase, and the electric flux density of the channel section can be improved enough, the capacity of the gate can be further increased.

FIG. 15B indicates the case not to use high dielectric gate insulation film 14, but to achieve the present invention with high dielectric gate insulation film 34. In this case, of course, a similar effect in case of using the high dielectric gate insulation film can be obtained and the memory effect can be given.

To achieve NAND and NOR logic gate by the present invention, it is possible to achieve if the above-mentioned transistor of this embodiment is connected in parallel and in series, and Gate1 and Gate2 can be connected in series through high dielectric gate insulation film 14 as shown in the series-connection of FIG. 15C. A left figure of FIG. 15C shows a section along the direction of the source-drain and a right thereof shows a section along the direction of the channel width. There is merit in which the size of the transistor can be reduced by omitting the diffusion layer between transistors with this structure. It is possible to preform parallel-connection by this principle.

The structure such as FIG. 15D, FIG. 15E, and FIG. 15F can be further achieved by using high dielectric gate insulation film 14. FIG. 15D shows the example that the aspect ratio of gate insulation film 14 becomes large and other wirings 35 (Metal1) are drawn around under gate electrode 15 of the transistor structure of the present invention, when the relative permittivity of gate insulation film 14 is very high. FIG. 15E shows the example of drawing around other wirings 35 (Metal1) under gate electrode 15 by the conventional transistor structure. FIG. 15F shows the case where gate insulation film 14 is drawn around as it is wiring, when the relative permittivity of gate insulation film 14 is very large compared with the surrounding insulation film 16. Drawing is free and free with vertical and horizontal direction.

As described above, though the plurality of embodiments are shown in FIG. 15A to FIG. 15F, these are not only alone all, but also it is easy to use by combining with including FIG. 13 and FIG. 14, and though there is a change in capacity of the gate and parasitic capacity, all effects from FIG. 3A to FIG. 12C can be applied.

FIG. 16G is a figure which shows the capacity component comparison in the transistor structure explained in FIG. 13 and FIG. 14.

In FIG. 16A to FIG. 16F, FIG. 16A shows a conventional art, and FIG. 16B to FIG. 16F show the embodiments. Cgb indicates the capacity between gate-channel, and Cgs and Cgd indicate the capacity between gate-source and the capacity between the gate-drain. When the minimum gate insulation film thickness is made constant, it is a sector of FIG. 16C that the capacity of the gate and a gate electrode cover type with the roundness of FIG. 16F become the maximum, thereby it is understood that the sector of FIG. 16C has the best performance among them, when considering to decrease parasitic capacity.

FIG. 17A to FIG. 17C show the equipotential line charts to explain the effect of the present invention. FIG. 17A, FIG. 17B and FIG. 17C show the equipotential line charts when applying −3V to the gate voltage respectively by the shape of FIG. 16D, FIG. 16E, and FIG. 16F. It is understood that the distance between equipotential lines on the all channel sides shortens, and the electric flux concentration occurs. Especially, it is understood electric flux concentration occurs with high efficiency in FIG. 17B.

(Eighth Embodiment)

FIG. 18A to FIG. 18C are the sectional view which schematically shows the element structure of the MOS transistor according to the eighth embodiment of the present invention with a conventional structure, and a characteristic diagram which shows the relationship of various transistor structures and the channel charge densities.

The examples of FIG. 3A to FIG. 17C are examples that the upper portion channel length is longer than a lower channel length in the direction of the source-drain and the electric flux is concentrated so to speak two dimensional one. In FIG. 18A to FIG. 18C, the direction of the channel width also concentrates the electric flux and the effect of an increase of the capacity of the gate in the present invention is further improved. FIG. 18A shows a conventional art, and FIG. 18B shows the embodiment, when the electric flux is completely concentrated in spheroidal, theoretically, the charge density of the channel section increases only as for the ratio of LT/LB and the drivability increases.

The left side of FIG. 18B shows a section along the direction of the source-drain, and the right side of FIG. 18B shows the section along the direction of the channel width. The direction of the source-drain is assumed to be a structure like (H) of FIG. 14, and an arc of the interface between the channel and high dielectric gate insulation film is further sharpened. Usually, when the source-drain position is deeply brought into Si, since the position of the center of the channel to the distance between the source-drain may come up too much, the control of the channel is lost, an increase in the short channel effect increases, but as shown in the right of FIG. 18B, even if the direction of the channel width is deeply brought in the Si substrate, only the same source and the same drain are approached and there is no disadvantage. According to this example, the electric flux can be concentrated by three dimensions, and the electric flux can be concentrated only along the direction of the channel width only at the right of FIG. 18B.

Though the conventional transistor structure of three dimensions looks like this, since the gate oxide film etc. are used, the channel length and the channel width extend when the gate insulation film thickness is thinly made a three dimension, but the electric flux density is almost the same compared with the gate electrode side and the channel side, and an increase in the charge density like this embodiment is not seen. The three-dimensionalizing FIG. 18A to FIG. 18C can be applied to various embodiments of FIG. 13 to FIG. 15F.

FIG. 18C shows both of the cases when the electric flux is concentrated by two dimensions and the cases when the electric flux is concentrated by three dimensions. It is apparent that there is an effect about three dimensions from this FIG. compared with same LT/LB.

(Ninth Embodiment)

Figure 19A:
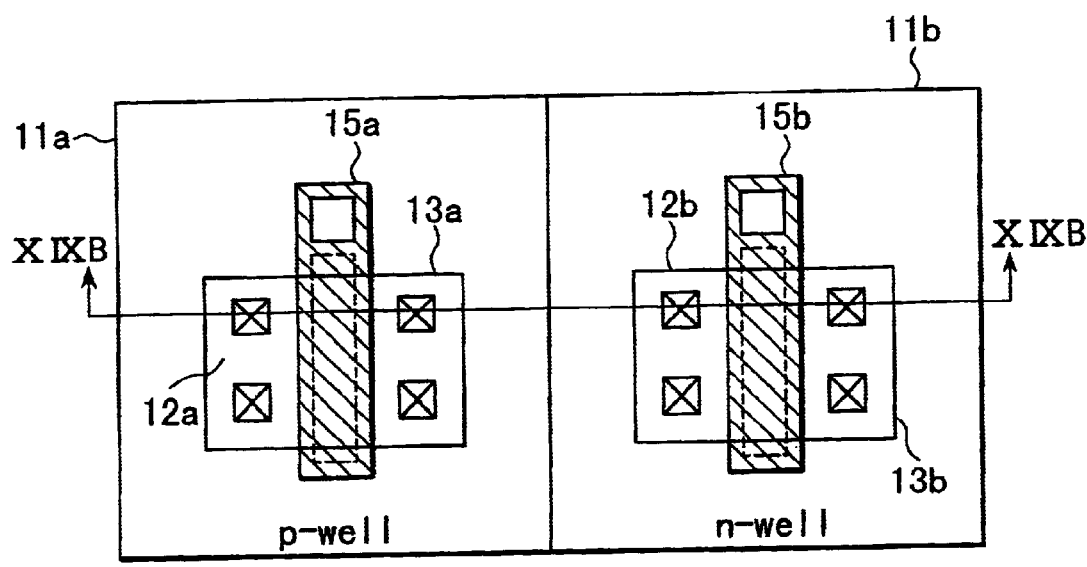
FIG. 19A and FIG. 19B are a plan view and a sectional view which show the element structure of the semiconductor device according to the ninth embodiment.
Figure 19B:
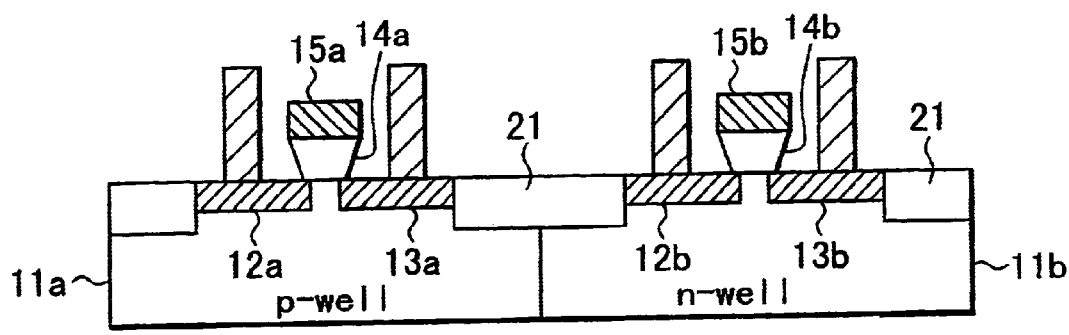

FIG. 19A and FIG. 19B show the plan view and the sectional view which show the element structure of the MOS type semiconductor device, especially CMOS structure, according to the ninth embodiment of the present invention, respectively.

Both the nMOS transistor and the pMOS transistor can apply the principle of the present invention, therefore, when constructing it by CMOS, by forming the high dielectric gate insulation film of both the transistors to a reverse-trapezoid, the effect described previous with each transistor is achieved.

(Tenth Embodiment)

Figure 20:
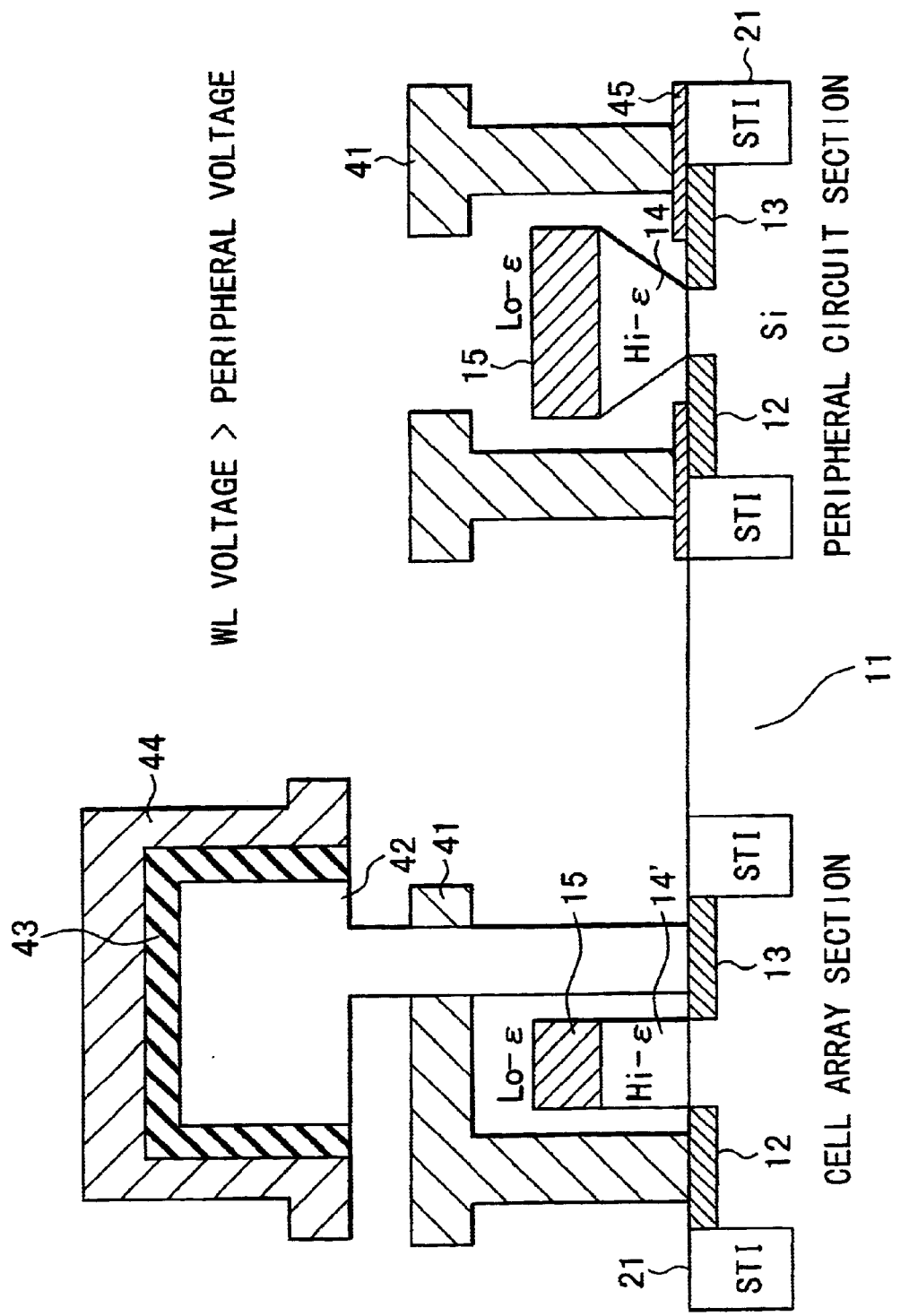
FIG. 20 is a sectional view which shows the element structure of the semiconductor device according to the tenth embodiment.

FIG. 20 is a sectional view which shows the element structure of the semiconductor device according to the tenth embodiment of the present invention. The case where conventional transistors are combined with the present invention transistor is indicated. This example shows the case where a transistor of gate insulation film of conventional high dielectric film is used as a transistor for which the gate voltage with a high DRAM cell array is necessary, and a transistor of the present invention is used as a transistor to which the gate voltage with a low peripheral circuit is applied Usually, it is necessary to apply high word line voltage (Vpp) of Vdd or more (or, internal voltagedown potential Vint or more) to the cell transistor of DRAM, and it is necessary to thicken the gate insulation film thickness of the conversion of the thickness of the oxide film more than usual logic LSI for the reliability securing. Therefore, when the transistor of the peripheral circuit in the same gate insulation film is constructed, since the gate insulation film of the transistor is thick, there is a large disadvantage that the drivability is inferior compared with a logic single process. This is remarkable in DRAM-logic integrated chip, the gate insulation film thickness is limited on the cell transistor side of DRAM, there is a disadvantage with inferior transistor performance of the entire circuit of the logic side with a lot of elements, and when DRAM-MPU is integrated, since the MPU performance is inferior, there is a problem where the entire performance does not rise easily. Moreover, there is a method of separately making the gate of the cell transistor and the gate of the transistor in the surrounding twice, too, but there is a disadvantage of greatly increasing the cost.

To solve this disadvantage in this embodiment, high dielectric insulation film 14' to which an upper and lower area ratio is equal is used in the part of the cell transistor of DRAM to which the part and high density to which a high voltage is applied are requested, and high dielectric insulation film 14 with a different upper and lower area ratio is used in the part of the transistor that the voltage is low (=Vdd or inside voltagedown potential Vint of Vdd or less). Then, an transistor with high performance same as the case to thin the gate insulation film is achieved by concentrating the electric flux of the gate insulation film in a part that the gate insulation film thick and the drivability is deteriorated In FIG. 20, reference numeral 11 is a substrate, reference numeral 12 is a source, reference numeral 13 is a drain, reference numeral 15 is a gate electrode (word line), reference numeral 21 is STI, reference numeral 41 is a bitline, reference numeral 42 is a storage node which becomes a capacitor electrode, reference numeral 43 is capacitor insulation film, reference numeral 44 is a plate electrode, and reference numeral 45 is metal layer stuck on the source-drain.

By the embodiment, the transistor performance of the peripheral circuit of DRAM and the logic section of DRAM-logic integration can be improved to a logic single average process without increasing the cost by making the transistor twice.

The present invention can be applied to the embodiment of this FIG. 20 even in case of the other no regulations of the gate insulation film lower bound to the gate leakage current, and it is shown that there is an effect. In this case, only the channel side electric field and the same of the transistor of the Vpp application can at least raise the channel side electric field of the transistor of Vdd (or, Vint) application. This example is an example that reliability is not constrained by a gate leakage current of the Vdd application transistor. Of course, the advantage of the present invention is improved, the maximum electric field of the channel section of the transistor of the peripheral circuit of FIG. 20 is increased more than the electric field of the cell transistor, and the performance of the logic section can be improved. In this example, a memory cell transistor is used as Vpp application example, the part where a high voltage is applied by other cores or peripheral circuits like the word line voltage generation circuit etc. may use the conventional transistor.

(Eleventh Embodiment)

Figure 21A:
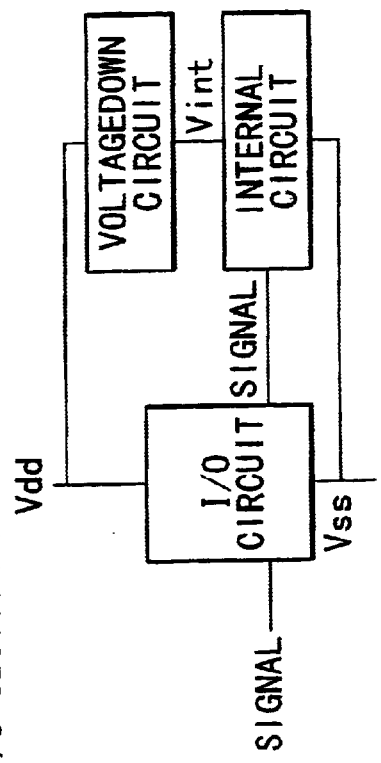
FIG. 21A and FIG. 21B are a block diagram and an element structural sectional view which show the semiconductor device according to the eleventh embodiment.
Figure 21B:
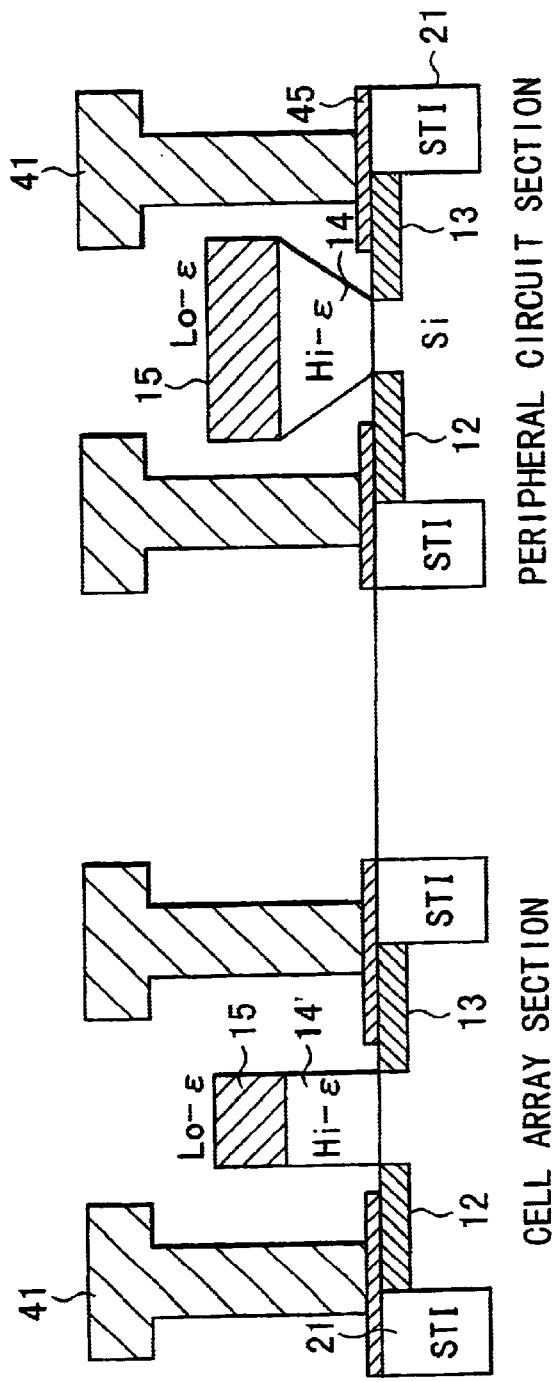

FIG. 21A and FIG. 21B are the block diagram and sectional view which show the semiconductor device according to the eleventh embodiment of the present invention, and show the case where conventional transistors are combined with the present invention transistor.

Besides example of FIG. 20, a conventional type transistor is used in the part such as the I/O circuit of DRAM and inside of LSI chip represented by other MPU to which a high voltage is applied, and the transistor of the present invention in the part to which a high-speed operation is requested by a low voltage may be used. In the example of FIG. 21A and FIG. 21B, a conventional transistor in the I/O section and the voltagedown circuit section to which Vdd is applied, and the transistor of the present invention in an internal circuit to which only voltagedown potential is applied are used. In addition to this example, the transistor of conventional one and more than at least one kind of present invention can be used in the place where plural voltages are used.

(Twelfth Embodiment)

FIG. 22A to FIG. 22H are sectional views which show the manufacturing steps of the MOS transistor according to the twelfth embodiment.

Figure 22A:
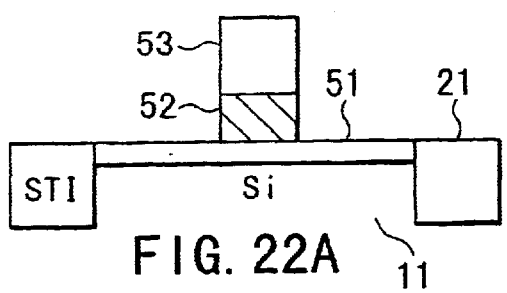
FIG. 22A to FIG. 22H are sectional views which show the manufacturing steps of the MOS transistor according to the twelfth embodiment.

First, as shown in FIG. 22A, STI 21 for the element isolation is formed like surrounding the element formation region in Si substrate 11, and dummy gate 52 which consists of the polysilicon etc. is formed on the element formation region through dummy oxide film 51. This dummy gate 52 is formed by selectively etching resist 53 to the mask.

Figure 22B:
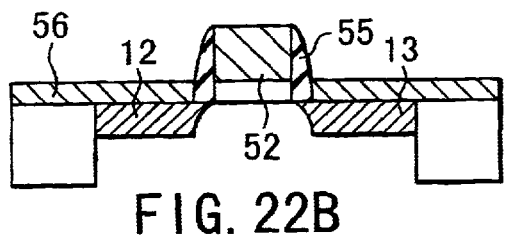

Next, as shown in FIG. 22B, sidewall insulation film 55 which consists of SiN etc. on the side of dummy gate 52 is formed, source-drain 12 and 13 diffusion layers are formed by suing sidewall insulation film 55 with dummy gate 52 as the mask. Subsequently, metal layer 56 which contacts to source-drain 12 and 13 is formed.

Figure 22F:
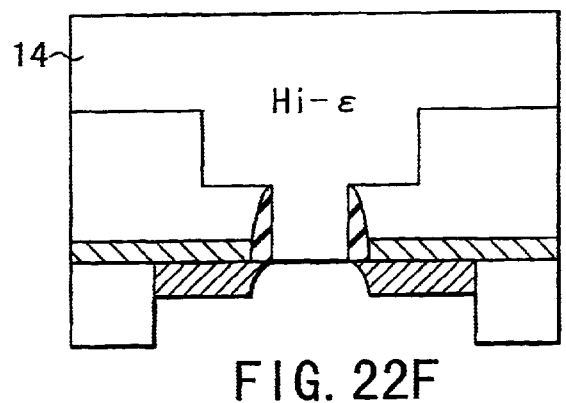
Figure 22C:
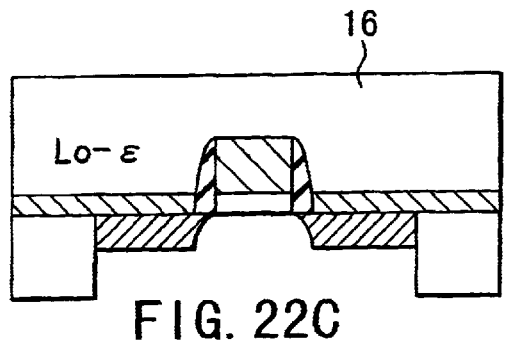
Figure 22G:
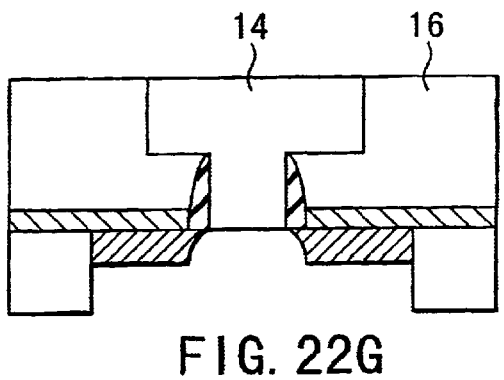
Figure 22D:
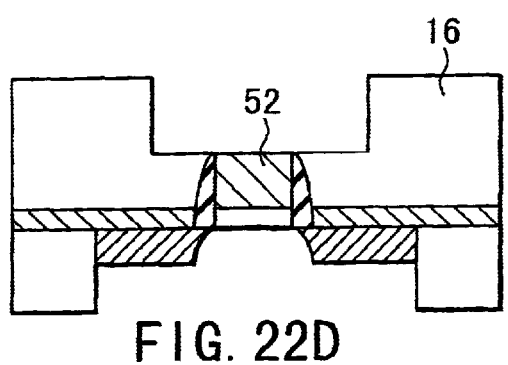
Figure 22E:
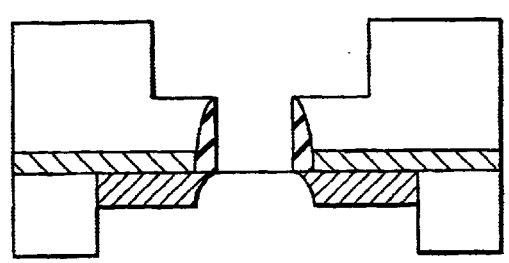

Next, as shown in FIG. 22C, low permittivity insulation film 16 is deposited on the entire surface. Subsequently, as shown in FIG. 22D, the hole of the upper portion channel length is opened to insulation film 16 to depth in which dummy gate 52 is exposed. Thereafter, dummy gate 52 is removed as shown in FIG. 22E.

Next, as shown in FIG. 22F, high permittivity gate insulation film 14 such as $TiO_2$ is deposited on the entire surface by the method such as CVD. Subsequently, gate insulation film 14 is polished until insulation film 16 is exposed by CMP or a chemical etching as shown in FIG. 22G.

Figure 22H:
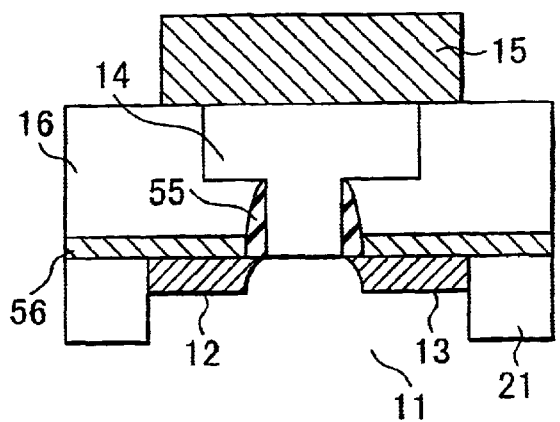

Next, as shown in FIG. 22H, gate electrode 15 which consists of the polysilicon etc. is deposited on gate insulation film 14, and gate electrode 15 is processed to the desired pattern by using the mask (not shown). By these steps, the MOS transistor having a reverse-convex-shaped gate insulation film can be achieved.

(Thirteenth Embodiment)

FIG. 23A to FIG. 23G are sectional views which show the manufacturing steps of the MOS transistor according to the thirteenth embodiment of the present invention.

The steps from FIG. 23A to FIG. 23E are the same as the steps from FIG. 22A to FIG. 22E, STI 21 is formed in Si substrate 11, dummy gate 52 is formed on the element formation region through dummy oxide film 51, and, sidewall insulation film 55, source and drain 12 and 13, and metal layer 56 are formed. Subsequently, low permittivity insulation film 16 is deposited, and after puncturing this insulation film 16 like the upper portion channel length, dummy gate 52 is removed.

Figure 23A:
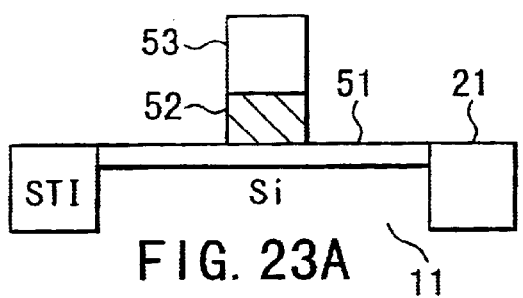
FIG. 23A to FIG. 23G are sectional views which show the manufacturing steps of the MOS transistor according to the thirteenth embodiment.
Figure 23B:
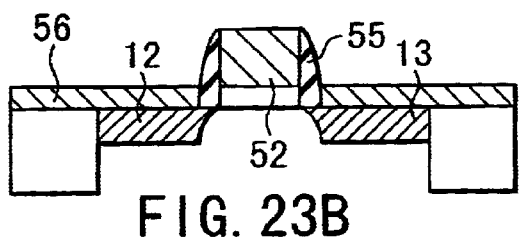
Figure 23F:
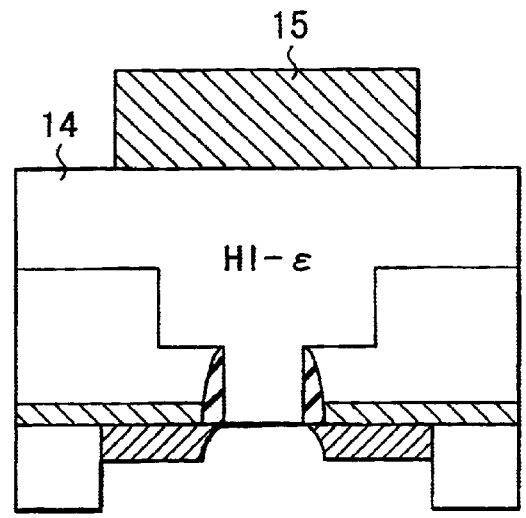
Figure 23C:
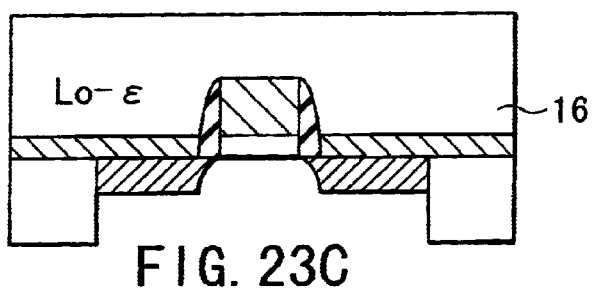
Figure 23D:
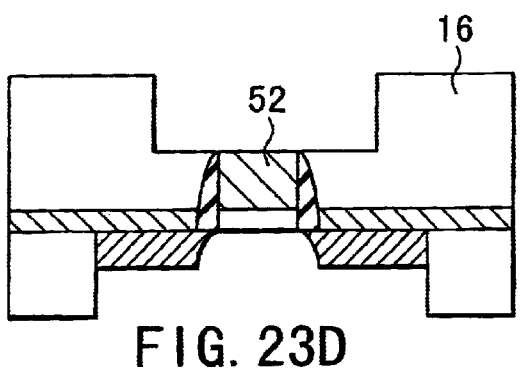

Next, as shown in FIG. 23F, high permittivity gate insulation film 14 such as $TiO_2$ is deposited on the entire surface by the method such as CVD. Subsequently, gate electrode 15 is deposited on gate insulation film 14, and is processed to the desired pattern.

Figure 23G:
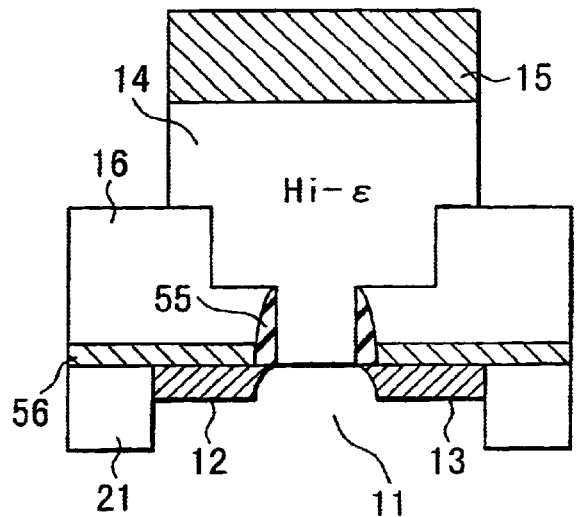
Figure 23E:
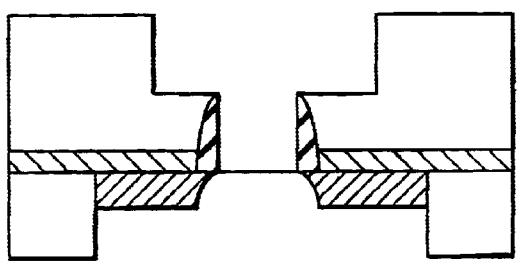

Next, as shown in FIG. 23G, high dielectric gate insulation film 14 is etched by using gate electrode 15 as the mask, or gate electrode 15 and high dielectric gate insulation film 14 are etched at the same time by using the mask. By these steps, the MOS transistor having a reverse-convex-shaped gate insulation film can be achieved.

(Fourteenth Embodiment)

FIG. 24A to FIG. 24H are sectional views which show the manufacturing steps of the MOS transistor according to the fourteenth embodiment of the present invention.

Figure 24A:
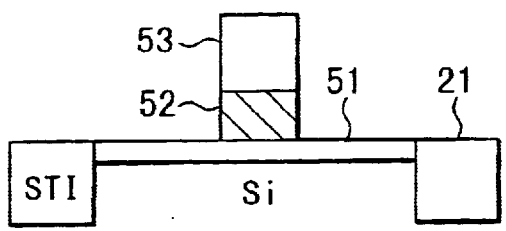
FIG. 24A to FIG. 24H are sectional views which show the manufacturing steps of the MOS transistor according to the fourteenth embodiment.
Figure 24B:
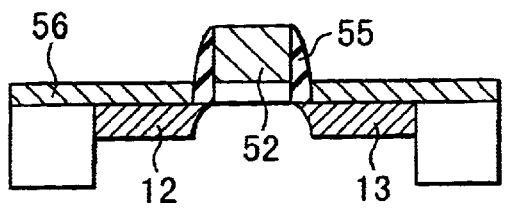
Figure 24F:
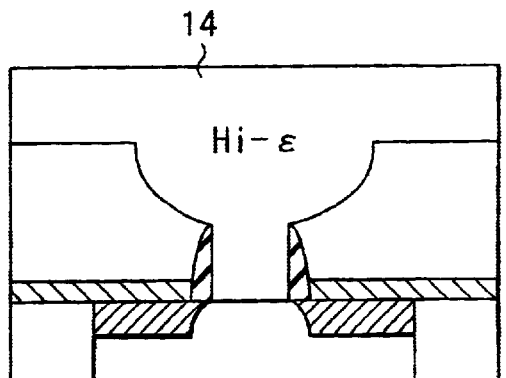
Figure 24C:
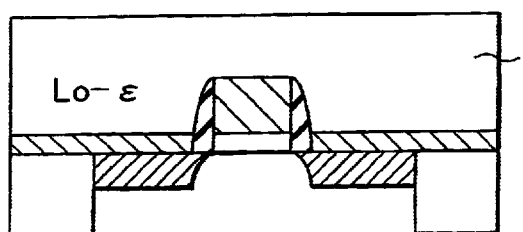

The steps from FIG. 24A to FIG. 24C are the same as the steps from FIG. 22A to FIG. 24C, STI 21 is formed in Si substrate 11, dummy gate 52 is formed on the element formation region through dummy oxide film 51, in addition, sidewall insulation film 55, source and drain 12 and 13, and metal layer 56 are formed, and subsequently low permittivity insulation film 16 is deposited.

Figure 24G:
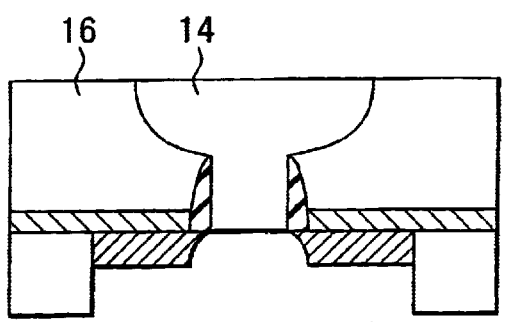
Figure 24D:
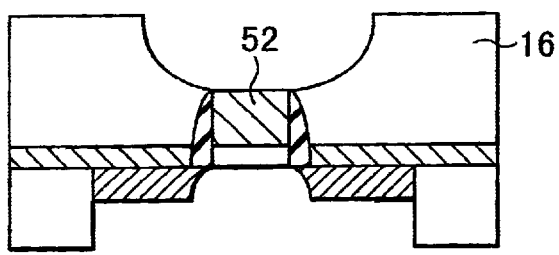
Figure 24E:
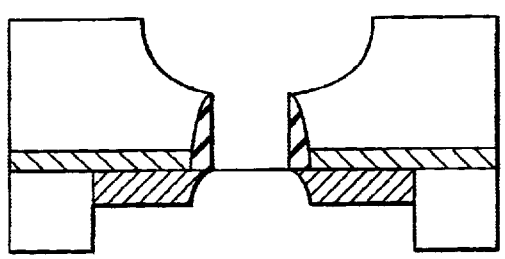

Next, as shown in FIG. 24D, the hole of the upper portion channel length is opened to low permittivity insulation film 16 by an isotropic etching such as CDE (Chemical Dry Etching), and the upper portion channel length section with roundness is formed. Thereafter, dummy gate 52 is removed as shown in FIG. 24E.

Next, as shown in FIG. 24F, high permittivity gate insulation film 14 such as $TiO_2$ is deposited by the method such as CVD. Subsequently, as shown in FIG. 24G, gate insulation film 14 is polished until insulation film 16 is exposed by CMP or a chemical etching.

Figure 24H:
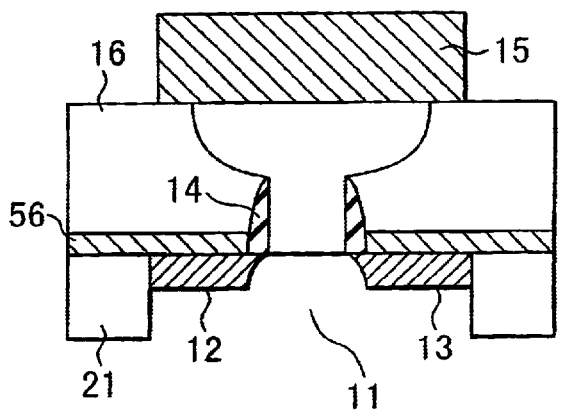

Next, as shown in FIG. 24H, gate electrode 15 is deposited, and gate electrode 15 is processed to the desired pattern by using the mask (not shown). By these steps, the MOS transistor having the gate insulation film of the watering pot type can be achieved.

(Fifteenth Embodiment)

FIG. 25A to FIG. 25G are sectional views which show the manufacturing steps of the MOS transistor according to the fifteenth embodiment of the present invention.

The steps from FIG. 25A to FIG. 25E are the same as the steps from FIG. 24A to FIG. 24E, STI 21 is formed in Si substrate 11, dummy gate 52 is formed on the element formation region through dummy oxide film 51, and, in addition, sidewall insulation film 55, source and drain 12 and 13, and metal layer 56 are formed. Subsequently, low permittivity insulation film 16 is deposited, and after puncturing this insulation film 16 like the upper portion channel length, dummy gate 52 is removed.

Figure 25A:
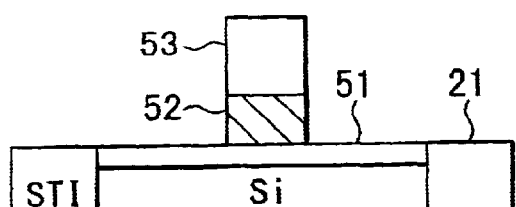
FIG. 25A to FIG. 25G are sectional views which show the manufacturing steps of the MOS transistor according to the fifteenth embodiment.
Figure 25B:
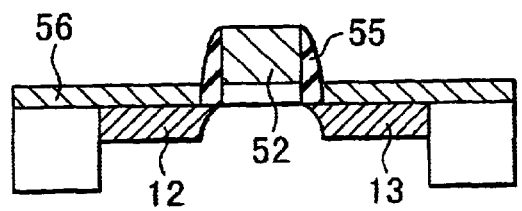
Figure 25F:
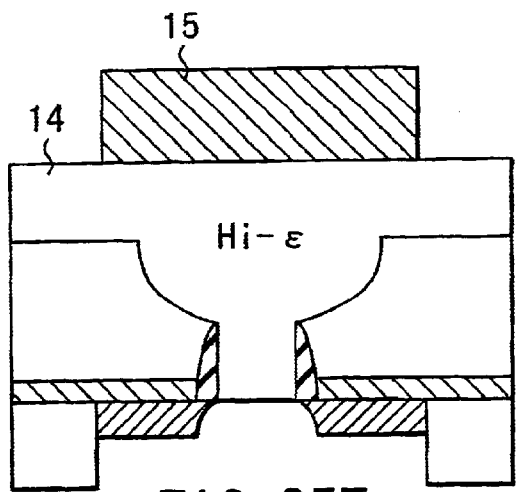
Figure 25C:
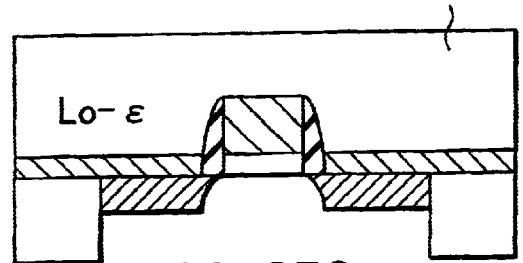
Figure 25D:
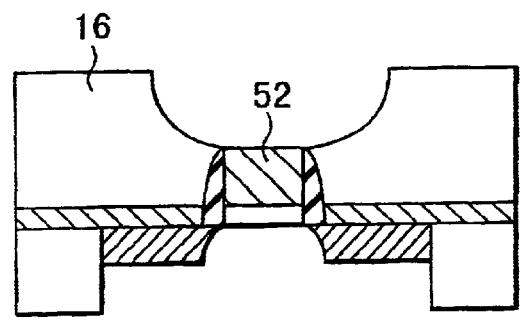

Next, as shown in FIG. 25F, high permittivity gate insulation film 14 such as $TiO_2$ is deposited on the entire surface by the method such as CVD. Subsequently, gate electrode 15 is deposited on gate insulation film 14, and is processed to the desired pattern.

Figure 25G:
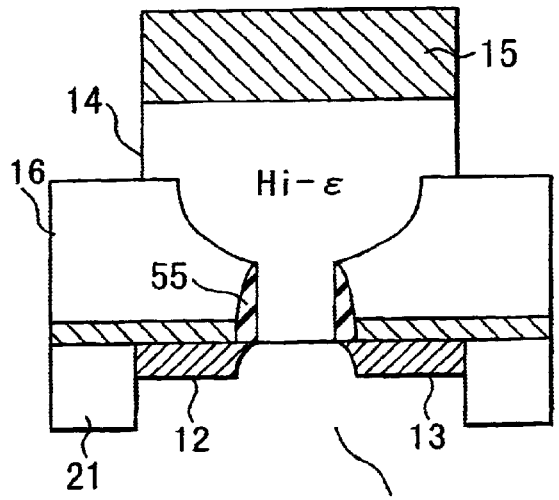
Figure 25E:
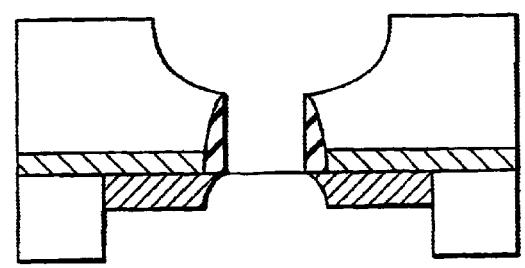

Next, as shown in FIG. 25G, high dielectric gate insulation film 14 is etched by using gate electrode 15 as the mask, or gate electrode 15 and high dielectric gate insulation film 14 are etched at the same time by using the mask. By these steps, the MOS transistor having the gate insulation film of the watering pot type can be achieved.

(Sixteenth Embodiment)

FIG. 26A to FIG. 26L are sectional views which show the manufacturing steps of the MOS transistor according to the sixteenth embodiment of the present invention.

The steps from FIG. 26A to FIG. 26C are the same as the steps from FIG. 22A to FIG. 22C, STI 21 is formed in Si substrate 11, dummy gate 52 is formed on the element formation region through dummy oxide film 51, in addition, sidewall insulation film 55, source and drain 12 and 13, and metal layer 56 are formed, and, subsequently, low permittivity insulation film 16 is deposited.

Next, as shown in FIG. 26D, low permittivity insulation film 16 is etched-back until the upper portion of dummy gate 52 and sidewall insulation film 55 is exposed. Subsequently, as shown in FIG. 26E, stopper insulation film 57 which consists of the same material such as SiN as gate sidewall insulation film 55 is deposited. Thereafter, as shown in FIG. 26F, stopper insulation film 57 is etched-back by CMP etc. until dummy gate 52 is exposed.

Next, as shown in FIG. 26G, dummy gate 52 is removed. Subsequently, as shown in FIG. 26H, low permittivity insulation film 66 is deposited on the entire surface.

Thereafter, as shown in FIG. 26I, a hole of the upper portion channel length is opened to low permittivity insulation film 66.

Next, as shown in FIG. 26J, high permittivity gate insulation film 14 such as $TiO_2$ is deposited on the entire surface by the method such as CVD. Subsequently, as shown in FIG. 26K, gate insulation film 14 is polished until the upper portion channel length is exposed by CMP or a chemical etching, etc. Thereafter, as shown in FIG. 26L, gate electrode 15 is deposited, and gate electrode 15 is processed to the desired pattern by using the mask. By these steps, the MOS transistor having a reverse-convex-shaped gate insulation film can be achieved.

(Seventeenth Embodiment)

FIG. 27A to FIG. 27K are sectional views which show the manufacturing steps of the MOS transistor according to the seventeenth embodiment of the present invention.

The steps from FIG. 27A to FIG. 27I are the same as the steps from FIG. 26A to FIG. 26I, STI 21 is formed in Si substrate 11, dummy gate 52 is formed on the element formation region through dummy oxide film 51, in addition, sidewall insulation film 55, source and drain 12 and 13, and metal layer 56 are formed, and, subsequently, low permittivity insulation film 16 is deposited. Then, low permittivity insulation film 16 is etched-back, stopper insulation film 57 is formed, etch-back and dummy gate 52 is removed, low permittivity insulation film 16 is deposited, and the hole of the upper portion channel length is opened.

Figure 27A:
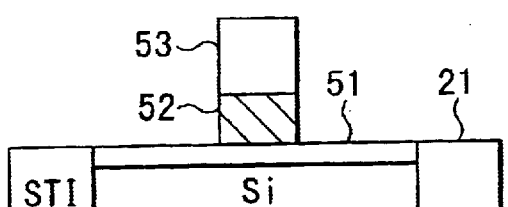
FIG. 27A to FIG. 27K are sectional views which show the manufacturing steps of the MOS transistor according to the seventeenth embodiment.
Figure 27B:
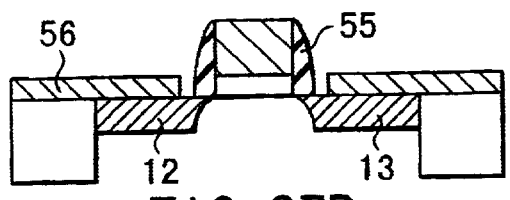
Figure 27C:
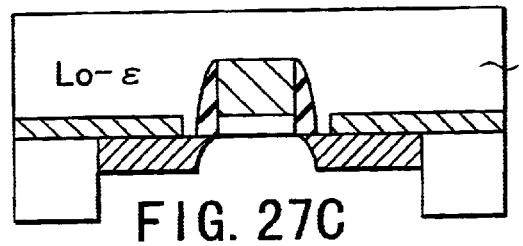
Figure 27D:
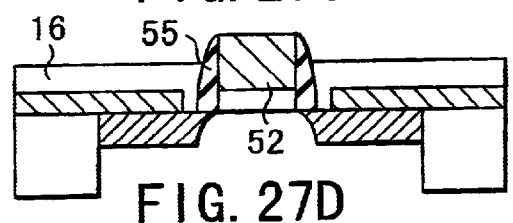
Figure 27E:
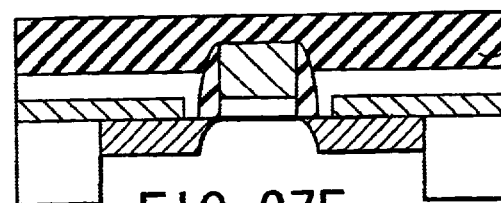
Figure 27F:
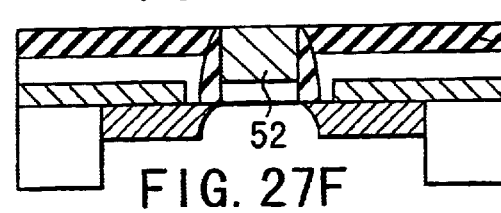
Figure 27G:
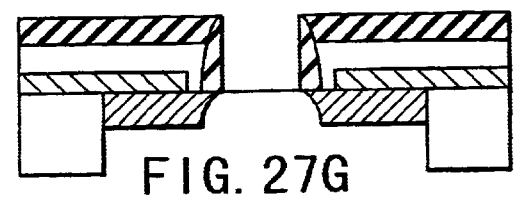
Figure 27H:
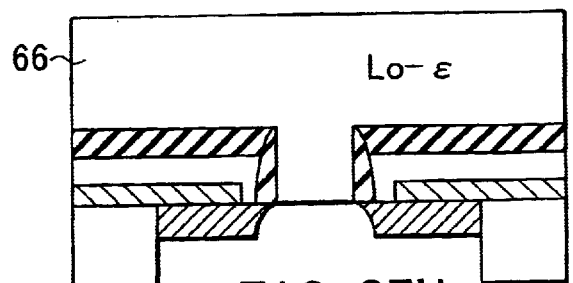
Figure 27I:
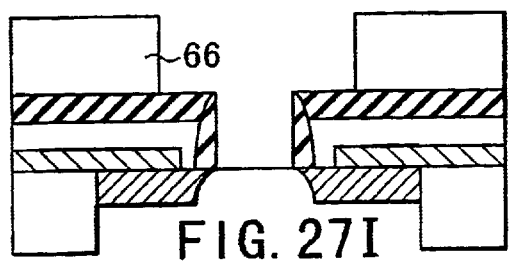
Figure 27J:
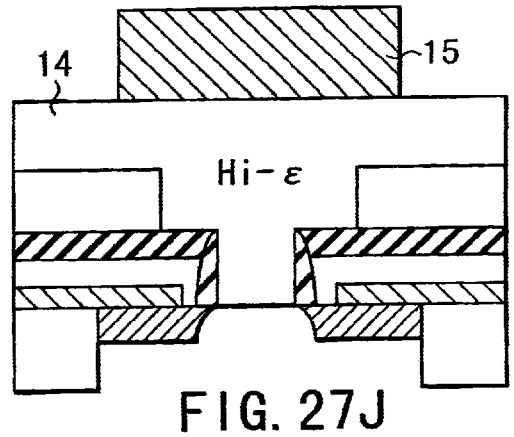
Figure 27K:
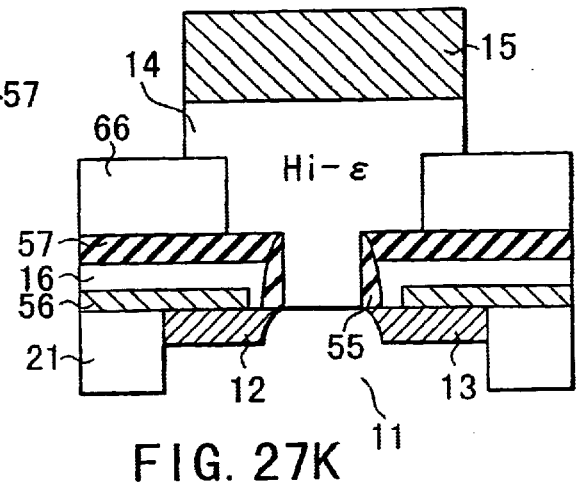

Next, as shown in FIG. 27J, high permittivity gate insulation film 14 such as $TiO_2$ is deposited on the entire surface by the method such as CVD, and gate electrode 15 is deposited thereon. Subsequently, as shown in FIG. 27K, gate electrode 15 is processed to the desired pattern by using the mask. Thereafter, high dielectric gate insulation film 14 is etched by using gate electrode 15 as the mask, or gate electrode 15 and high dielectric gate insulation film 14 are etched at the same time by using the mask. By these steps, the MOS transistor having a reverse-convex-shaped gate insulation film can be achieved.

(Eighteenth Embodiment)

FIG. 28A to FIG. 28J are sectional views which show the manufacturing steps of the MOS transistor according to the eighteenth embodiment of the present invention.

Figure 28A:
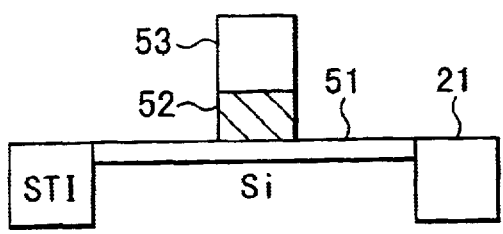
FIG. 28A to FIG. 28J are sectional views which show the manufacturing steps of the MOS transistor according to the eighteenth embodiment.
Figure 28G:
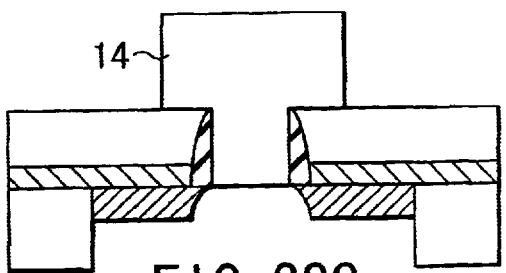
Figure 28B:
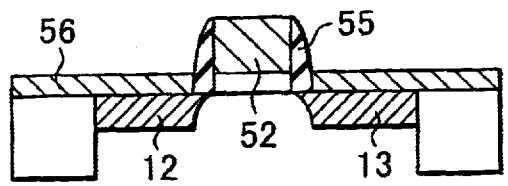
Figure 28H:
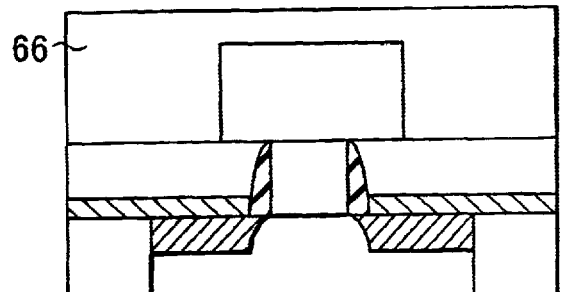
Figure 28C:
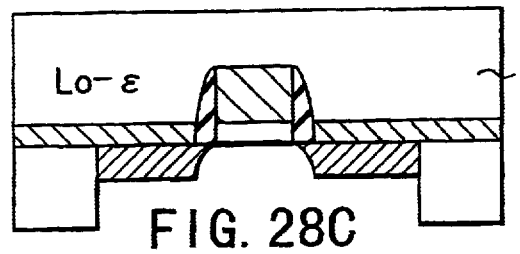

The steps from FIG. 28A to FIG. 28C is similar to The steps from FIG. 22A to FIG. 22C, STI 21 is formed in Si substrate 11, dummy gate 52 is formed on the element formation region through dummy oxide film 51, in addition, sidewall insulation film 55, source and drain 12 and 13, and metal layer 56 are formed, and subsequently, low permittivity insulation film 16 is deposited.

Figure 28I:
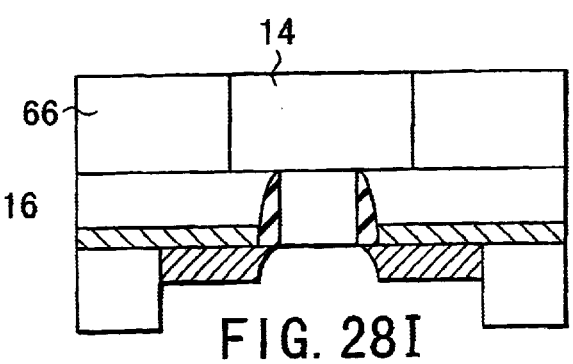
Figure 28D:
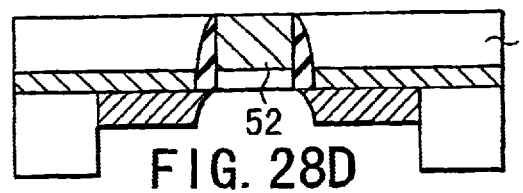
Figure 28E:
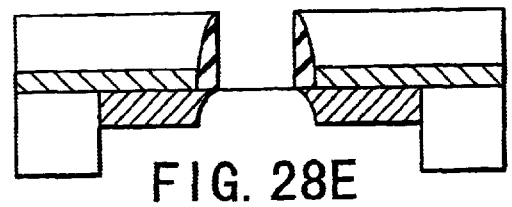

Next, as shown in FIG. 28D, low permittivity insulation film 16 is etched-back until dummy gate 52 is exposed, and subsequently, as shown in FIG. 28E, dummy gate 52 is removed.

Figure 28J:
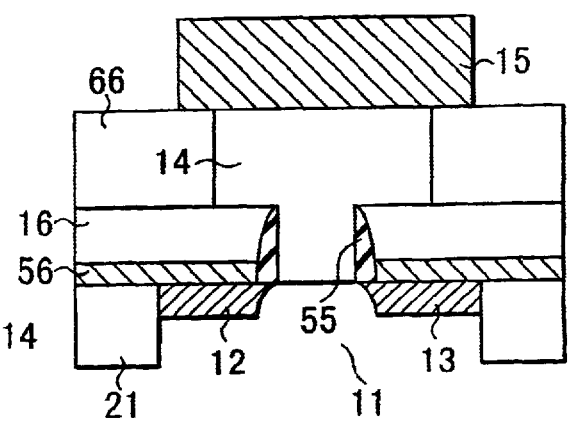
Figure 28F:
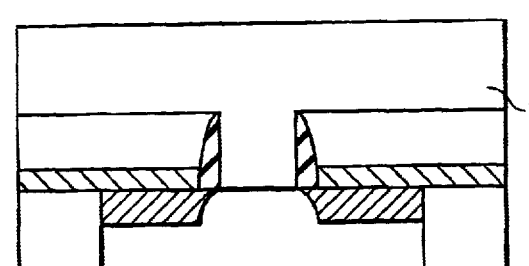

Next, as shown in FIG. 28F, high permittivity gate insulation film 14 such as $TiO_2$ is deposited on the entire surface by the method such as CVD. Subsequently, high permittivity gate insulation film 14 is processed as shown in FIG. 28G.

Next, as shown in FIG. 28H, low permittivity insulation film 16 is deposited on the entire surface. Subsequently, as shown in FIG. 28I, insulation film 16 is etched-back until gate insulation film 14 is exposed. Thereafter, as shown in FIG. 28J, gate electrode 15 is deposited, and gate electrode 15 is processed to the desired pattern by using the mask. By these steps, the MOS transistor having a reverse-convex-shaped gate insulation film can be achieved.

(Nineteenth Embodiment)

FIG. 29A to FIG. 29H are sectional views which show the manufacturing steps of the MOS transistor according to the nineteenth embodiment of the present invention.

The steps from FIG. 29A to FIG. 29F are the same as the steps from FIG. 28A to FIG. 28F, STI 21 is formed in Si substrate 11, dummy gate 52 is formed on the element formation region through dummy oxide film 51, in addition, sidewall insulation film 55, source and drain 12 and 13, and metal layer 56 are formed, and, subsequently, Low permittivity insulation film 16 is deposited. Then, low permittivity insulation film 16 is etched-back, and after removing exposed dummy gate 52, high permittivity gate insulation film 14 is deposited.

Figure 29A:
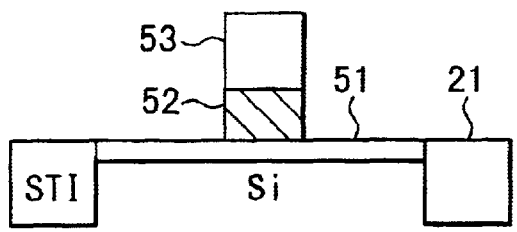
FIG. 29A to FIG. 29H are sectional views which show the manufacturing steps of the MOS transistor according to the nineteenth embodiment.
Figure 29B:
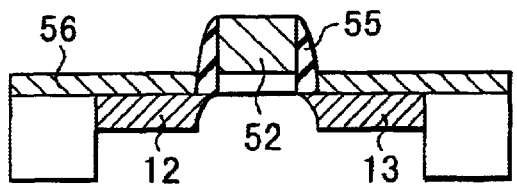
Figure 29G:
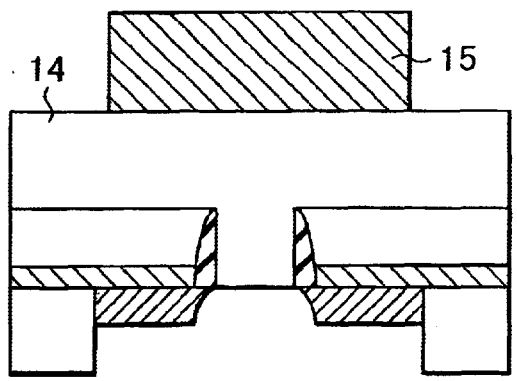
Figure 29C:
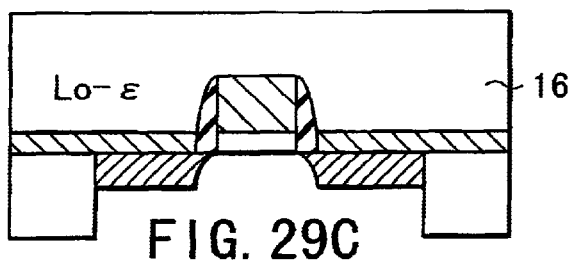
Figure 29D:
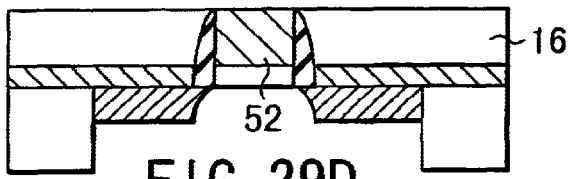
Figure 29E:
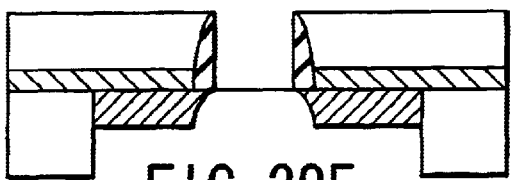
Figure 29H:
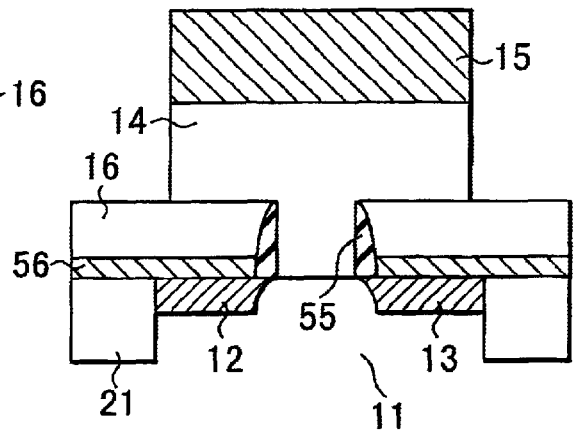
Figure 29F:
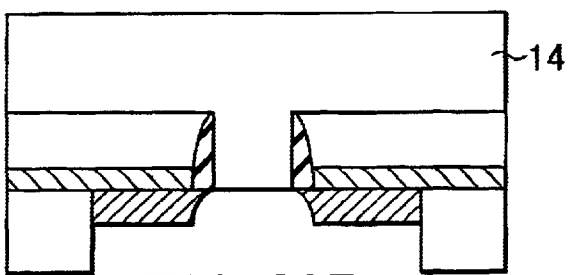

Next, as shown in FIG. 29G, gate electrode 15 is deposited on gate insulation film 14, and gate electrode 15 is processed to the desired pattern by using the mask. Subsequently, as shown in FIG. 29H, high dielectric gate insulation film 14 is etched by using gate electrode 15 as the mask. By these steps, the MOS transistor having the reverse-convex-shaped gate insulation film can be achieved.

(Twentieth Embodiment)

FIG. 30A to FIG. 30J are sectional views which show the manufacturing steps of the MOS transistor according to the twentieth embodiment of the present invention.

The steps from FIG. 30A to FIG. 30E are the same as the steps from FIG. 28A to FIG. 28E, STI 21 is formed in Si substrate 11, dummy gate 52 is formed on the element formation region through dummy oxide film 51, in addition, sidewall insulation film 55, source and drain 12 and 13, and metal layer 56 are formed, and subsequently, low permittivity insulation film 16 is deposited. Then, low permittivity insulation film 16 is etched-back, and exposed dummy gate 52 is removed.

Figure 30A:
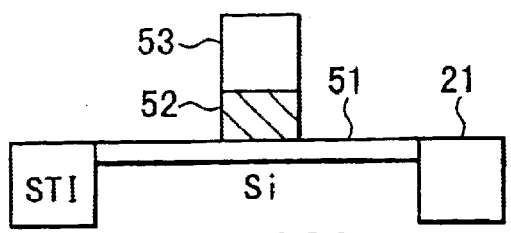
FIG. 30A to FIG. 30J are sectional views which show the manufacturing steps of the MOS transistor according to the twentieth embodiment.
Figure 30G:
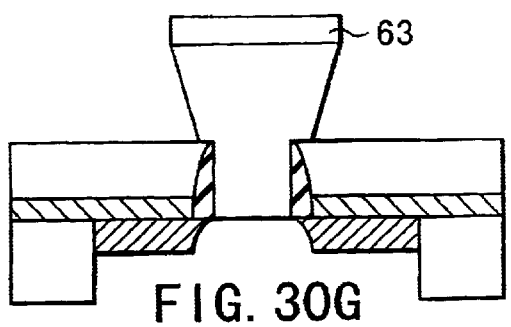
Figure 30B:
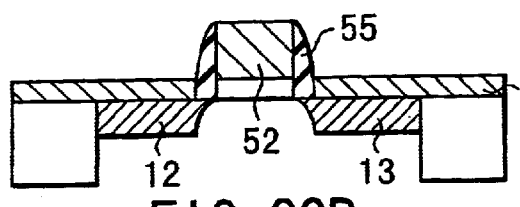
Figure 30H:
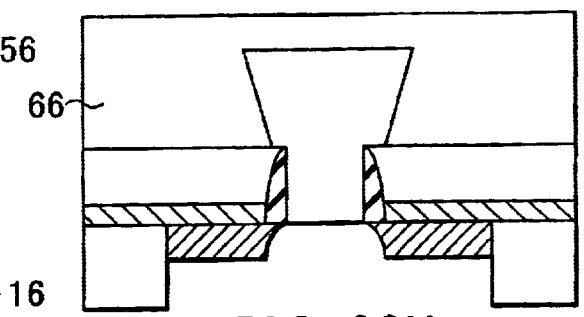
Figure 30C:
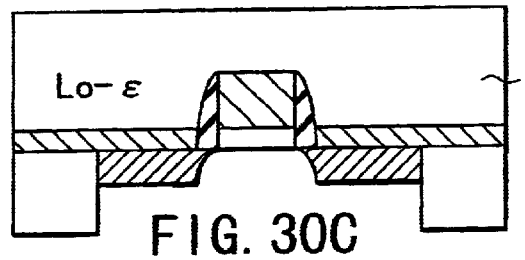
Figure 30D:
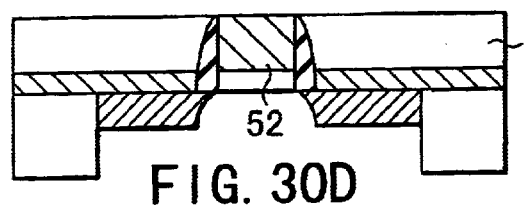
Figure 30I:
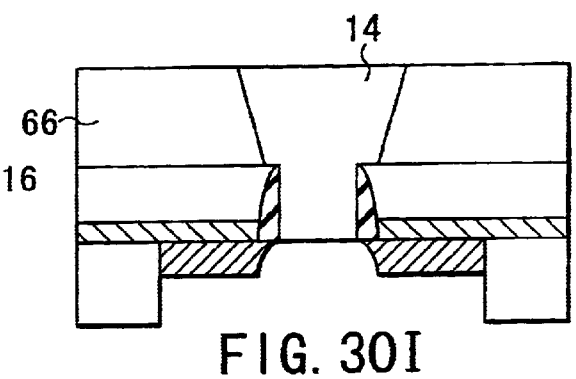
Figure 30E:
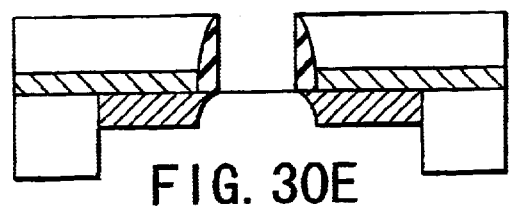
Figure 30F:
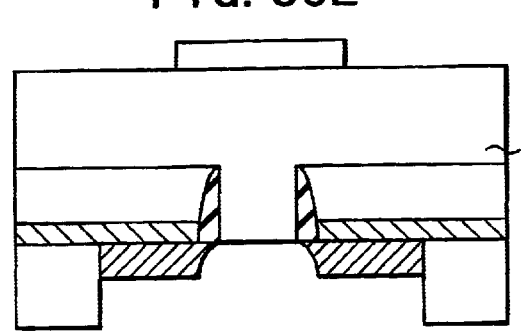

Next, as shown in FIG. 30F, high permittivity gate insulation film 14 such as $TiO_2$ is deposited on the entire surface by the method such as CVD. Subsequently, as shown in FIG. 30G, stopper film or resist 63 is formed at the center of the channel. Thereafter, high permittivity gate insulation film 14 is reversely taper-etched by using stopper film or resist 63 as the mask.

Figure 30J:
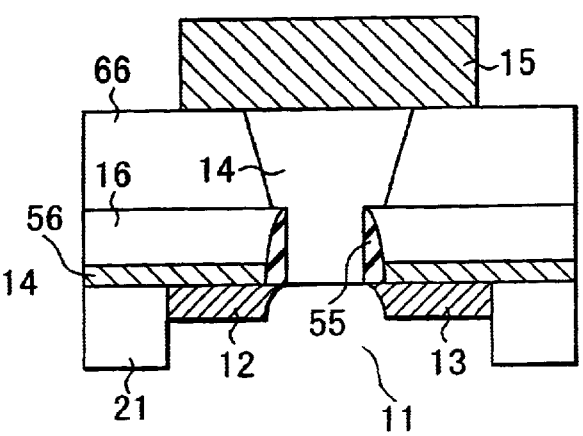

Next, as show in FIG. 30H, the low permittivity insulation film is deposited again. Subsequently, as shown in FIG. 30I, the low permittivity insulation film is etched-back until high permittivity gate insulation film 14 is exposed. Thereafter, as shown in FIG. 30J, gate electrode 15 is deposited, and gate electrode 15 is processed to the desired pattern by using the mask. By these steps, the MOS transistor having the gate insulation film of the watering pot type can be achieved.

(Twenty-first Embodiment)

FIG. 31A to FIG. 31H are sectional views which show the manufacturing steps of the MOS transistor according to the twenty-first embodiment of the present invention.

The steps from FIG. 31A to FIG. 31E are the same as the steps from FIG. 28A to FIG. 28E, STI 21 is formed in Si substrate 11, dummy gate 52 is formed on the element formation region through dummy oxide film 51, in addition, sidewall insulation film 55, source and drain 12 and 13, and metal layer 56 are formed, and subsequently, low permittivity insulation film 16 is deposited. Then, low permittivity insulation film 16 is etched-back, and exposed dummy gate 52 is removed.

Figure 31A:
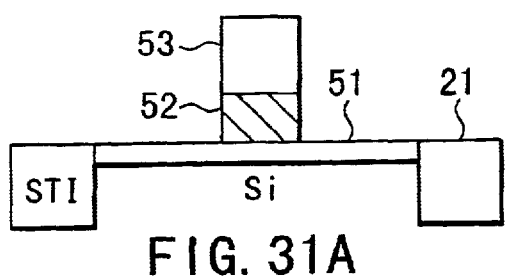
FIG. 31A to FIG. 31H are sectional views which show the manufacturing steps of the MOS transistor according to the twenty-first embodiment.
Figure 31B:
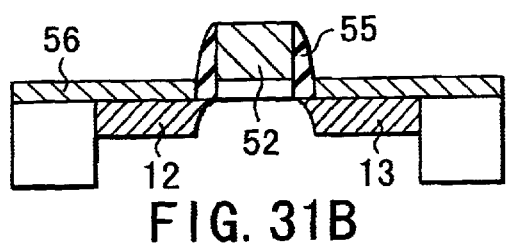
Figure 31G:
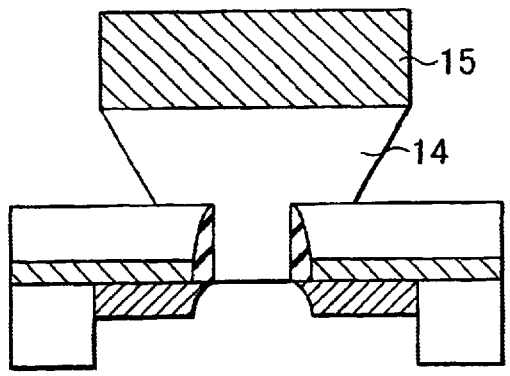
Figure 31C:
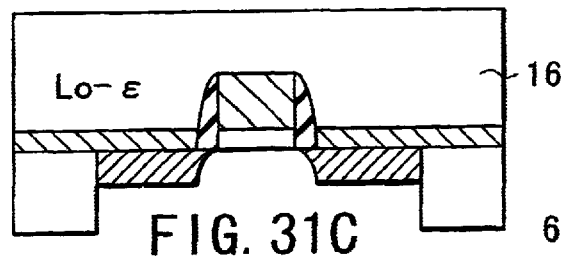
Figure 31D:
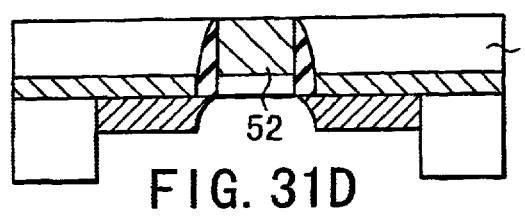
Figure 31E:
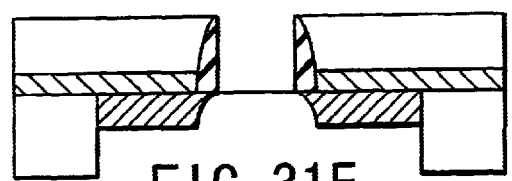
Figure 31H:
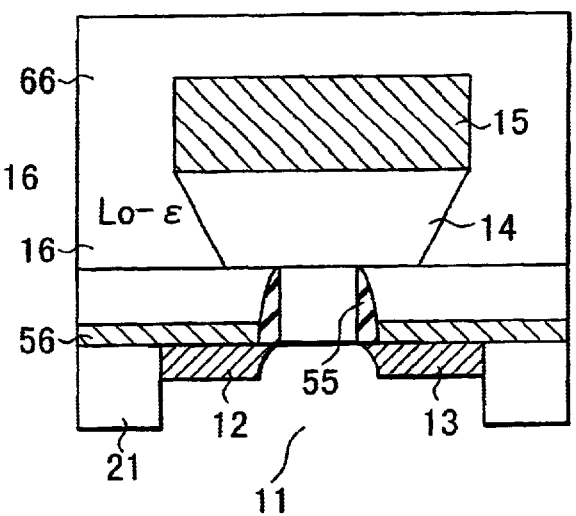
Figure 31F:
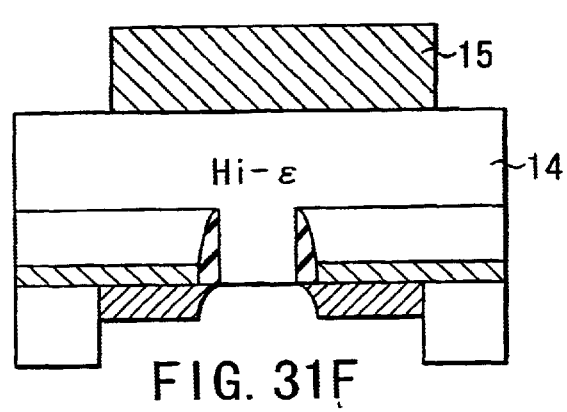

Next, as shown in FIG. 31F, high permittivity gate insulation film 14 such as $TiO_2$ is deposited on the entire surface by the method such as CVD. Subsequently, gate electrode 15 is formed at the center of the channel, and is processed to the desired pattern.

Next, as shown in FIG. 31G, high permittivity gate insulation film 14 is reversely taper-etched by using gate electrode 15 as the mask. Subsequently, as shown in FIG. 31H, low permittivity insulation film 66 is deposited again. By these steps, the MOS transistor having the gate insulation film of the watering pot type can be achieved. Moreover, when the thickness of a lower channel length is reduced in the above-mentioned watering pot type, it is possible to become a trapezoid transistor unlimitedly.

(Twenty-second Embodiment)

FIG. 32A to FIG. 32H are sectional views which show the manufacturing steps of the MOS transistor according to the twenty-second embodiment of the present invention.

Figure 32A:
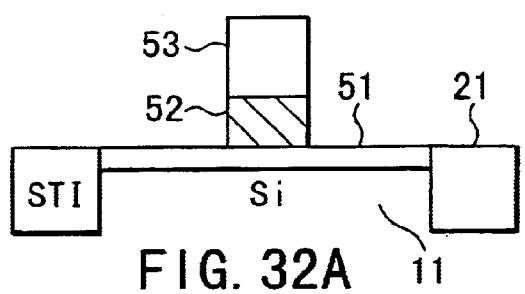
FIG. 32A to FIG. 32H are sectional views which show the manufacturing steps of the MOS transistor according to the twenty-second embodiment.
Figure 32F:
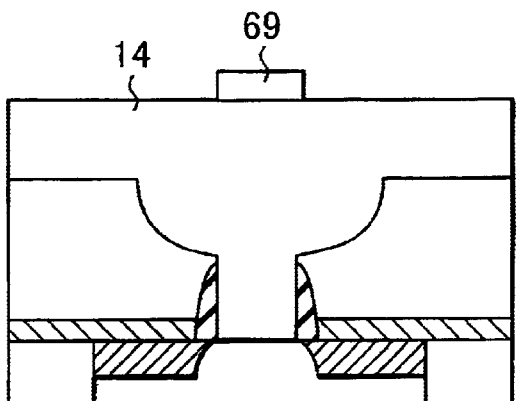
Figure 32B:
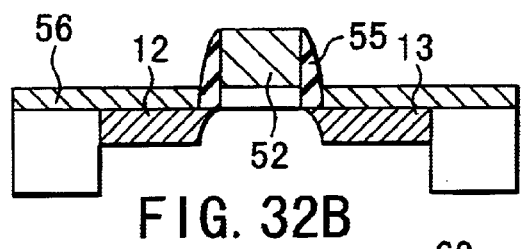

The steps from FIG. 32A to FIG. 32B are the same as the steps from FIG. 22A to FIG. 22B, STI 21 is formed in Si substrate 11, dummy gate 52 is formed on the element formation region through dummy oxide film 51, and in addition, sidewall insulation film 55, source and drain 12 and 13, and metal layer 56 are formed.

Figure 32C:
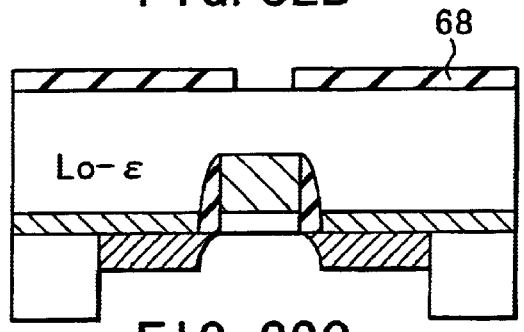
Figure 32G:
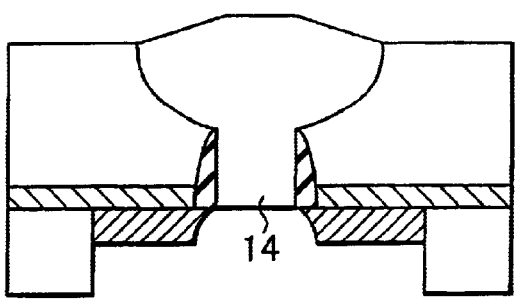
Figure 32D:
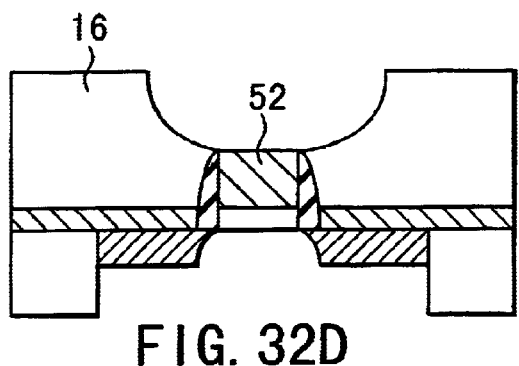
Figure 32H:
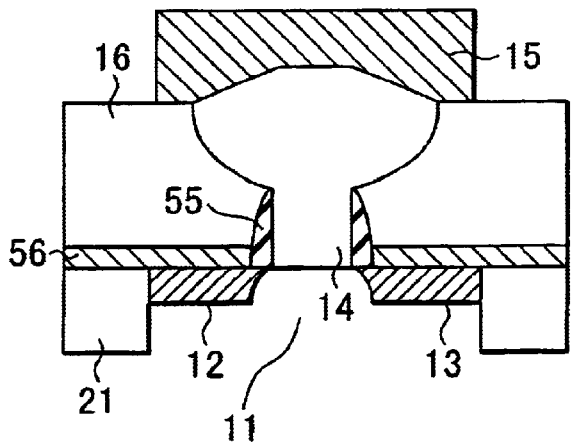
Figure 32E:
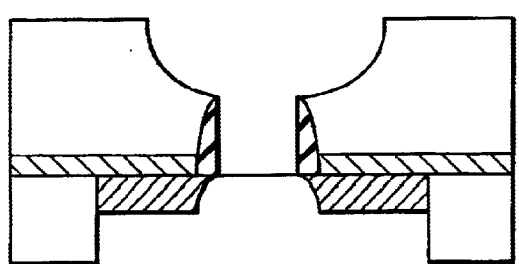

Next, as shown in FIG. 32C, low permittivity insulation film 16 is deposited on the entire surface, and mask 68 having the trench on the channel is formed thereon. Subsequently, as shown in FIG. 32D, low permittivity insulation film 16 is isotropically etched until dummy gate 52 is exposed by using mask 68. Thereafter, as shown in FIG. 32E, dummy gate 52 is removed.

Next, as shown in FIG. 32F, high permittivity gate insulation film 14 such as $TiO_2$ is deposited on the entire surface by the method such as CVD, in addition, is left on the channel by using the mask, and pattern 69 is formed. Subsequently, as shown in FIG. 32G, by etching insulation film 14 by using left pattern 69 as the mask, a sectorial arc is formed. Thereafter, as shown in FIG. 32H, gate electrode 15 is formed, and is processed to the desired pattern. By these steps, the MOS transistor having can achieve a sectorial gate insulation film.

(Twenty-third Embodiment)

FIG. 33A to FIG. 33G are sectional views which show the manufacturing steps of the MOS transistor according to the twenty-third embodiment of the present invention.

The steps from FIG. 33A to FIG. 33E are the same as the steps from FIG. 22A to FIG. 22E, STI 21 is formed in Si substrate 11, dummy gate 52 is formed on the element formation region through dummy oxide film 51, and in addition, sidewall insulation film 55, source and drain 12 and 13, and metal layer 56 are formed. Subsequently, low permittivity insulation film 16 is deposited, and after opening a hole of the upper portion channel length in this insulation film 16, dummy gate 52 is removed. Low permittivity insulation film 16 in this embodiment is formed thicker than the twelfth embodiment.

Figure 33A:
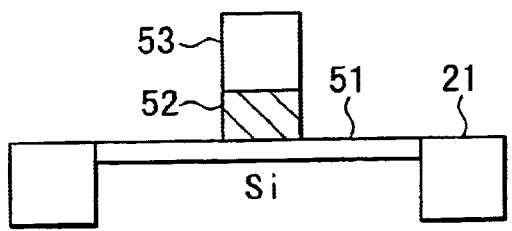
FIG. 33A to FIG. 33G are sectional views which show the manufacturing steps of the MOS transistor according to the twenty-third embodiment.
Figure 33B:
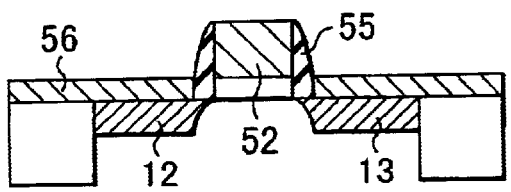
Figure 33F:
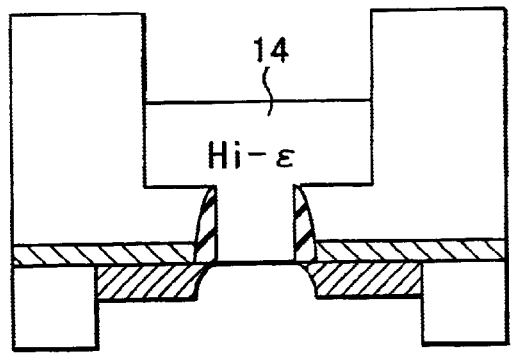
Figure 33C:
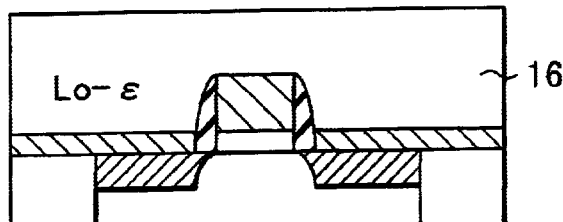
Figure 33D:
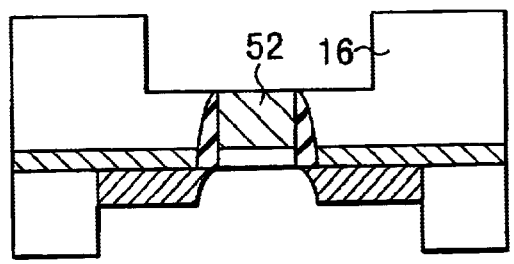
Figure 33G:
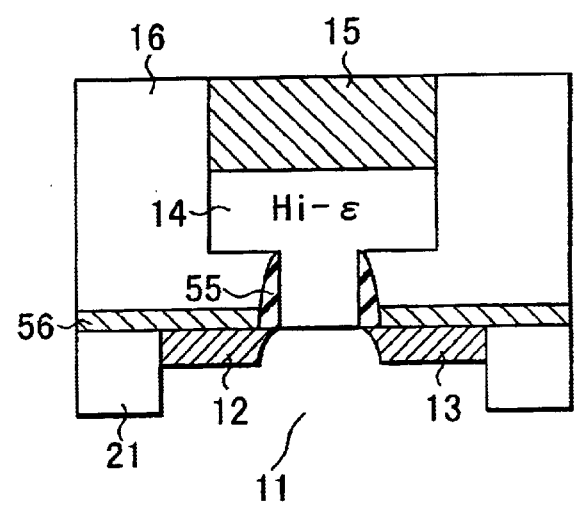
Figure 33E:
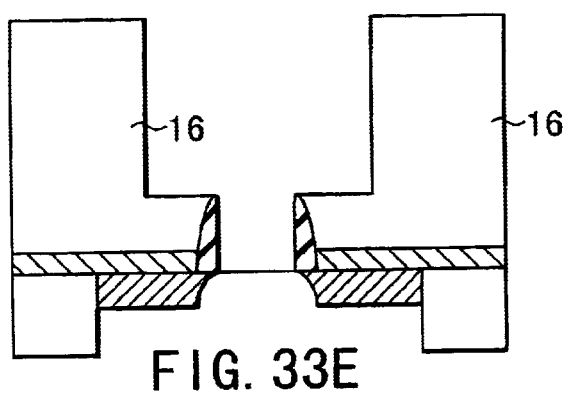

Next, as shown in FIG. 33F, high permittivity gate insulation film 14 is deposited on the hole on the channel by the method such as CVD. Subsequently, as shown in FIG. 33G, the gate electrode material is deposited on the hole, and the surface is polished by CMP etc. By these steps, the MOS transistor having a reverse-convex-shaped gate insulation film can be achieved.

(Twenty-fourth Embodiment)

FIG. 34A to FIG. 34F are sectional views which show the manufacturing steps of the MOS transistor according to the twenty-fourth embodiment of the present invention.

Figure 34A:
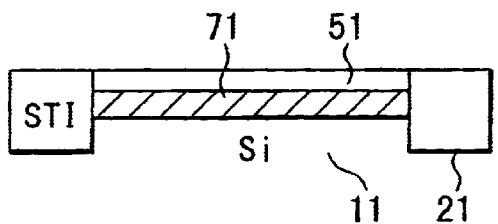
FIG. 34A to FIG. 34F are sectional views which show the manufacturing steps of the MOS transistor according to the twenty-fourth embodiment.

First, as shown in FIG. 34A, STI 21 for the element isolation is formed to surround the element formation region in Si substrate 11, and diffusion layer 71 of the source-drain including the channel section is formed in the element formation region. Then, dummy oxide film 51 is formed on the element formation region.

Figure 34B:
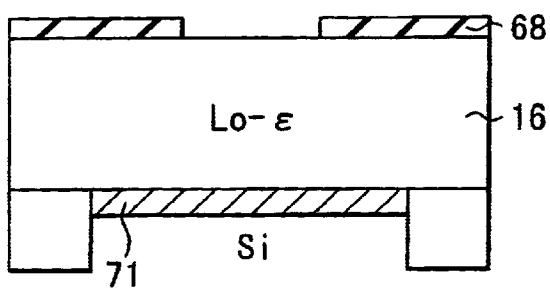
Figure 34E:
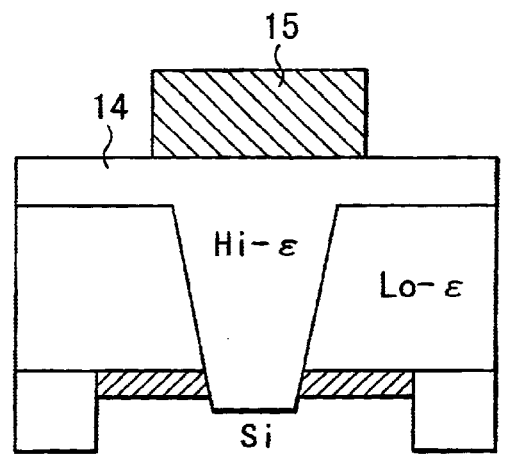
Figure 34C:
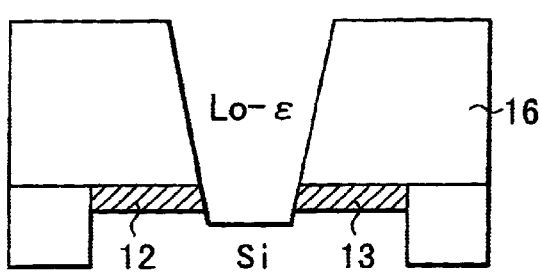

Next, as shown in FIG. 34B, low permittivity insulation film 16 is deposited on the entire surface, and thereafter, mask 68 is formed on the channel. Subsequently, as shown in FIG. 34C, low permittivity insulation film 16 is etched with taper by using mask 68, and in addition, the Si section with diffusion layer 71 formed to the channel is etched. Source 12 and drain 13 are formed by removing diffusion layer 71 of the channel section.

Figure 34F:
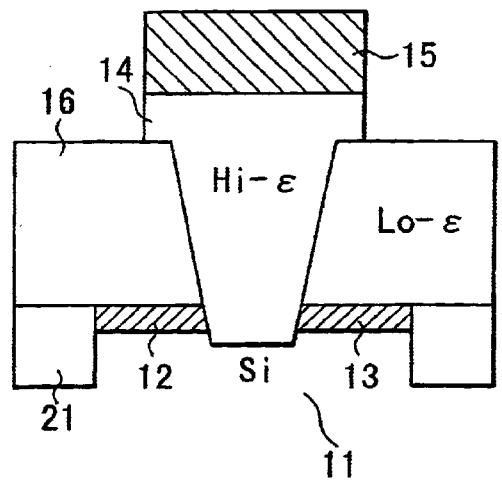
Figure 34D:
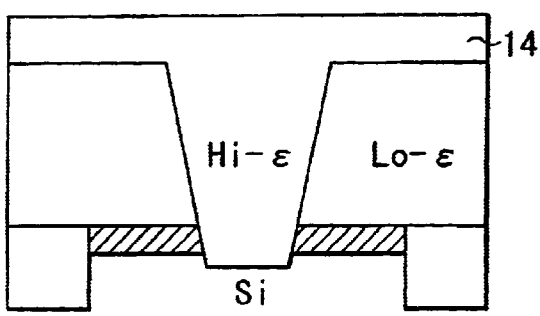

Next, as shown in FIG. 34D, high permittivity gate insulation film 14 is deposited by the methods such as CVD and sputtering. Subsequently, as shown in FIG. 34E, the gate electrode material is formed, and the electrode is processed with the mask. Thereafter, as shown in FIG. 34F, gate insulation film 14 of a high dielectric material is processed by using gate electrode 15 or the resist on gate electrode 15 as the mask. By these steps, the MOS transistor having a trapezoid gate insulation film can be achieved.

(Twenty-fifth Embodiment)

FIG. 35A to FIG. 35I are sectional views which show the manufacturing steps of the MOS transistor according to the twenty-fifth embodiment of the present invention.

Figure 35A:
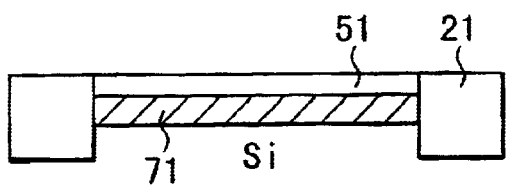
FIG. 35A to FIG. 35I are sectional views which show the manufacturing steps of the MOS transistor according to the twenty-fifth embodiment.
Figure 35B:
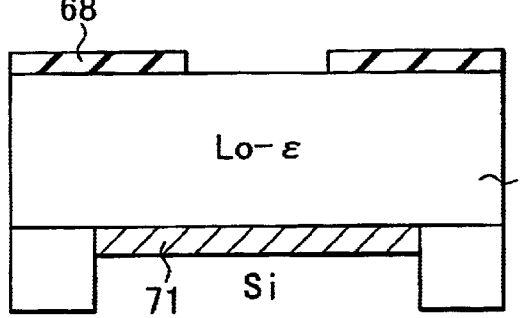
Figure 35C:
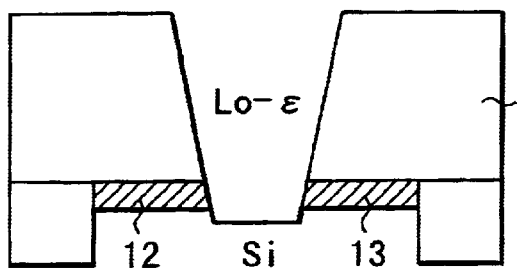

The steps from FIG. 35A to FIG. 35C are the same as the steps from FIG. 34A to FIG. 34C, the diffusion layers of the source and drain including the channel section are formed in the element formation region surrounded by STI 21 of Si substrate 11, and dummy oxide film 51 is formed on the element formation region. Then, low permittivity insulation film 16 is deposited and is etched with taper, and in addition, the Si section is etched.

Figure 35D:
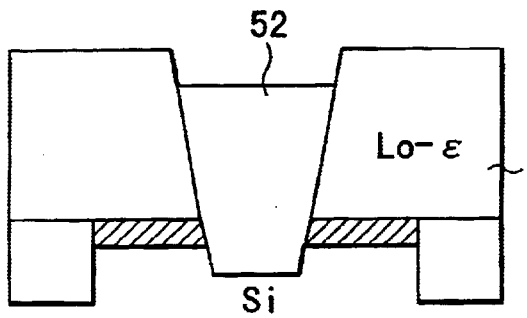
Figure 35E:
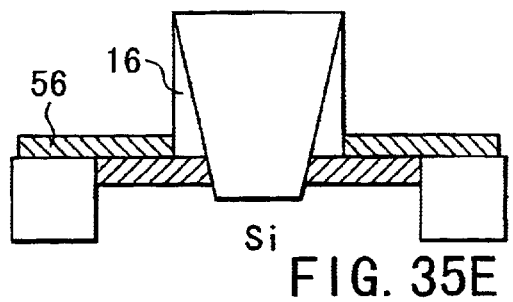
Figure 35F:
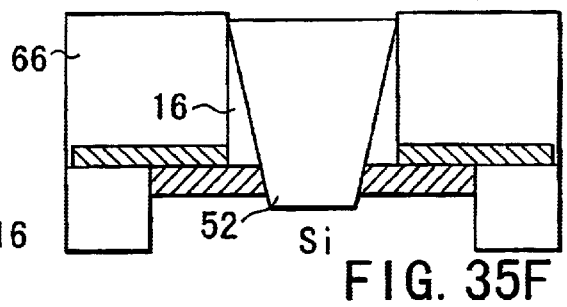

Next, as shown in FIG. 35D, dummy gate 52 is formed to bury the tapered trench of low permittivity insulation film 16. The etch-back is performed, if necessary. Next, as shown in FIG. 35E, low permittivity insulation film 16 is etched. At this time, sidewall of low permittivity insulation film 16 is left, and in addition, metal film 56 is put on the source-drain. Thereafter, as shown in FIG. 35F, low permittivity insulation film 66 is deposited again.

Figure 35G:
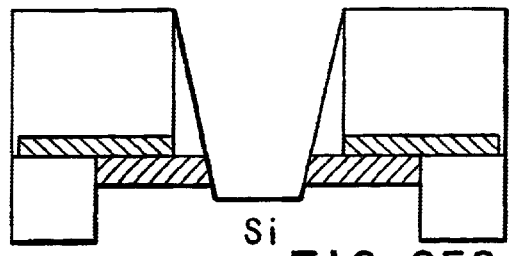
Figure 35H:
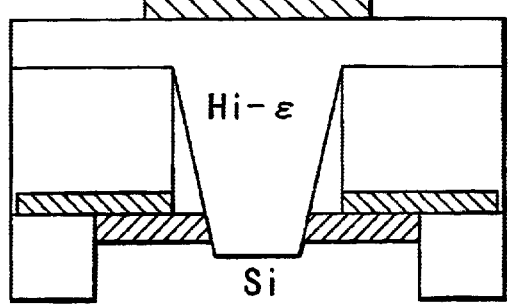
Figure 35I:
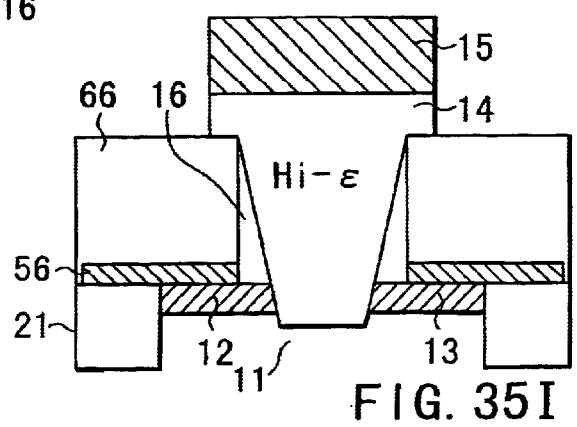

Next, dummy gate 52 is removed as shown in FIG. 35G. Subsequently, subsequently, as shown in FIG. 35H, high permittivity gate insulation film 14 is buried and formed, gate electrode 15 is formed, and the electrode is processed by using the mask (not shown). Thereafter, as shown in FIG. 35I, gate insulation film 14 of a high dielectric is processed by using gate electrode 15 or the resist on gate electrode 15 as a mask. The MOS transistor of a trapezoid gate insulation film can be achieved by these steps.

The present invention can be executed by a variety of transforming it within the range in which it does not beyond the scope of the invention, and is not limited to each embodiment mentioned above.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A semiconductor device comprising:
    a channel of a first conductivity type formed on a surface layer of a semiconductor substrate;
    a source and a drain of a second conductivity type formed on both sides of the channel;
    a gate insulation film with a first relative permittivity formed at least on said channel directly or through a buffer insulation film;
    a gate electrode formed on said gate insulation film; and
    a side insulation film formed at least on a side of said gate insulation film and having a second relative permittivity which is smaller than the first relative permittivity, wherein
        when a first length, which is a length of the gate insulation film adjacent to said surface layer on the gate electrode side along a channel length direction, is L1, a second length, which is a length of the gate insulation film adjacent to said surface layer on said channel side along the channel length direction, is L2, and a third length, which is a length of a bottom part of said gate electrode parallel to the channel length direction, is L3,
        the length L1 is longer than the length L2, and the length L3 is longer than the length L1.

2. The semiconductor device according to claim 1, wherein the first permittivity is 20 or more.

3. The semiconductor device according to claim 1, wherein the length L2 is 1.5 times or more as large as the length L1.

4. The semiconductor device according to claim 1, wherein, a width of said gate insulation film on the channel side is smaller than a width of said gate insulating film on the gate electrode side in a length along a channel width direction of said gate insulation film.

5. The semiconductor device according to claim 1, wherein a sectional shape along a direction of the source-drain of said gate insulation film is one of tapered shape, a trapezoid, a sector, and a stair.

6. The semiconductor device according to claim 1, wherein a sectional shape of said gate insulation film along a direction from the gate electrode to said channel is one of a tapered shape, a trapezoid, a sector, and a stair.

7. The semiconductor device according to claim 1, wherein said first gate insulation film is a high dielectric film or a ferroelectric film including a composition or an element of one of $Ta_2O_5$, $Sr_2Ta_2O_7$, $TiO_2$, $SrTiO_3$, $BaTiO_3$, $CaTiO_3$, $Ba_xSr_{1-x}TiO_3$, $PbTiO_3$, $PbZr_xTi_{1-x}O_3$, $SrBi_2Ta_2O_9$, $SrBi_2(Ta_xNb_{1-x})_2O_9$, or $Bi_2(Ta_xNb_{1-x})O_6$.

8. The semiconductor device according to claim 1, wherein said buffer insulation film includes one of $SiO_2$, $Si_3N_4$, NO, $TiO_2$, $SrTiO_3$, MgO or $CeO_2$.

9. A semiconductor device comprising:
    a channel of a first conductivity type formed on a surface layer of a semiconductor substrate;
    a source and a drain of a second conductivity type formed on both sides of the channel;
    a gate insulation film with a first relative permittivity formed at least on said channel directly or through a buffer insulation film;
    a gate electrode formed on said gate insulation film; and
    a side insulation film formed at least on a side of said gate insulation film and having a second relative permittivity which is smaller than the first relative permittivity, wherein
        an electric flux density in said gate insulation film on a side towards the channel side is more dense than an electric flux density in said gate insulation film on a side towards the gate electrode,
        an area of a bottom part of said gate electrode is larger than an area of an upper part of said gate insulation film, and
        a length of a bottom part of said gate electrode parallel to a channel length direction is longer than a length of an upper part of said gate insulation film along a channel length direction.

10. A semiconductor device comprising:

a plurality of first MOS transistors, each of said first MOS transistors including a first channel of a first conductivity type formed on a surface layer of a semiconductor substrate, a first source and a first drain of a second conductivity type formed to both sides of said first channel, a first gate insulation film with a first relative permittivity formed at least on the first channel directly or through a buffer insulation film, a first gate electrode formed on said first gate insulation film, and a first side insulation film formed at least on a side of said first gate insulation film and having a second relative permittivity which is smaller than the first relative permittivity; and a plurality of second MOS transistors, each of said second MOS transistors including a second channel of the first conductivity type formed on a surface layer of said substrate, a second source and a second drain of the second conductivity type formed on both sides of said second channel, a second gate insulation film with the first relative permittivity formed at least on said second channel directly or through a buffer insulation film, a second gate electrode formed on said second gate insulation film, and a second side insulation film formed at least on a side of said second gate insulation film and having said second relative permittivity, wherein when a cross-section on a side of said first channel is S1, a cross-section on a side of said first gate electrode is S2, a cross-section on a side of said second channel is S3, and a cross-section on a side of said second gate insulation film is S4, a condition of:

$$S2/S1 > S4/S3$$

is satisfied, an area of a bottom part of said gate electrode parallel to the channel length direction is larger than an area of an upper part of said gate insulation film, and a length of a bottom part of said gate electrode along a channel length direction is longer than a length of an upper part of said gate insulation film along a channel length direction.

11. The semiconductor device according to claim 10, wherein the first permittivity is 20 or more.

12. The semiconductor device according to claim 10, wherein a voltage applied to the first gate electrode is lower than a voltage applied to the second gate electrode.

* * * * *